(12) United States Patent
Kim et al.

(10) Patent No.: US 10,128,241 B2
(45) Date of Patent: Nov. 13, 2018

(54) INTEGRATED CIRCUIT DEVICES

(71) Applicant: Samsung Electronics Co., Ltd., Suwon-si, Gyeonggi-do (KR)

(72) Inventors: Sung-soo Kim, Seoul (KR); Koung-min Ryu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/878,990

(22) Filed: Jan. 24, 2018

(65) Prior Publication Data
US 2018/0166443 A1 Jun. 14, 2018

Related U.S. Application Data

(63) Continuation of application No. 15/455,986, filed on Mar. 10, 2017.

(30) Foreign Application Priority Data

Apr. 22, 2016 (KR) .......................... 10-2016-0049408

(51) Int. Cl.
H01L 21/82 (2006.01)
H01L 27/088 (2006.01)
H01L 21/8234 (2006.01)
H01L 23/528 (2006.01)
H01L 23/532 (2006.01)
H01L 29/66 (2006.01)
H01L 29/78 (2006.01)

(52) U.S. Cl.
CPC .. H01L 27/0886 (2013.01); H01L 21/823431 (2013.01); H01L 21/823437 (2013.01); H01L 21/823456 (2013.01); H01L 21/823475 (2013.01); H01L 23/528 (2013.01); H01L 23/53209 (2013.01); H01L 29/66545 (2013.01); H01L 29/7851 (2013.01)

(58) Field of Classification Search
CPC ......... H01L 21/823456; H01L 29/7855; H01L 27/0886
See application file for complete search history.

(56) References Cited

U.S. PATENT DOCUMENTS

| 8,293,610 | B2 | 10/2012 | Beyer et al. |
| 8,492,228 | B1 | 7/2013 | Leobandung et al. |
| 9,059,242 | B2 | 6/2015 | Cheng et al. |
| 9,202,698 | B2 | 12/2015 | Jagannathan et al. |
| 9,209,273 | B1 | 12/2015 | Lin et al. |
| 9,576,859 | B2 | 2/2017 | Tung |
| 2008/0277739 | A1 | 11/2008 | Curatola |
| 2011/0215413 | A1 | 9/2011 | Ikeno |
| 2014/0103404 | A1 | 4/2014 | Li et al. |
| 2015/0263004 | A1 | 9/2015 | Cheon et al. |

(Continued)

*Primary Examiner* — Mark Prenty
(74) *Attorney, Agent, or Firm* — Myers Bigel, P.A.

(57) ABSTRACT

An integrated circuit device includes a fin-type active area extending on a substrate in a first direction, a first gate line and a second gate line extending on the fin-type active area in parallel to each other in a second direction, which is different from the first direction, a first insulating capping layer covering an upper surface of the first gate line and extending in parallel to the first gate line, a second insulating capping layer covering an upper surface of the second gate line and extending in parallel to the second gate line, wherein a height of the first gate line and a height of the second gate line are different from each other.

18 Claims, 40 Drawing Sheets

(56) References Cited

U.S. PATENT DOCUMENTS

2015/0333082 A1  11/2015  Chuang et al.
2016/0013265 A1   1/2016  Yilmaz et al.
2017/0207312 A1*  7/2017  Jan .................. H01L 21/823456

* cited by examiner

B - B'

B - B'

B - B'

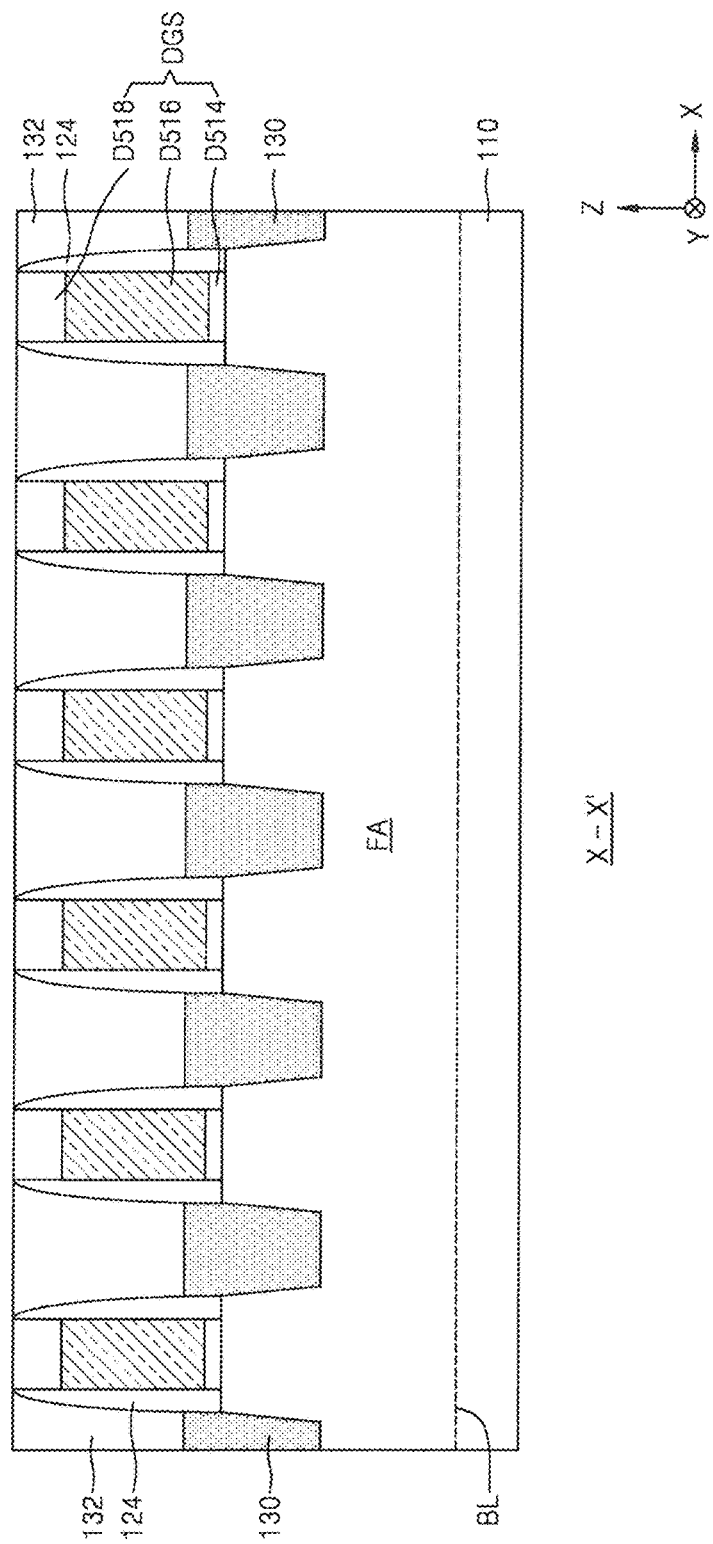

US 10,128,241 B2

INTEGRATED CIRCUIT DEVICES

CROSS-REFERENCE TO RELATED APPLICATION

This application is a continuation of U.S. patent application Ser. No. 15/455,986, filed Mar. 10, 2017, which itself claims priority under 35 U.S.C. § 119 to Korean Patent Application No. 10-2016-0049408, filed on Apr. 22, 2016, in the Korean Intellectual Property Office, the entire contents of which are incorporated by reference herein.

BACKGROUND

The inventive concepts relate to integrated circuit devices, and more particularly, to integrated circuit devices including a field effect transistor.

With the development of electronic technologies, integrated circuit devices have been rapidly downscaled. Semiconductor devices can benefit from both a high operating speed and an operational accuracy, and thus, research into optimizing the structure of transistors included in the semiconductor devices has been conducted.

As the size of transistors, decreases, a reduced gate length of the transistors can cause threshold voltage variations among a plurality of transistors performing the same function.

SUMMARY

The inventive concepts provide integrated, circuit devices capable of maintaining desired performance by providing a desired threshold voltage without threshold voltage variation among a plurality of transistors performing the same function, even if sizes of the transistors are reduced according to down-scaling of the integrated circuit devices. Thus, such integrated circuit devices may maintain desired performance with transistors having reduced gate lengths.

According to an aspect of the inventive concepts, an integrated circuit device may include a fin-type active area extending on a substrate in a first direction, a first gate line and a second gate line extending on the fin-type active area in parallel to each other in a second direction, which is different from the first direction, a first insulating capping layer covering an upper surface of the first gate line and extending in parallel to the first gate line, a second insulating capping layer covering an upper surface of the second gate line and extending in parallel to the second gate line, wherein a height of the first gate line and a height of the second gate line are different from each other.

According to another aspect of the inventive concepts, an integrated circuit device may include a fin-type active area extending on a substrate in a first direction and including a fin separating recess on an upper surface of the fin-type active area, and a first fin portion and a second fin portion at opposing sides of the fin separating recess, with the fin separating recess interposed between the first fin portion and the second fin portion, a fin separating insulating layer in the fin separating recess, and a plurality of first gate structures extending on the first fin portion in parallel to one another in a second direction that crosses the first direction, wherein each of the plurality of first gate structures includes a first gate line extending in the second direction and a first insulating capping layer on an upper surface of the first gate line and extending in parallel to the first gate line, and the first gate lines of two adjacent first gate structures from among the plurality of first gate structures have different heights.

According to another aspect of the inventive concepts, an integrated circuit device may include a substrate, a fin-type active area on the substrate, wherein the fin-type active area is divided into a first portion and a second portion by a fin separating recess, and a plurality of first gate structures on the first portion of the fin-type active area, respective ones of the plurality of first gate structures comprising a first gate line and a first capping layer on the first gate line. A combined height of the first gate line and the first capping layer of each of the first gate structures may be substantially the same. The first gate line of a first gate structure of the plurality of first gate structures that is nearest the fin separating recess may have a first gate line height that is different than a first gate line height of at least one other first gate structure of the plurality of first gate structures.

BRIEF DESCRIPTION OF THE DRAWINGS

Embodiments of the inventive concepts will be more clearly understood from the following detailed description taken in conjunction with the accompanying drawings in which:

FIGS. 1A through 1C are views for describing integrated circuit devices according to embodiments of the inventive concepts, wherein FIG. 1A is a layout diagram of an integrated circuit device according to the embodiments of the inventive concepts, FIG. 1C is a cross-sectional view taken along lines C1-C1' and C2-C2' of FIG. 1A;

FIGS. 3A through 3C are views for describing integrated circuit devices according to other embodiments of the inventive concepts, wherein FIG. 3A is a layout diagram of an integrated circuit device according to the other embodiments of the inventive concepts, FIG. 3G is a cross-sectional view taken along a line X-X' of FIG. 3A, and FIG. 3C is a cross-sectional view taken along lines Y1-Y1', Y2-Y2', and Y3-Y3' of FIG. 3A;

FIGS. 6A through 20B are cross-sectional views for describing an example sequential process of manufacturing integrated circuit devices according to embodiments of the inventive concepts, wherein FIGS. 6A, 7A, 8 through 13, 14A, 15A, 20A are cross-sectional views illustrating, according to the sequential process of manufacturing the integrated circuit devices, a portion corresponding to a sectional plane taken along the line X-X' of FIG. 3A, and FIGS. 6B, 7B, 14B, 15B, 20B are cross-sectional views illustrating, according to the sequential process of manufacturing the integrated circuit devices, a portion corresponding to a sectional plane taken along the lines Y1-Y1', Y2-Y2', and Y3-Y3' of FIG. 3A.

DETAILED DESCRIPTION

Figure 1A:
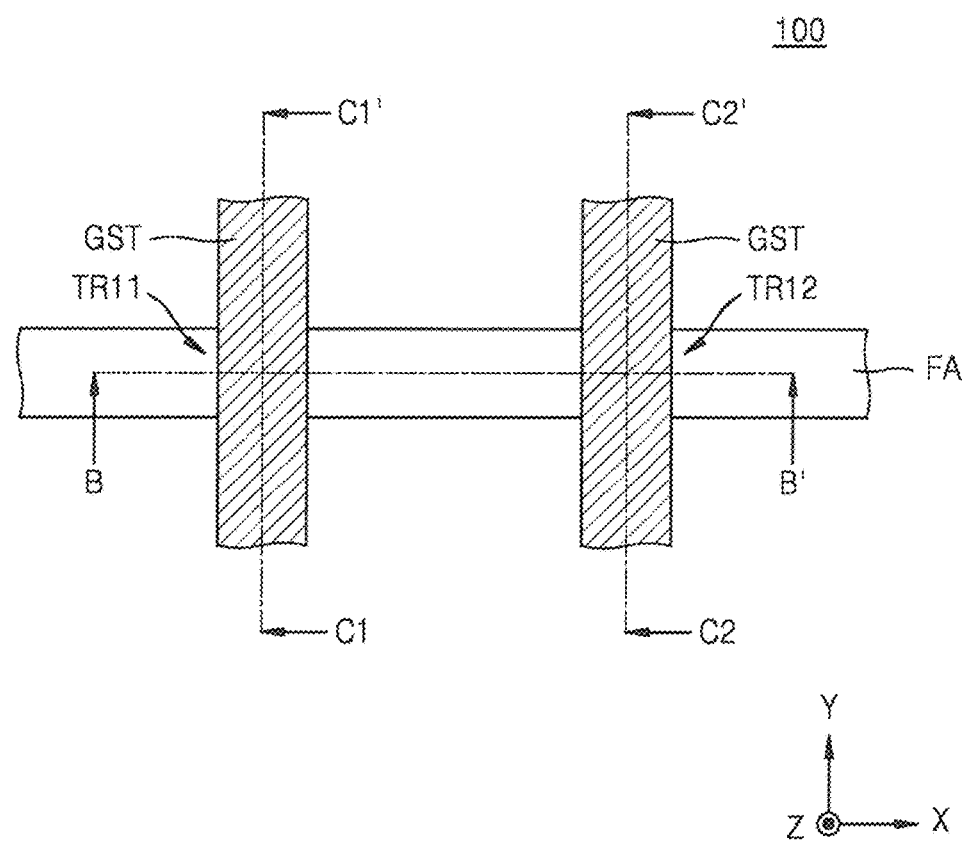
Figure 1B:
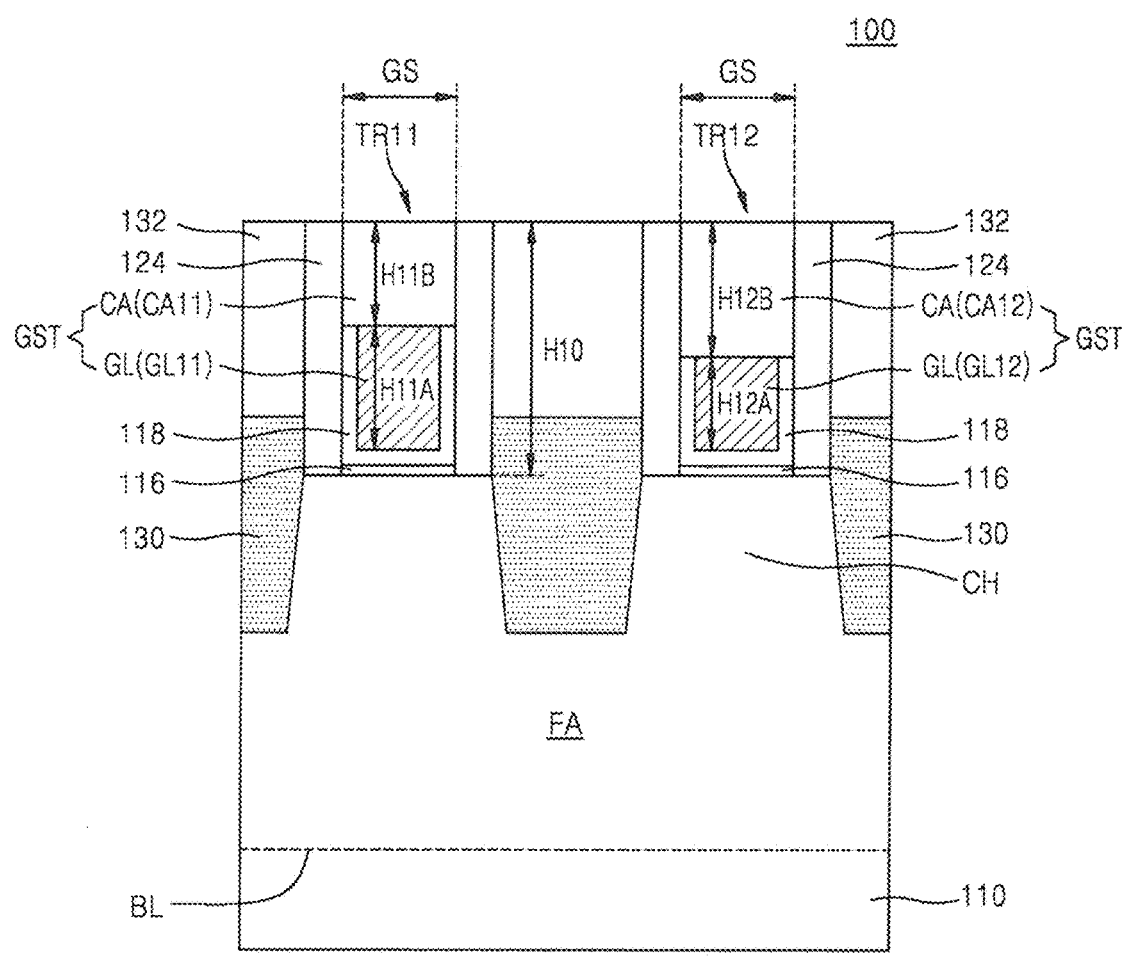
Figure 1C:
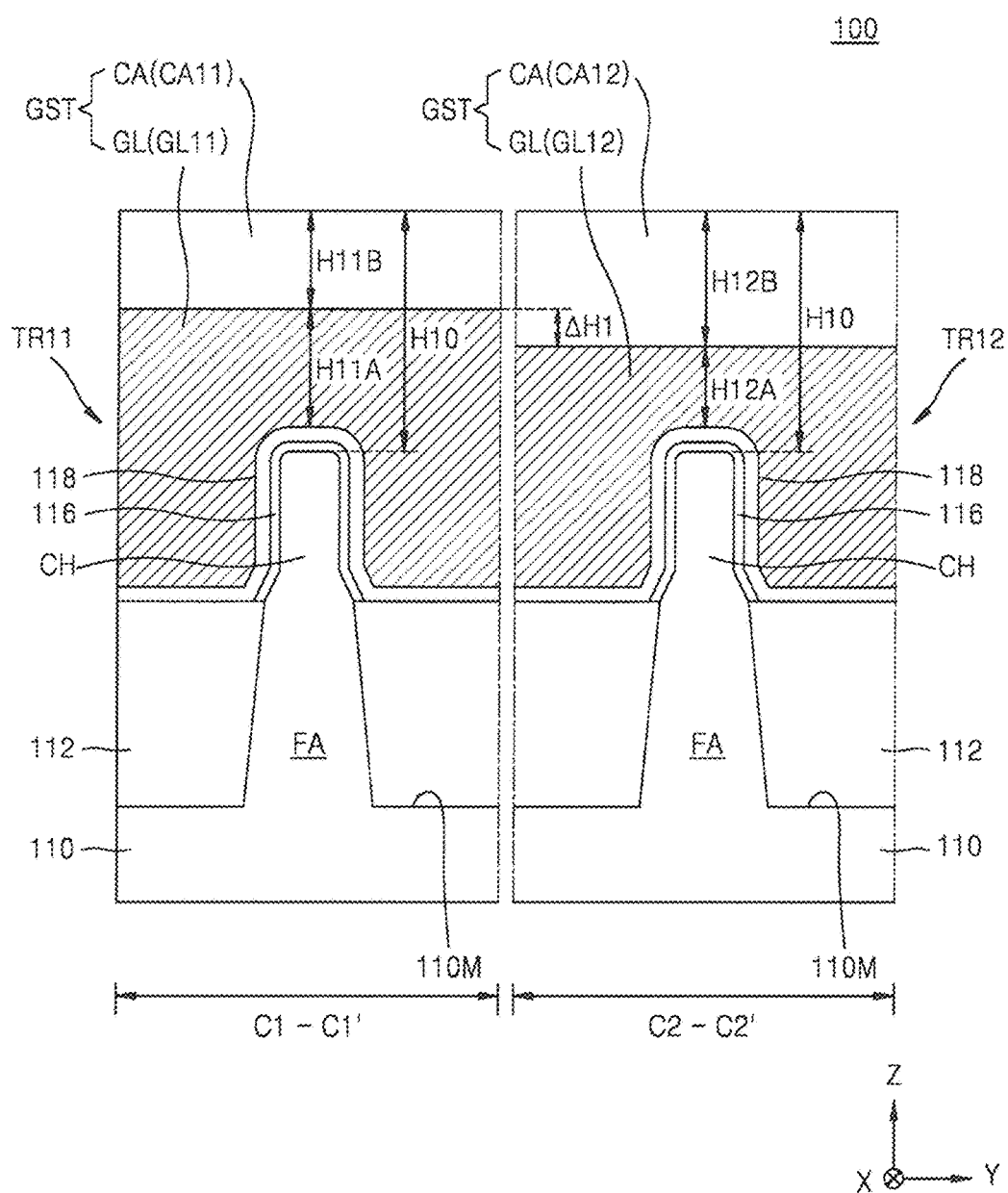

FIGS. 1A through 1C are views for describing integrated circuit devices according to embodiments of the inventive concepts, wherein FIG. 1A is a layout diagram of the integrated circuit device 100 according to the embodiments of the inventive concepts, FIG. 1B is a cross-sectional view taken along a line B-B' of FIG. 1A, and FIG. 1C is a cross-sectional view taken along lines C1-C1' and C2-C2' of FIG. 1A.

Referring to FIGS. 1A through 1C, the integrated circuit device 100 may include a substrate 110 having a fin-type active area FA extending in a first direction (e.g., an X direction).

The fin-type active area FA may protrude upwards from a device isolation layer 112 as a fin shape, in a direction (e.g., a Z direction) that is perpendicular to a main surface 110M of the substrate 110. In FIG. 1B, a level of a bottom surface of the fin-type active area FA is indicated as a dotted line BL. The level BL of the bottom surface of the fin-type active area FA may be substantially the same as a level of the main surface 110M of the substrate 110.

The fin-type active area FA includes a channel area CH in an upper portion thereof. On the substrate 110, a bottom side wall of the fin-type active area FA may be covered by the device isolation layer 112.

In some embodiments, the channel area CH of the fin-type active area FA may include a single material. For example, all areas of the fin-type active area FA, including the channel area CH, may include Si. In other embodiments, some areas of the fin-type active area FA may include Ge, and other areas of the fin-type active area FA may include Si.

A plurality of gate insulating spacers 124 defining a plurality of gate spaces OS may be formed on the fin-type active area FA on the substrate 110.

An interfacial layer 116 covering the channel area CH of the fin-type active area. FA may be formed in each of the plurality of gate spaces GS. A gate dielectric layer 118, a gate line GL, and an insulating capping layer CA may be sequentially stacked on the interfacial layer 116 in each of the plurality of gate spaces GS. The gate dielectric layer 118, the gate line GL, and the insulating capping layer CA may extend in a second direction (e.g., a Y direction) that crosses the first direction (e.g., the X direction). The gate line GL and the insulating capping layer CA in one gate space GS may form one gate structure GST.

FIGS. 1A through 1C illustrate that two gate spaces GS are provided on the fin-type active area A. However, the present inventive concepts are not limited thereto. Three or more gate spaces GS extending in parallel to one another may be provided on the fin-type active area FA, and each of the plurality of gate spaces GS may have a structure in which the interfacial layer 116, the gate dielectric layer 118, the gate line GL, and the insulating capping layer CA are sequentially stacked.

Heights H10 of the plurality of gate spaces (IS provided on the fin-type active area FA may be the same or substantially the same. In this specification, unless otherwise defined, "the height of the gate space GS" denotes a size of the gate space GS from an upper surface of the fin-type active area FA in a direction (e.g., the Z direction) perpendicular to the main surface 110M of the substrate 110.

The interfacial layer 116 may be formed by oxidizing a surface of the fin-type active area FA in the gate space GS. The interfacial layer 116 may cure interfacial defects between the fin-type active area FA and the gate dielectric layer 118. In some embodiments, the interfacial layer 116 may be omitted. In some embodiments, the height H10 of the gate space GS may include the cumulative height of the components of the gate space GS, such as the gate dielectric layer 118, the gate line GL, the insulating capping layer CA, and the interfacial layer 116, if present, on the upper surface of the fin-type active area FA.

The gate dielectric layer 118 and the gate line GL may extend in the gate space GS to cover the upper surface and both side walls of the fin-type active area FA, and an upper surface of the device isolation layer 112. A plurality of transistors may be formed at points at which the fin-type active area FA and a plurality of gate lines GL cross each other. FIGS. 1A through 1C illustrate a first transistor TR11 including a first gate line GL11 from among the plurality of gate lines GL, and a second transistor TR12 including a second gate line GL12 from among the plurality of gate lines GL. Each of the first and second transistors TR11 and TR12 may include a metal oxide semiconductor (MOS) transistor having a three-dimensional structure in which channels are formed at the upper surface and the both side walls of the fin-type active area FA.

The plurality of insulating capping layers CA may cover upper surfaces of the plurality of gate lines GL in the plurality of gate spaces GS. The plurality of insulating capping layers CA may extend in parallel to the plurality of gate lines GL in the second direction (e.g., the Y direction). A first insulating capping layer CA11 from among the plurality of insulating capping layers CA may cover the upper surface of the first gate line GL11 and may extend in parallel to the first gate line GL11. A second insulating capping layer CA12 may cover the upper surface of the second gate line GL12 and may extend in parallel to the second gate line GL12. Both side walls of each of the interfacial layer 116, the gate dielectric layer 118, the gate line GL, and the insulating capping layer CA filling the gate space GS may be covered by the gate insulating spacer 124.

Two adjacent gate lines GL from among the plurality of gate lines GL may have different heights from each other. In some embodiments, a height H11A of the first gate line GL11 may be greater than a height H12A of the second gate line GL12, and a height H11B of the first insulating capping layer CA11 may be less than a height H12B of the second insulating capping layer CA12, as illustrated in FIGS. 1B and 1C. That is, there is a height difference ΔH1 between the first gate line GL11 and the second gate line GL12.

A sum of the height H11A of the first gate line GL11 and the height H11B of the first insulating capping layer CA11 may be the same or substantially the same as a sum of the height H12A of the second gate line GL12 and the height H12B of the second insulating capping layer CA12. However, the structure illustrated in FIGS. 1B and 1C is only an example, and the structure may be modified or changed in various ways within the technical scope of the present inventive concepts.

In other embodiments, the height H11A of the first gate line GL11 may be less than the height H12A of the second gate line GL12, and the height H11B of the first insulating capping layer CA11 may be greater than the height H12B of the second insulating capping layer CA12. In this specification, unless otherwise defined, the height of the gate line GL denotes a height of the gate line GL on the upper surface of the fin-type active area FA. Also, unless otherwise defined, the height of the insulating capping layer CA denotes a height of the insulating capping layer CA on the upper surface of the fin-type active area FA.

The substrate 110 may include a semiconductor, such as, for example, Si or Ge, and/or a compound semiconductor, such as, for example, SiGe, SiC, GaAs, InAs, and/or InP. In some embodiments, the substrate 110 may include at least one of a groups III-V material and a group IV material. The groups III-V material may include a binary, ternary, or tetra compound including at least one group III element and at least one group V element. The groups III-V material may include a compound including at least one of, for example, In, Ga, and Al, as a group III element, and at least one of, for example, As, P, and Sb, as a group V element. For example, the groups III-V material may be selected from InP, $In_zGa_{1-z}As$ ($0 \le z \le 1$), and $Al_zGa_{1-z}As$ ($0 \le z \le 1$). The binary compound may include, for example, any one of InP, GaAs, InAs, InSb, and/or GaSb. The ternary compound may include, for example, any one of InGaP, InGaAs, AlInAs, InGaSb, GaAsSb, and/or GaAsP. The group IV material may include Si or Ge. However, the groups III-IV material and the group IV material which may be included in the integrated circuit device 100 according to the present inventive concepts are not limited thereto. The groups III-V material, and the group IV material, such as Ge, may be used as a channel material included in a transistor having a high speed and a low power consumption.

A high performance complementary metal-oxide semiconductor (CMOS) may be manufactured by using a semiconductor substrate including, for example, GaAs, a groups III-V material having a higher electron mobility than a material of a Si substrate, and a semiconductor substrate including, for example, Ge, a semiconductor material having a higher hole mobility than the material of the Si substrate. In some embodiments, when an n-channel MOS (NMOS) transistor is formed on the substrate 110, the substrate 110 may include any one of the groups III-V material exemplified above. In other embodiments, when a p-channel MOS (PMOS) transistor is formed on the substrate 110, at least a portion of the substrate 110 may include Ge. As another example, the substrate 110 may have a silicon on insulator (SOI) structure. The substrate 110 may include a conductive area, for example, a well doped with impurities, and/or a structure doped with impurities.

The device isolation layer 112 may be formed by a deposition process or a coating process. In some embodiments, the device isolation layer 112 may include a silicon oxide layer, a silicon nitride layer, a silicon oxynitride layer, or a combination thereof. In some embodiments, the device isolation layer 112 may include an insulating liner (not shown) including a thermal oxide layer, a nitride layer, and/or polysilicon, and a burying insulating layer (not shown) on the insulating liner. In some embodiments, the device isolation layer 112 may include an oxide layer formed by a flowable chemical vapor deposition (FCVD) process or a spin coating process. For example, the device isolation layer 112 may include fluoride silicate glass (FSG), uncoped silicate glass (USG), boro-phospho-silicate glass (BPSG), phospho-silicate glass (PSG), flowable oxide (FOX), plasma enhanced tetra-ethyl-ortho-silicate (PE_TEOS), and/or tonen silazene (TOSZ). However, the device isolation layer 112 is not limited thereto.

The gate insulating spacer 124 may include a silicon nitride layer, a SiOCN layer, a SiCN layer, or a combination thereof. In this specification, the "silicon nitride layer" may denote a $Si_3N_4$ layer. "SiOCN" may denote a material containing Si, O, C, and N. "SiCN" may denote a material containing Si, C, and N. The gate insulating spacer 124 may include a single layer including any one selected from the exemplified materials, or multiple layers in which a plurality of different material layers are sequentially stacked.

Each of a plurality of interfacial layers 116 may be obtained by oxidizing a partial surface of the fin-type active area FA. The plurality of interfacial layers 116 may prevent interfacial defects between the fin-type active area FA and the gate dielectric layer 113. In some embodiments, the plurality of interfacial layers 116 may include a low dielectric material layer having a dielectric constant that is equal to or lower than 9. For example, the plurality of interfacial layers 116 may include a silicon oxide layer, a silicon oxynitride layer, a Ga oxide layer, a Ge oxide layer, or a combination thereof. In other embodiments, the plurality of interfacial layers 116 may include a silicate, or a combination of a silicate and the low dielectric material layer exemplified above.

A plurality of gate dielectric layers 118 may include a silicon oxide layer, a high dielectric layer, or a combination thereof. The high dielectric layer may include a material having a higher dielectric constant than a material of the silicon oxide layer. For example, the gate dielectric layer 118 may have a dielectric constant of about 10 to about 25. The high dielectric layer may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, materials included in the high dielectric layer are not limited thereto. The gate dielectric layer 118 may be formed by an atomic layer deposition (ALD) process, a chemical vapor deposition (CVD) process, or a physical vapor deposition (PVD) process. The gate dielectric layer 118 may be formed to cover a bottom surface and both side walls of the gate line CL.

Each of the plurality of gate lines CL may extend on the gate dielectric layer 118 in a direction that crosses the fin-type active area FA to cover an upper surface and both side walls of each of fin-type active areas FA.

The plurality of gate lines GL may include a metal containing layer for adjusting a work function. In some embodiments, the plurality of gate lines GL may further include a gap-filling metal containing layer that fills a space formed on the metal containing layer for adjusting a work function. In some embodiments, each of the plurality of gate lines GL may have a structure in which a metal nitride layer, a metal layer, a conductive capping layer, and/or a gap-filling metal layer are sequentially stacked. Each of the metal nitride layer and the metal layer may include at least one metal selected from Ti, W, Ru, Nb, Mo, Ni, Co, Pt, Yb, Tb, Dy, Er, and/or Pd. Each of the metal nitride layer and the metal layer may be firmed by an ALD process, a metal organic ALD (MOALD) process, or a metal organic CVD (MOCVD) process. The conductive capping layer may serve as a protection layer for preventing oxidization of a surface of the metal layer. Also, the conductive capping layer may serve as a wetting layer for making deposition easier when another conductive layer is deposited on the metal layer. The conductive capping layer may include a metal nitride, for example, TiN, TaN, or a combination thereof, but is not limited thereto. The gap-filling metal layer may extend on the conductive capping layer. The gap-filling metal layer may include a W layer. The gap-filling metal layer may be formed, by an ALD process, a CVD process, or a PVD process. The gap-filling metal layer may bury a recessed space, formed due to a step difference portion on an upper surface of the conductive capping layer, without a void. In some embodiments, the plurality of gate lines GL may include a stack of TiAlC/TiN/W, a stack of TiN/TaN/TiAlC/TiN/W, and/or a stack of TiN/TaN/TiN/TiAlC/TiN/W. In those stacks, the TiAlC layer or the TiN layer may serve as the metal containing layer for adjusting a work function.

The plurality of insulating capping layers CA may include a silicon nitride layer, a SiOCN layer, a SiCN layer, or a combination thereof. The plurality of insulating capping layers CA may include a single layer including any one material selected from the materials exemplified above, or multiple layers in which a plurality of different material layers are sequentially stacked.

A plurality of source/drain areas 130 at both sides of the plurality of gate lines GL may be formed on the fin-type active area FA. The plurality of source/drain areas 130 may be arranged such that each of the plurality of source/drain areas 130 is arranged between respective ones of the plurality of gate lines GL.

The source/drain area 130 may include a semiconductor layer epitaxially grown from the fin-type active area FA. In some embodiments, the source/drain area 130 may have an embedded SiGe structure including a plurality of SiGe layers epitaxially grown. The plurality of SiGe layers may have different Ge contents. In some embodiments, the source/drain area 130 may include an epitaxially grown Si layer and/or a epitaxially grown SiC layer.

An inter-gate insulating layer 132 may be formed between respective ones of the plurality of gate lines GL. The inter-gate insulating layer 132 may be formed between two adjacent gate lines GL to cover the source/drain area 130. The inter-gate insulating layer 132 may include a silicon oxide layer, but is not limited thereto. In some embodiments, a conductive contact plug (not shown) may be provided to penetrate the inter-gate insulating layer 132 and be connected to the source/drain area 130.

FIGS. 2A through 2G are views for describing integrated circuit devices 100A, 100B, 100C, 100D, 100E, 100F, and 100G according to other embodiments of the inventive concepts. FIGS. 2A through 2G are cross-sectional views for describing various modified embodiments of the plurality of gate lines GL and the plurality of insulating capping layers CA included in the gate structure GST of the integrated circuit device 100 illustrated in FIGS. 1A through 1C. Sectional components illustrated in FIGS. 2A through 2G may correspond to sectional components taken along the line B-B' of FIG. 1A. In FIGS. 2A through 2G, like reference numerals refer to the like elements in FIGS. 1A through 1C, and their detailed descriptions will be omitted.

Figure 2A:
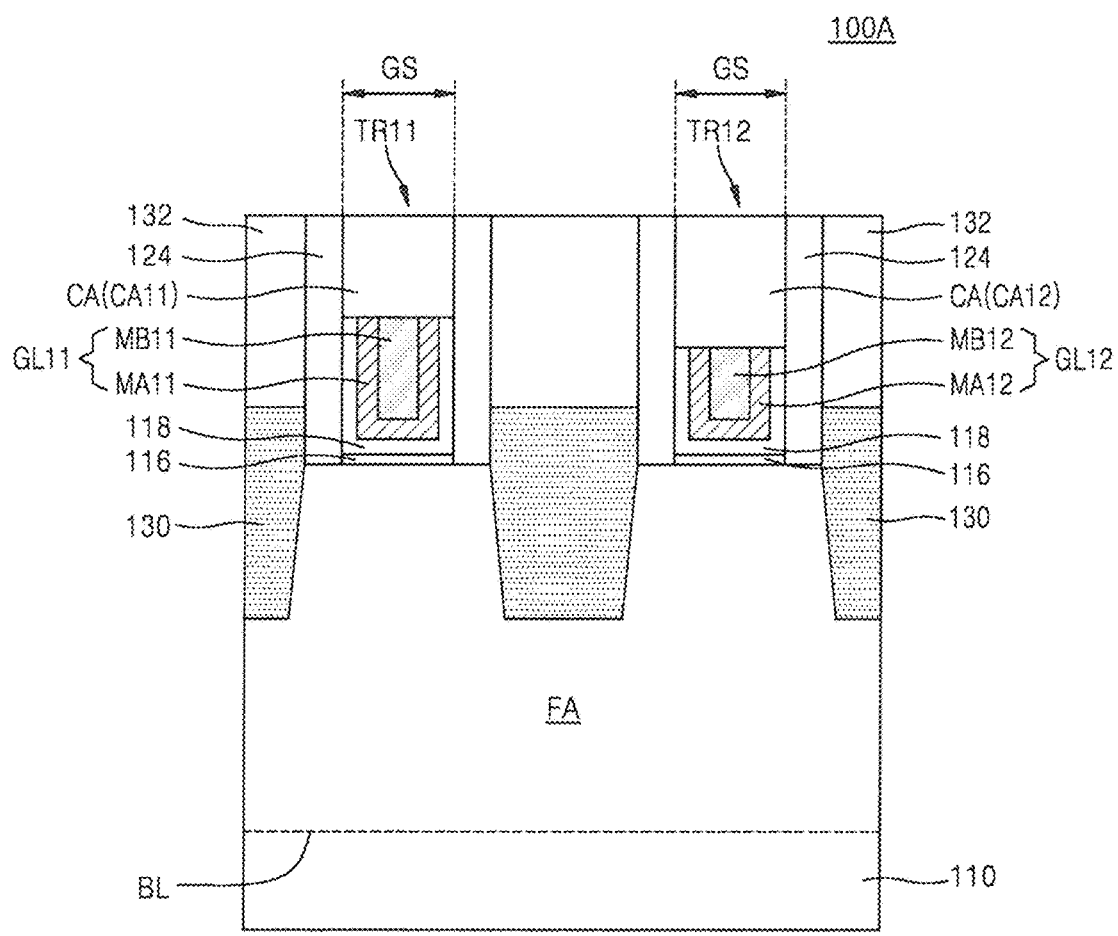
FIGS. 2A through 2G are cross-sectional views for describing integrated circuit devices according to embodiments of the inventive concepts.

Referring to FIG. 2A, in the integrated circuit device 100A, the first gate line GL11 may include a first metal containing layer MA11 and a second metal containing layer MB11. The second gate line GL12 may include a first metal containing layer MA12 and a second metal containing layer MB12.

Each of the first metal containing layer MA11 and the second metal containing layer MB11 included in the first gate line GL11 may contact the first insulating capping layer CA11. Each of the first metal containing layer MA12 and the second metal containing layer MB12 included in the second gate line GL12 may contact the second insulating capping layer CA12.

The first metal containing layer MA11 included in the first gate line GL11 and the first metal containing layer MA12 included in the second gate line GL12 may include the same material. However, a height of the first metal containing layer MA11 may be greater than a height of the first metal containing layer MA12.

The second metal containing layer MB11 included in the first gate line GL11 and the second metal containing layer MB12 included in the second gate line GL12 may include the same material. However, a height of the second metal containing layer MB11 may be greater than a height of the second metal containing layer MB12.

The first metal containing layers MA11 and MA12 may adjust a work function. The second metal containing layers MB11 and MB12 may fill a recessed space formed on the first metal containing layers MA11 and MA12, respectively. In some embodiments, the first metal containing layers MA11 and MA12 may include a metal, such as Ti, Ta, Al, or a combination thereof. In some embodiments, the first metal containing layers MA11 and MA12 may include a Ti layer, a TiN layer, a TiON layer, a TiO layer, a Ta layer, a TaN layer, a TaON layer, an oxygen-doped TiAlN (hereinafter, referred to as "TiAlN(O)") layer, an oxygen-doped TaAlN (hereinafter, referred to as "TaAlN(O)") layer, or a combination thereof. In some embodiments, the first metal containing layers MA11 and MA12 may include a single layer or multiple layers. When the first metal containing layers MA11 and MA12 include multiple layers, the first metal containing layer MA11 and the first metal containing layer MA12 may have the same stack structure.

The second metal containing layers MB11 and MB12 may include an upper work function adjustment layer, a conductive barrier layer, a gap-filling metal layer, or a combination thereof. The upper work function adjustment layer may include TiAl, TiAlN, TiC, TaC, HfSi, or a combination thereof, but is not limited thereto. The conductive barrier layer may include a metal nitride, for example, TIN, TaN, or a combination thereof, but is not limited thereto. The gap-filling metal layer may be formed to fill a recessed space on the conductive barrier layer. The gap-filling metal layer may include to W layer. Each of the upper work function adjustment layer, the conductive barrier layer, and the gap-filling metal layer may be formed by an ALD process, a CVD process, or a PVD process. In some embodiments, at least one of the upper work function adjustment layer, the conductive barrier layer, and the gap-filling metal layer may be omitted. In some embodiments, the second metal containing layers MB11 and MB12 may include a single layer or multiple layers. When the second metal containing layers MB11 and MB12 include multiple layers, the second metal containing layer MB11 and the second metal containing layer MB12 may have the same stack structure.

Figure 2B:
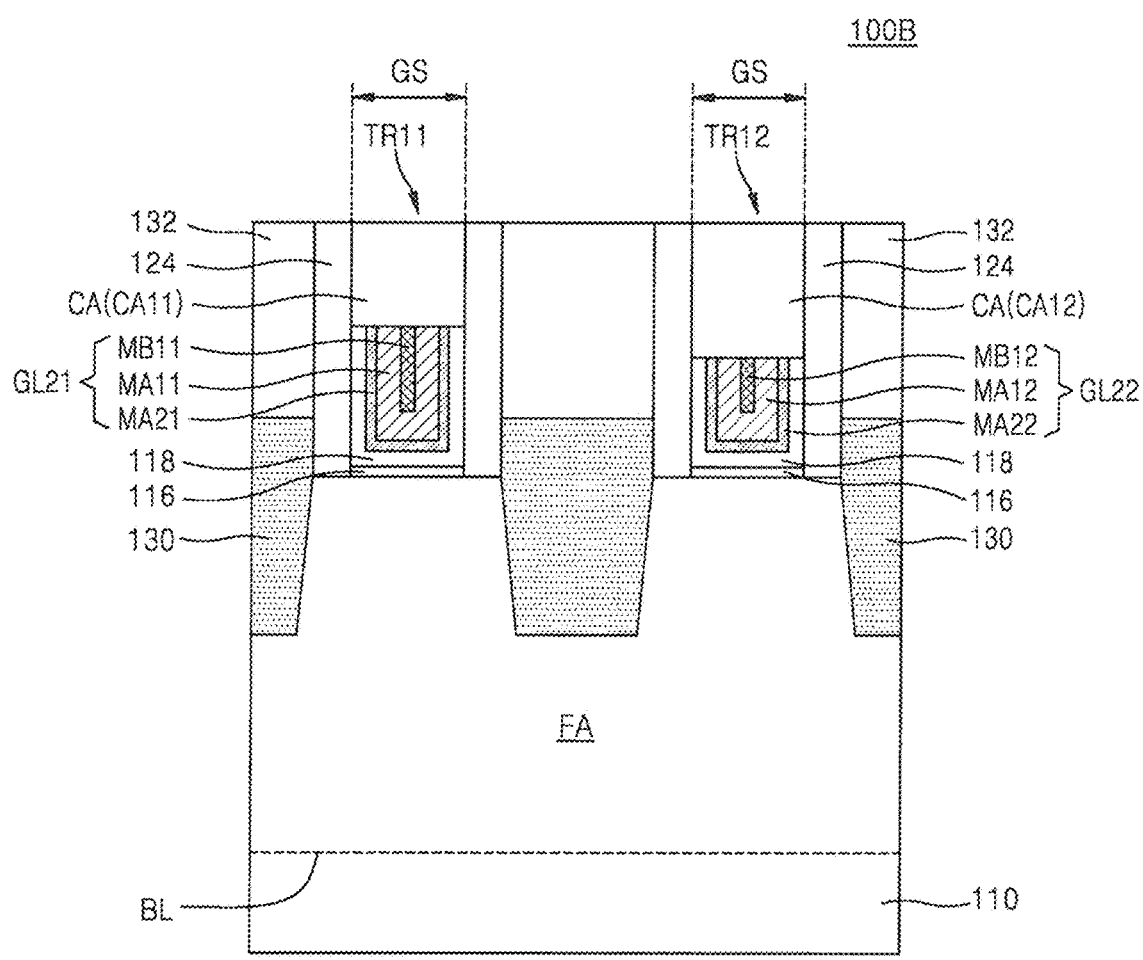

Referring to FIG. 2B, a first gate line GL12 and a second gate line GL22 of the integrated circuit device 100B may have substantially the same structure as the first gate line GL11 and the second gate line BL12 of the integrated circuit device 100A illustrated in FIG. 2A. However, the first gate line GL21 of the integrated circuit device 100B further includes a first conductive barrier layer MA21 and the second gate line GL22 of the integrated circuit device 100B further includes a second conductive barrier layer MA22.

The first conductive barrier layer MA21 of the first gate line GL21 may be interposed between the gate dielectric layer 118 and the first metal containing layer MA11, and the second conductive barrier layer MA22 of the second gate line GL22 may be interposed between the gate dielectric layer 118 and the first metal containing layer MA12.

The first conductive barrier layer MA21 and the second conductive barrier layer MA22 may prevent diffusion of atoms included in the first gate line GL21 and the second gate line GL22 into the gate dielectric layer 118. Each of the first conductive barrier layer MA21 and the second conductive barrier layer MA22 may include at least one metal selected from Ti, Ta, W, Ru, Nb, Mo, and Hf, or a metal nitride thereof. The first conductive barrier layer MA21 and the second conductive barrier layer MA22 may include the same material. The first conductive barrier layer MA21 and the second conductive barrier layer MA22 may have a thickness of dozens of Å. In some embodiments, the first conductive barrier layer MA21 and the second conductive barrier layer MA22 may include a single layer including a single metal layer or a single metal nitride layer. In other embodiments, the first conductive barrier layer MA21 and the second conductive barrier layer MA22 may include multiple layers including a plurality of metal layers and/or metal nitride layers.

The first conductive barrier layer MA21 may contact the first insulating capping layer CA11. The second conductive barrier layer MA22 may contact the second insulating capping layer CA12.

The first conductive barrier layer MA21 and the second conductive barrier layer MA22 may include the same material. In some embodiments, the first conductive upper barrier layer MAGI and the second conductive upper barrier layer MA22 may include a single layer or multiple layers. When each of the first conductive barrier layer MA21 and the second conductive barrier layer MA22 includes multiple layers, the first conductive harrier layer MA21 and the second conductive barrier layer MA22 may have the same stack structure. However, a height of the first conductive harrier layer MA21 may be greater than a height of the second conductive barrier layer MA22.

Figure 2C:
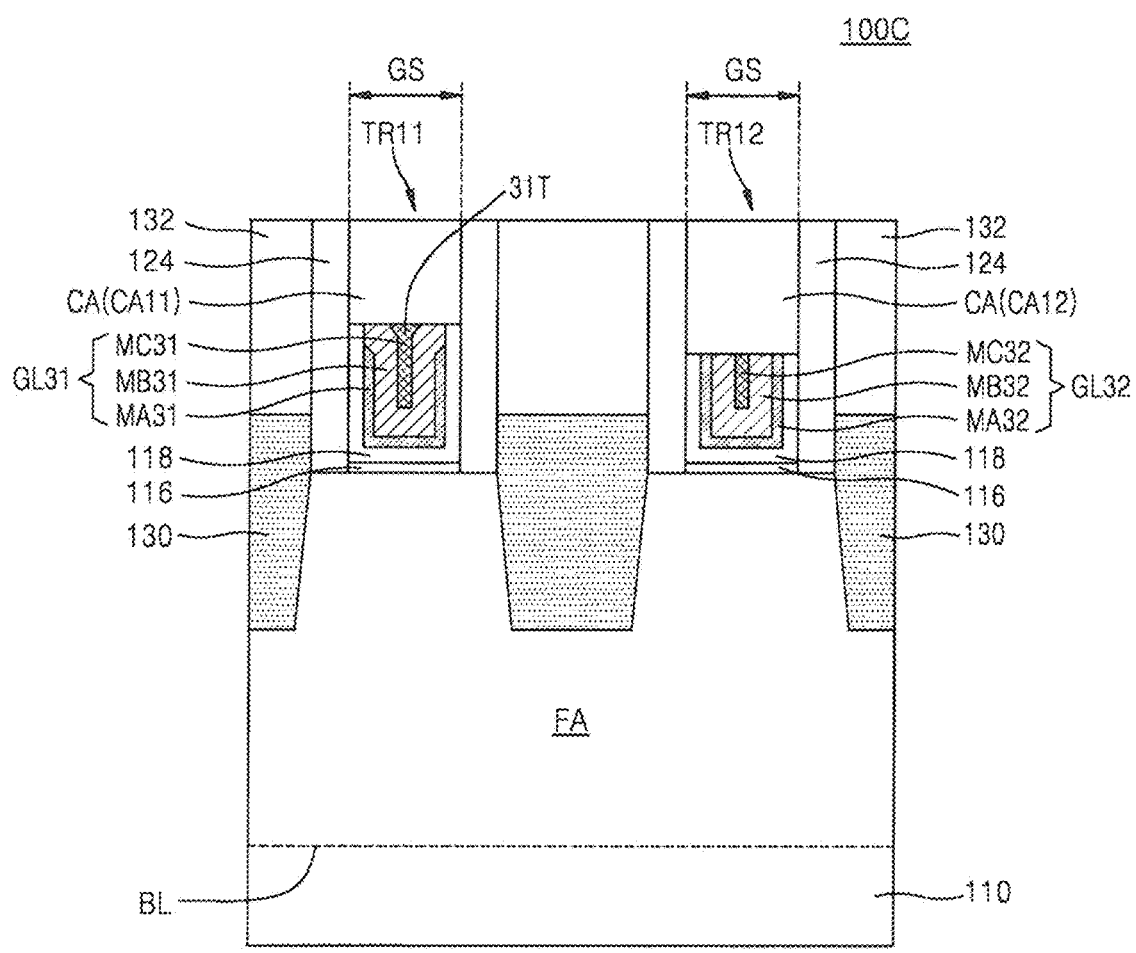

Referring to FIG. 2C, a first gate line GL31 and a second gate line GL32 of the integrated circuit device 100C have substantially the same structure as the first gate line GL11 and the second gate line GL12 of the integrated circuit device 100A illustrated in FIG. 2A. However, the first gate line GL31 may include a first conductive harrier layer MA31, a first metal containing layer MB31, and a second metal containing layer MC31. Also, the second gate line GL32 may include a second conductive barrier layer MA32, a first metal containing layer MB32, and a second metal containing layer MC32.

The first conductive barrier layer MA31 and the second conductive barrier layer MA32 may have substantially the same structure as the first conductive barrier layer MA21 and the second conductive barrier layer MA22 described with reference to FIG. 2B. However, the first conductive barrier layer MA31 included in the first gate line GL31 may not contact the first insulating capping layer CA11. In the first gate line GL31, the first conductive barrier layer MA31 and the first insulating capping layer CA11 may be apart from each other with the first metal containing layer MB31 interposed therebetween.

The first metal containing layer MB31 and the second metal containing layer MC31 included in the first gate line GL31 may have substantially the same structure as the first metal containing layer MA11 and the second metal containing layer MB11 described with reference to FIG. 2A. However, an upper portion 31T of the second metal containing layer MC31 included in the first gate line GL31 may have a shape, a width of which increases as the upper portion 31T of the second metal containing layer MC31 is nearer to the first insulating capping layer CA11 from the substrate 110. Also, an upper portion of the first metal containing layer MB31 included in the first gate line GL31 may have an angled shape that bends towards the gate dielectric layer 118 to overlap the first conductive barrier layer MA31 included in the first gate line GL31 between the first conductive barrier layer MA31 and the first insulating capping layer CA11. The angle of the upper portion of the first metal containing layer MB31 included in the first gate line GL31 may follow the increasing width of the upper portion 31T or the second metal containing layer MC31.

The first metal containing layer MB32 and the second metal containing layer MC32 included in the second gate line GL32 may have substantially the same structure as the first metal containing layer MA12 and the second metal containing layer MB12 described with reference to FIG. 2A.

Figure 2D:
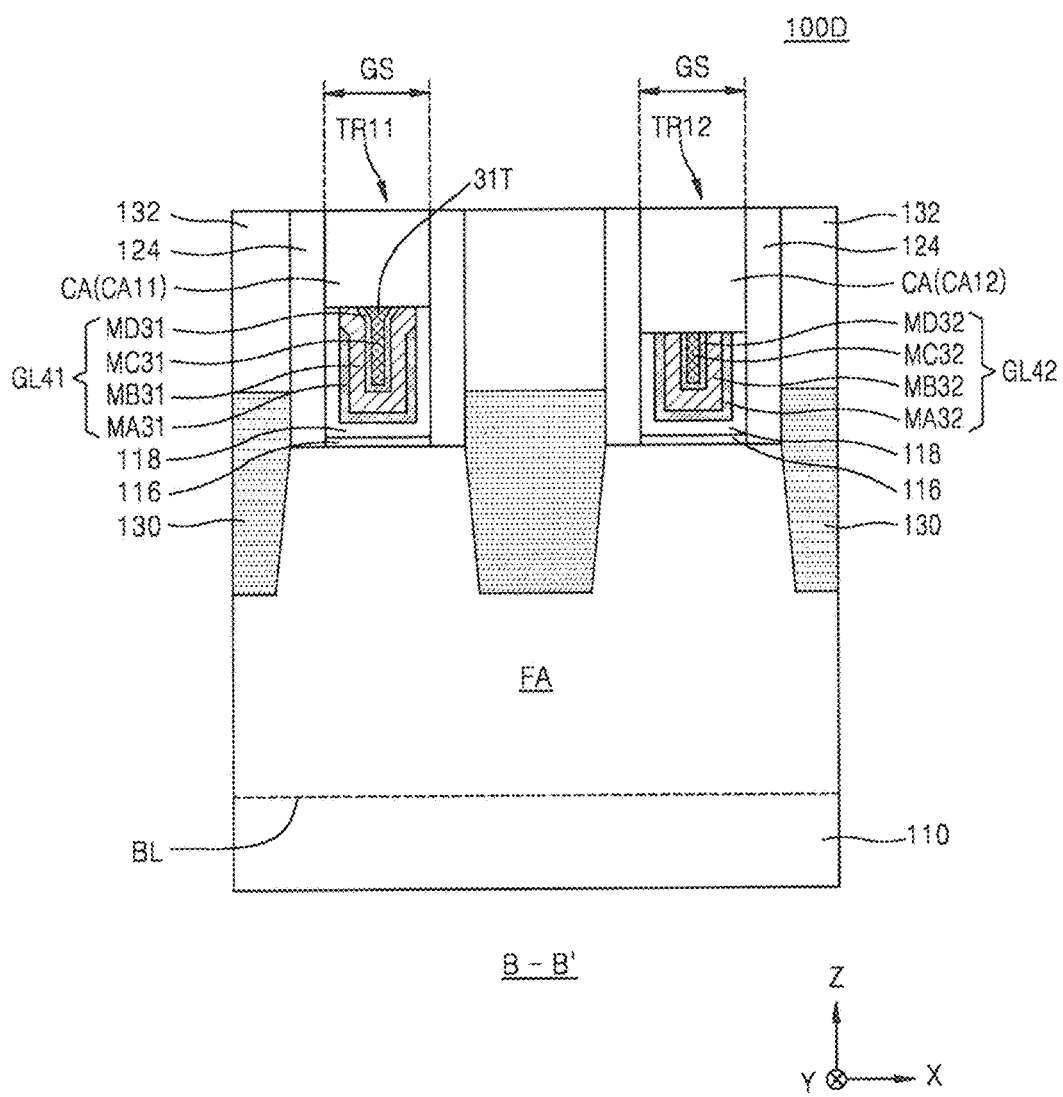

Referring to FIG. 2D, a first gate line GL41 and a second gate line GL42 of the integrated circuit device 100D may have substantially the same structure as the first gate line GL31 and the second gate line GL32 of the integrated circuit device 100C, illustrated in FIG. 2C. However, the first gate line GL41 may further include a first conductive upper barrier layer MD31 interposed between the first metal containing layer MB31 and the second metal containing layer MC31, and the second gate line GL42 may further include a second conductive upper barrier layer MD32 interposed between the first metal containing layer MB32 and the second metal containing layer MC32.

The first conductive upper barrier layer MD31 and the second conductive upper barrier layer MD32 may have substantially the same structure as the first conductive barrier layer MA21 and the second conductive barrier layer MA22, respectively, described with reference to FIG. 2B.

The first conductive upper barrier layer MD31 may contact the first insulating capping layer CA11. The second conductive upper barrier layer MD32 may contact the second insulating capping layer CA12.

The first conductive upper barrier layer MD31 and the second conductive upper barrier layer MD32 may include the same material. In some embodiments, the first conductive upper barrier layer MD31 and the second conductive upper barrier layer MD32 may include a single layer or multiple layers. When each of the first conductive upper barrier layer MD31 and the second conductive upper barrier layer MD32 includes multiple layers, the first conductive upper barrier layer MD31 and the second conductive upper barrier layer MD32 may have the same stack structure. However, a height of the first conductive upper barrier layer MD31 may be greater than a height of the second conductive upper barrier layer MD32.

Figure 2E:
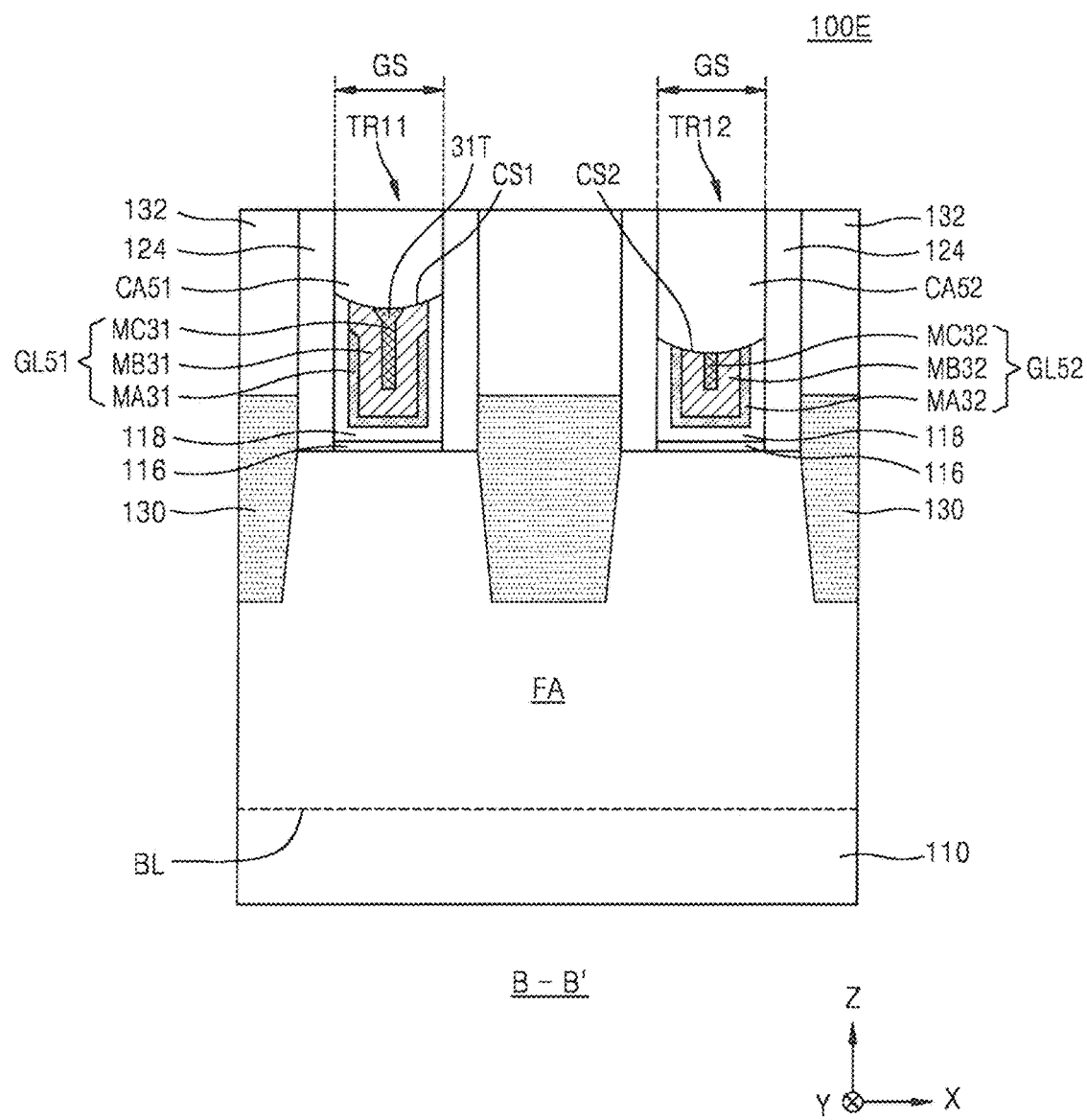

Referring to FIG. 2E, a first gate line GL51 and a second gate line GL52 of the integrated circuit device 100E may have substantially the same structure as the first gate line GL31 and the second gate line GL32 of the integrated circuit device 1000 illustrated in FIG. 2C.

However, the first gate line GL51 may contact a first insulating capping layer CA51 at a first boundary surface CS1 which is concave downward. Also, the second gate line GL52 may contact a second insulating capping layer CA52 at a second boundary surface CS2 which is concave downward. A height of the first boundary surface CS1 may be greater than a height of the second boundary surface CS2. Thus, a distance from the fin-type active area FA to the first boundary surface CS1 may be greater than a distance from the fin-type active area FA to the second boundary surface CS2.

The first gate line GL51 may provide the concave first boundary surface CS1, since the first gate line GL51 may have an upper surface that is concave downward such that a height of the first gate line GL51 decreases as the first gate line G51 is nearer to the second metal containing layer MC31 from the insulating spacer 124. The first insulating capping layer CA51 may contact the upper surface of the first gate line GL51, which may be concave downward, and may have a bottom surface that is convex downward, to correspond to the shape of the upper surface of the first gate line GL51. The first insulating capping layer CA51 may have substantially the same structure as the first insulating capping layer CA11 described with reference to FIGS. 1A through 1C.

The second gate line GL52 may provide the concave second boundary surface CS2, since the second gate line GL52 may have an upper surface that is concave downward such that a height of the second gate line GL52 decreases as the second gate line G52 is nearer to the second metal containing layer MC32 from the insulating spacer 124. The second insulating capping layer CA52 may contact the upper surface of the second gate line GL52, which may be concave downward, and may have a bottom surface that is convex downward, to correspond to the shape of the upper surface of the second gate line GL52. The second insulating capping layer CA52 may have substantially the same structure as the second insulating capping layer CA12 described with reference to FIGS. 1A through 1C.

Figure 2F:
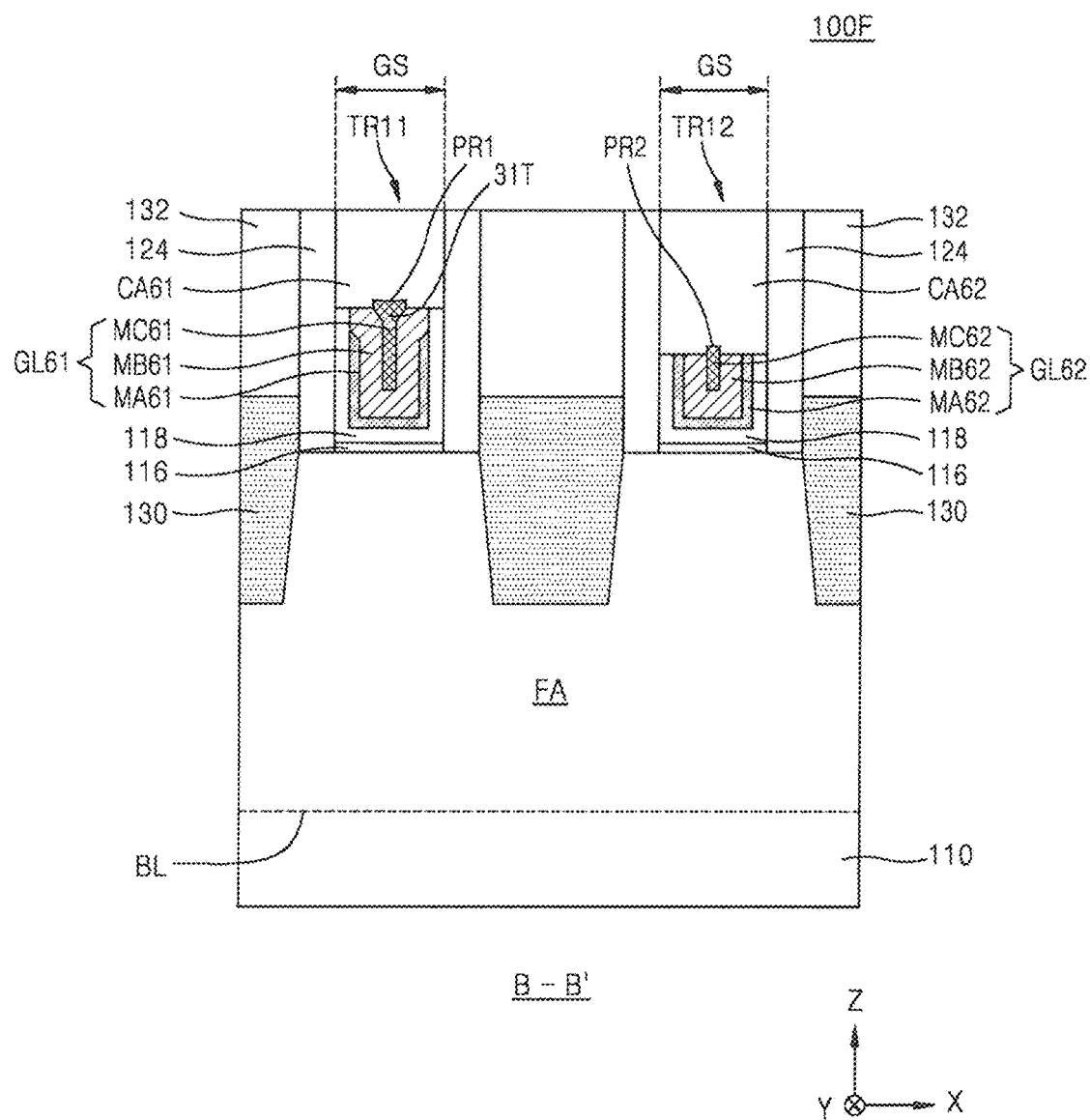

Referring to FIG. 2F, a first gate line GL61 and a second gate line GL62 of the integrated circuit device 100F may have substantially the same structure as the first gate line GL31 and the second gate line GL32 of the integrated circuit device 1000 illustrated In FIG. 2C.

However, the first gate line GL61 may include a first conductive barrier layer MA61, a first metal containing layer MB61, and a second metal containing layer MC61. Also, the second gate line GL62 may include a second conductive barrier layer MA62, a first metal containing layer MB62, and a second metal containing layer MC62.

In the first gate line GL61, the second metal containing layer MC61 may include a first protrusion portion PR1 that may protrude upwards from an upper surface of the first metal containing layer MB61, in the second gate line GL62, the second metal containing layer MC62 may include a second protrusion portion PR2 that may protrude upwards from an upper surface of the first metal containing layer MB62. A height of the first protrusion portion PR1 may be greater than a height of the second protrusion portion PR2. Thus, a distance from the fin-type active area FA to the first protrusion portion PR1, may be greater than a distance from the fin-type active area FA to the second protrusion portion PR2.

More detailed structures of the first conductive barrier layer MA61, the first metal containing layer MB61, and the second metal containing layer MC61 included in the first gate line GL61 may be substantially the same as the detailed structures of the first conductive barrier layer MA31, the first metal containing layer MB31, and the second metal containing layer MC31 described with reference to FIG. 2C More detailed structures of the second conductive barrier layer MC62, the first metal containing layer MB62, and the second metal containing layer MC62 included in the second gate line GL62 may be substantially the same as the detailed structure of the second conductive barrier layer MA32, the first metal containing layer MB32, and the second metal containing layer MC32 described with reference to FIG. 2C.

A first insulating capping layer CA61 covering an upper surface of the first gate line GL61 and a second insulating capping layer CA62 covering an upper surface of the second gate line GL62 may have substantially the same structure as the first insulating capping layer CA11 and the second insulating capping layer CA12, respectively, described with reference to FIGS. 1A through 1C. However, the first insulating capping layer CA61 may contact the first protrusion portion PR1 and may have a bottom surface having a concave portion having a shape corresponding to a shape of the first protrusion portion PR1. Also, the second insulating capping layer CA62 may contact the second protrusion portion PR2 and may have a bottom surface having a concave portion having a shape corresponding to a shape of the second protrusion portion PR2.

Figure 2G:
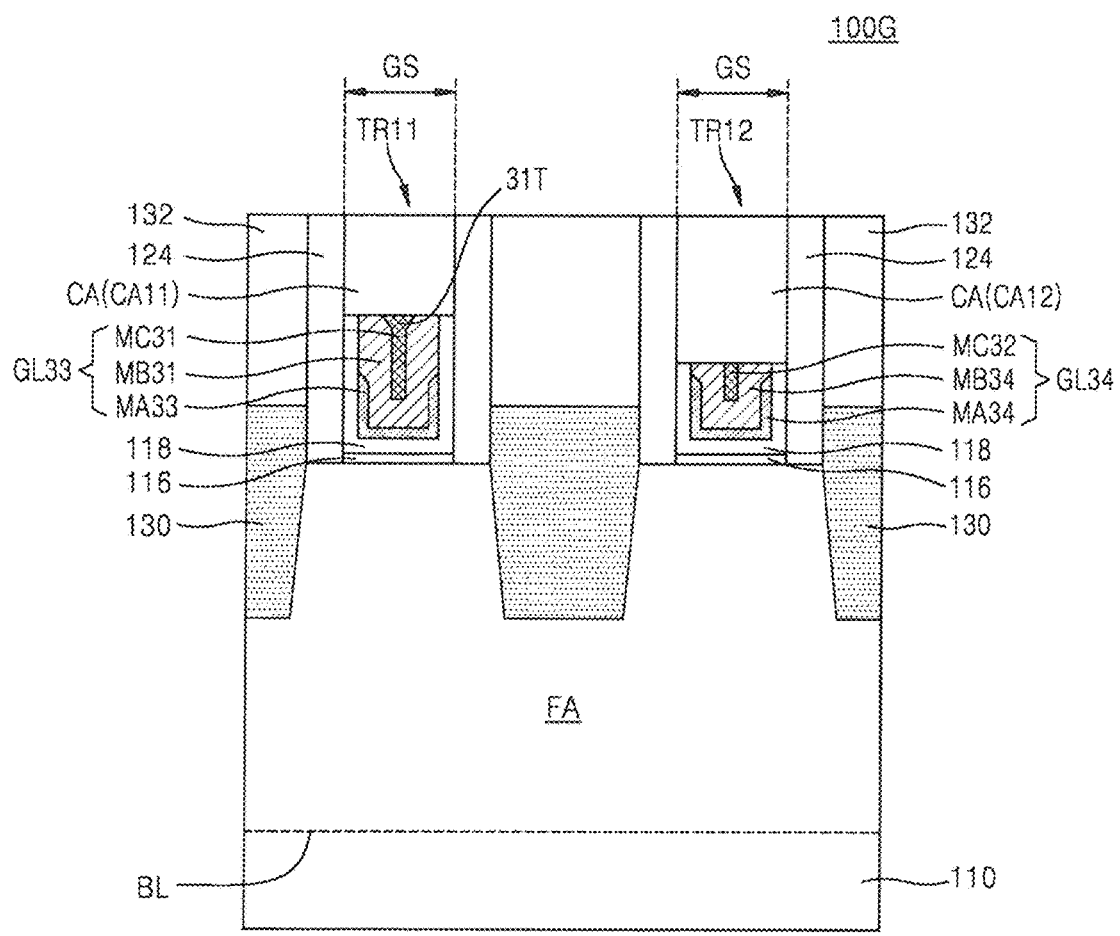

Referring to FIG. 2G, a first gate line GL33 and a second gate line GL34 of the integrated circuit device 100G may have substantially the same structure as the first gate line GL31 and the second gate line GL32 of the integrated circuit device 100C illustrated in FIG. 2C.

However, in the integrated circuit device 100G, the first gate line GL33 may include a first conductive barrier layer MA33 that does not contact the first insulating capping layer CA11, and the second gate line GL34 may include the second conductive barrier layer MA34 that does not contact the second insulating capping layer CA12. A height of the first conductive barrier layer MA33 may be the same or substantially the same as a height of the second conductive barrier layer MA34.

In the first gate line GL33, the first conductive barrier layer MA33 and the first insulating capping layer CA11 may be apart from each other with the first metal containing layer MB31 therebetween. In the second gate line GL34, the second conductive barrier layer MA34 and the second insulating capping layer CA12 may be apart from each other with a first metal containing layer MB34 therebetween. The first metal containing layer MB34 may be similar to the first metal containing layer MB32 described with reference to FIG. 2C. However, an upper portion of the first metal containing layer MB34 included in the second gate line GL34 may have an angled shape that bends towards the gate dielectric layer 118 to overlap the second conductive barrier layer MA34 included in the second gate line GL34 between the second conductive barrier layer MA34 and the second insulating capping layer CA12.

More detailed aspects with respect to the first conductive barrier layer MA33 and the second conductive barrier layer MA34 may be substantially the same as the detailed aspects with respect to the first conductive barrier layer MA31 and the second conductive barrier layer MA32 described with reference to FIG. 2C.

Figure 3A:
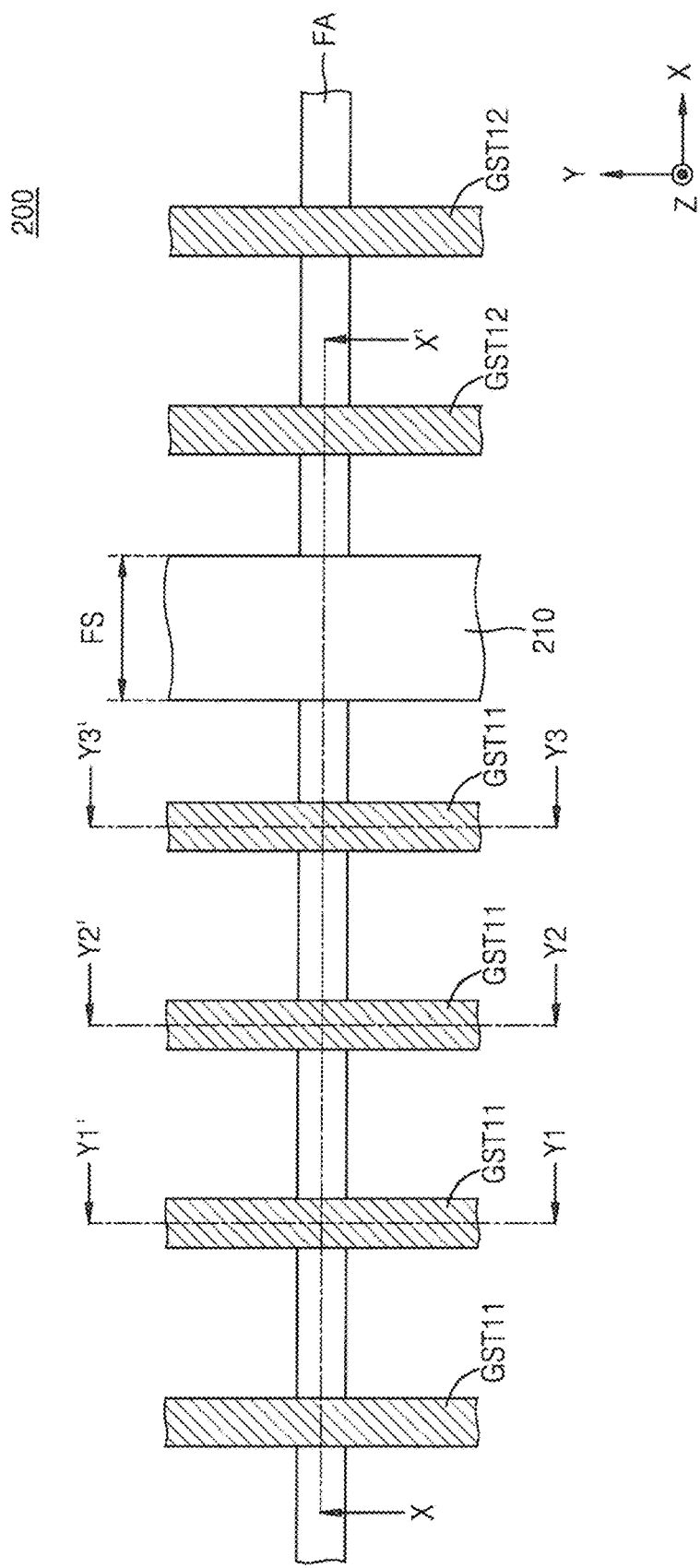
Figure 3B:
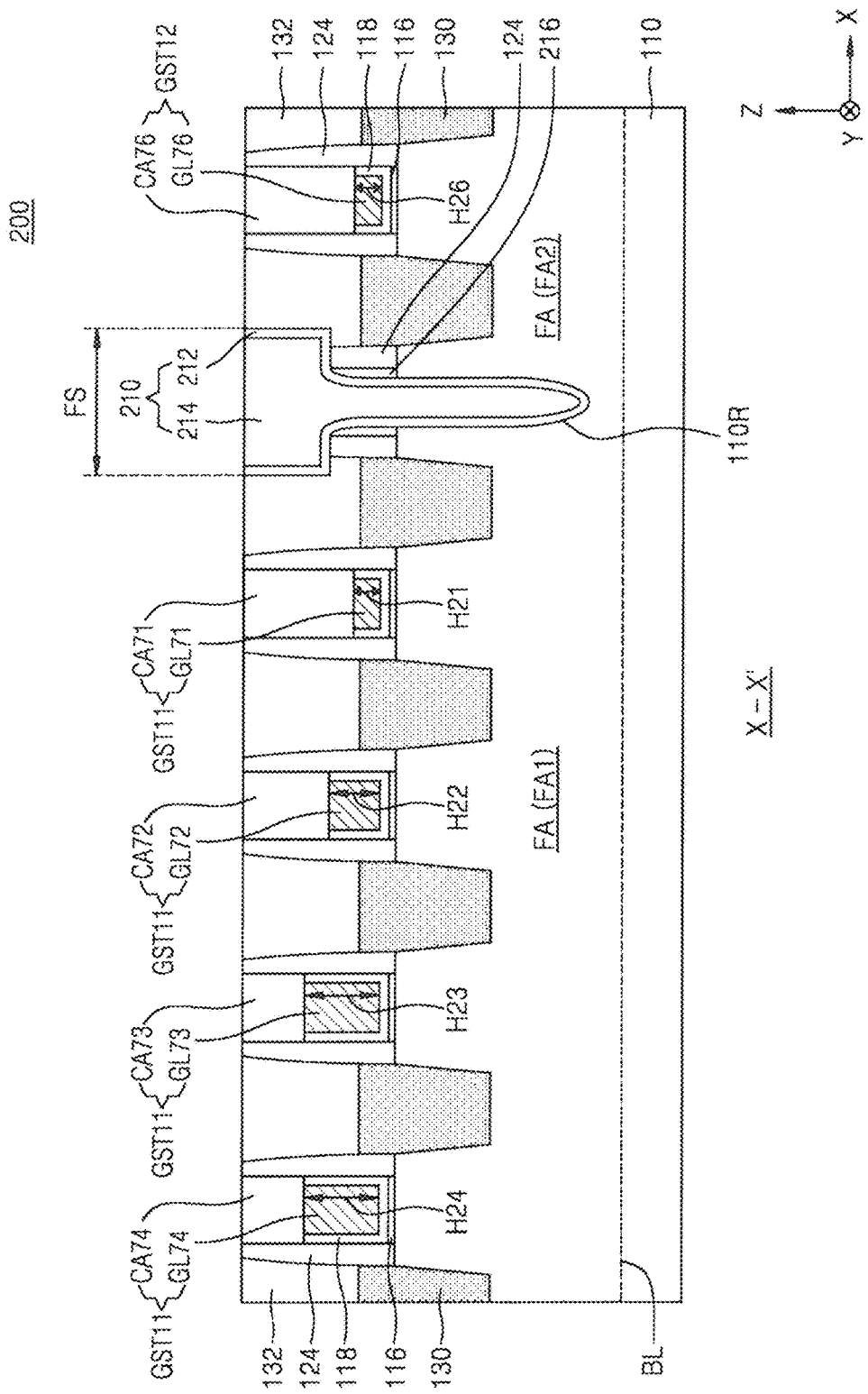
FIG. 3B is a cross-sectional view taken along a line B-B' of FIG. 1A.
Figure 3C:
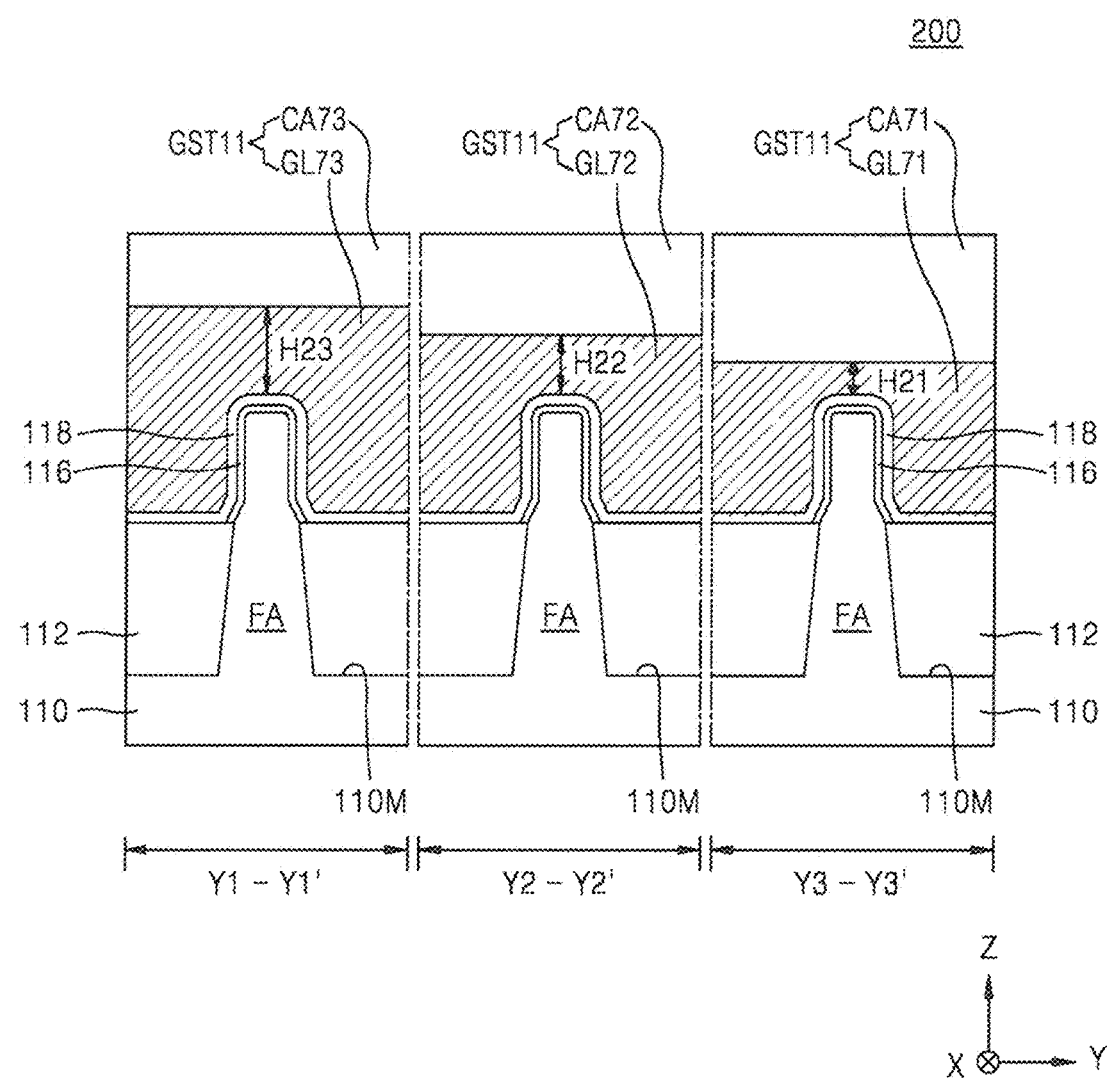

FIGS. 3A through 3C are views for describing integrated circuit devices according to other embodiments of the inventive concepts, wherein FIG. 3A is a layout diagram of the integrated circuit device 200, FIG. 3B is a cross-sectional view taken along a line X-X of FIG. 3A, and FIG. 3C is a cross-sectional view taken along lines Y1-Y1', Y2-Y2', and Y3-Y3' of FIG. 3A. In FIGS. 3A through 3C, like reference numerals refer to the like elements in FIGS. 1A through 1C, and their detailed descriptions will be omitted.

Referring to FIGS. 3A through 3C, the integrated circuit device 200 may include the fin-type active area FA extending on the substrate 110 in a first direction (e.g., an X direction). A fin separating recess 110R may be formed on an upper surface of the tin-type active area FA in a fin separating area FS. The fin-type active area FA may include a first tin portion FA1 and a second fin portion FA2 at both sides of the fin separating recess 110R, with the tin separating recess 110R interposed between the first fin portion FA1 and the second fin portion FA2.

A fin separating insulating layer 210 may be formed in the fin separating area FS. The fin separating insulating layer 210 may include an insulating liner 212 covering an inner wall of the fin separating recess 110R, and a burying insulating layer 214 filling the fin separating recess 110R on the insulating liner 212. In some embodiments, the insulating liner 212 and the burying insulating layer 214 may include different materials from each other, which may be selected from an oxide layer, a nitride layer, and/or an oxynitride layer. In other embodiments, the insulating liner 212 and the burying insulating layer 214 may include the same material as each other, which may be selected from an oxide layer, a nitride layer, and an oxynitride layer. Portions of both side walls of the fin separating layer 210 may be sequentially covered by an insulating spacer 216 and the gate insulating spacer 124 in the fin separating area FS. The insulating spacer 216 may include an oxide layer, a nitride layer, an oxynitride layer, or a combination thereof. The gate insulating spacer 124 from among the plurality of gate, insulating spacers 124 on the fin-type active area FA, which is in the fin separating layer FS, may have a smaller height than a gate insulating spacer 124 in other areas of the fin-type active area FA.

The shape and the structure of the fin separating insulating layer 210 illustrated in FIG. 3B are only examples, and various modifications and changes thereof are possible within the technical scope of the present inventive concepts.

A plurality of first gate structures GST11 extending in parallel to one another in a second direction (e.g., a Y direction) that crosses the first direction (e.g., the X direction) may be formed on the first fin portion FA1 of the fin-type active area FA. The plurality of first gate structures GST11 may include a plurality of first gate lines GL771, GL72, GL73, and GL74 extending in the second direction (e.g., the Y direction), and a plurality of first insulating capping layers CA71, CA72, CA73, and CA74 covering upper surfaces of the plurality of first gate lines GL71, GL72, GL73, and GL74 and extending in parallel to the plurality of first gate lines GL71, GL72, GL73, and GL74. The plurality of first gate structures GST11 may have the same or substantially the same heights.

At least two first gate structures GST11 from among the plurality of first gate structures GST11 may include first gate lines having different heights. For example, as illustrated in FIGS. 3B and 3C, three first gate structures GST11 formed on the first fin portion FA1 sequentially from the fin separating area FS may include the first gate lines GL71, GL72, and GL73 having, different heights. Heights H21, H22, and H23 of the three first gate lines GL71, GL72, and GL73 may decrease as the three first gate lines GL71, GL72, and GL73 are nearer to the fin separating insulating layer 210. In some embodiments, the first gate line GL71 from among the plurality of first gate lines GL71, GL72, GL73, and GL74 on the first fin portion FA1 of the fin-type active area FA, which is most adjacent to the fin separating insulating layer 210, may have the smallest height H21.

At least two first gate structures GST11 from among the plurality of first gate structures GST11 may include first gate lines having the same height. For example, as illustrated in FIG. 3B, in the plurality of first gate structures GST11, two adjacent first gate lines GL73 and GL74 may have, the same or substantially the same heights H23 and H24.

FIG. 3A illustrates that four first gate structures GST11 parallel to one another are formed on the first fin portion FA1 of the fin-type active area FA. However, the present inventive concepts are not limited thereto. Two, three, or more than five first gate structures GST11 parallel to each other or one another may be formed on the first fin portion FA1.

A plurality of second gate structures GST12 extending in parallel to one another in the second direction (e.g., the Y direction) that crosses the first direction (e.g., the X direction) may be formed on the second fin portion FA2 of the tin-type active area FA. At least one second gate structure GST12 from among the plurality of second gate structures GST12 may include a second gate line GL76 extending in the second direction (e.g., the Y direction), and a second insulating capping layer CA76 covering an upper surface of the second gate line GL76 and extending in parallel to the second gate line GL76. FIG. 3A illustrates that two second gate structures GST12 parallel to each other are formed on the second fin portion FA2 of the fin-type active area FA. However, the present inventive concepts are not limited thereto. In some embodiments, three or more second gate structures GST12 parallel to one another may be formed on the second fin portion FA2. The plurality of second gate structures GST12 formed on the second fin portion FA2 may have the same or substantially the same heights.

The plurality of second gate structures GST12 may include second gate lines having different heights, similarly with the plurality of first gate structures GST11. For example, three second gate structures may be formed on the second fin portion FA2 sequentially from the fin separating area FS, and may include the second gate lines having different heights. Heights of the three second gate lines may decrease as the three second gate lines are nearer to the fin separating insulating layer 210. In some embodiments, the second gate line GL76 from among the plurality of second gate lines formed on the second fin portion FA2 of the fin-type active area FA, which is most adjacent to the fin separating insulating, layer 210, may have a smallest height H26. However, the present inventive concepts are not limited thereto, and various modifications and changes thereof are possible within the technical scope of the present inventive concepts.

In some embodiments, the height H21 of the first gate line GL71 which is most adjacent to the fin separating insulating layer 210 on the first fin portion FA1, and the height H26 of the second gate line GL76 which is most adjacent to the fin separating insulating layer 210 on the second fin portion FA2 may be the same or substantially the same.

In other embodiments, the height H21 of the first gate line GL71 and the height H26 of the second gate line GL76 may be different from each other. For example, the height H21 of the first gate line GL71 may be greater or less than the height H26 of the second gate line GL76.

Each of the first gate lines GL71, GL72, GL73, and GL74 included in the plurality of first gate structures GST11 and the second gate line GL76 included in the plurality of second gate structures GST12 may have any one structure selected from the structures of the gate lines GL11, GL12, GL21, GL22, GL31, GL32, GL41, GL42, GL51, GL52, GL61, GL62, GL33, and GL34 described with reference to FIGS. 2A through 2G, and structures of gate lines that are modified or changed from the gate lines GL11, GL12, GL21, GL22, GL31, GL32, GL41, GL42, GL51, GL52, GL61, GL62, GL33, and GL34 within the technical scope of the present inventive concepts.

The plurality of source/drain areas 130 may be formed on each of the first fin portion FA2 and the second fin portion FA2 of the fin-type active area FA. The plurality of source/drain areas 130 may be arranged such that each of the plurality of source/drain areas 130 is interposed between respective ones of the plurality of first gate structures GST11, and between respective ones of the plurality of second gate structures GST12.

Figure 4:
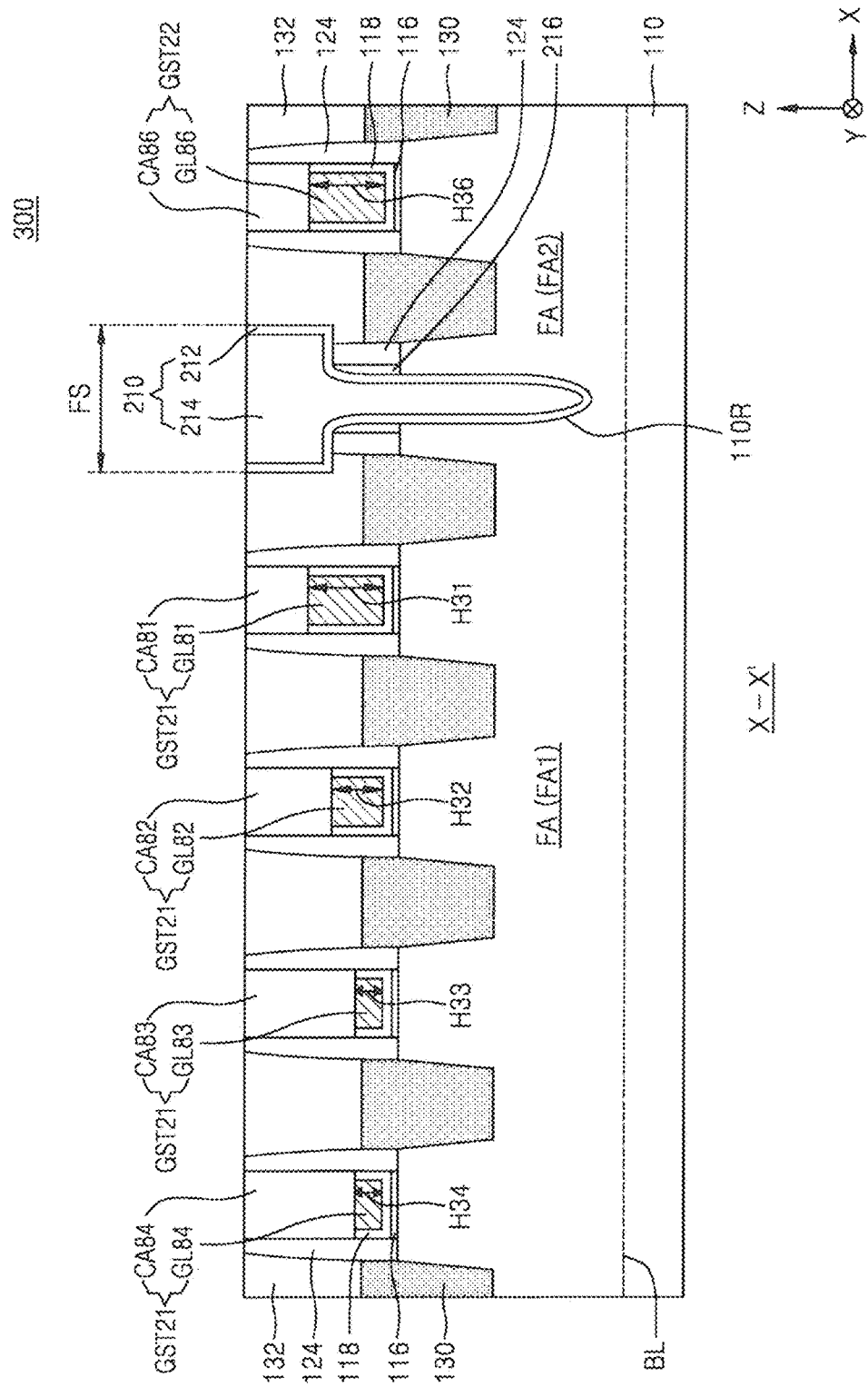
FIGS. 4 and 5 are cross-sectional views for describing integrated circuit devices according to other embodiments of the inventive concepts.

FIG. 4 is a cross-sectional view for describing integrated circuit devices 300 according to other embodiments of the inventive concepts. The cross-sectional view of FIG. 4 may correspond to a cross-sectional view taken along the line X-X' FIG. 3A. In FIG. 4, like reference numerals refer to the like elements in FIGS. 1A through 3C, and their detailed descriptions will be omitted.

Referring to FIG. 4, in the integrated circuit device 300, a plurality of first gate structures GST21 extending in parallel to one another in a second direction (e.g., a Y direction) that crosses a first direction (e.g., an X direction) may be formed on the first fin portion FA1 of the fin-type active area FA. The plurality of first gate structures GST21 may include a plurality of first gate lines GL81, GL82, GL83, and GL84 extending in the second direction (e.g., the Y direction), and a plurality of first insulating capping layers CA81, CA82, CA83, and CA84 covering upper surfaces of the plurality of first gate lines GL81, GL82, GL83, and GL84, respectively, and extending in parallel to the plurality of first gate lines GL81, GL82, GL83, and GL84. The plurality of first gate structures GST21 may have the same or substantially the same heights.

At least two first gate structures GST21 from among the plurality of first gate structures GST21 may include first gate lines having different heights. For example, three first-gate structures GST21 formed on the first fin portion FA1 sequentially from the fin separating area FS may include the first gate lines GL81, GL82, and GL83 having different heights. Heights H31, H32, and H33 of the three first gate lines GL81, GL82, and GL83, respectively, may increase as the three first gate lines GL81, GL82, and GL83 are nearer to the fin separating insulating layer 210. In some embodiments, the first gate line GL81 from among the plurality of first gate lines GL81, GL82, GL83, and GL84 formed on the first fin portion FA1 of the fin-type active area FA, which is most adjacent to the fin separating insulating layer 210, may have the greatest height H31.

At least two first gate structures GST21 from among the plurality of first gate structures GST21 may include first gate lines having the same height. For example, in the plurality of first gate structures GST21, two adjacent first gate lines GL83 and GL84 may have the same or substantially the same heights H33 and H34.

FIG. 4 illustrates that four first gate structures GST21 which are parallel to one another are formed on the first fin portion FA1 of the fin-type active area FA. However, the present inventive concepts are not limited to the embodiment of FIG. 4. Two, three, or more than five first gate structures GST21, which are parallel to each other or one another, may be formed on the first fin portion FA1.

A plurality of second gate structures extending in parallel to one another in the second direction (e.g., the Y direction) that crosses the first direction (e.g., the X direction) may be formed on the second fin portion FA2 of the fin-type active area FA. The plurality of second gate structures may include a second gate structure GST22 illustrated in FIG. 4. The second gate structure GST22 may include a second gate line GL86 extending in the second direction (e.g., the Y direction) and a second insulating capping layer CA86 covering an upper surface of the second gate line GL86 and extending in parallel to the second gate line GL86, FIG. 4 illustrates that one second gate structure GST22 is formed on the second fin portion FA2 of the fin-type active area FA. However, the present inventive concepts are not limited thereto. In some embodiments, two or more parallel second gate structures GST22 may be formed on the second fin portion FA2. The plurality of second gate structures GST22 on the second fin portion FA2 may have the same or substantially the same heights.

In some embodiments, the plurality of second gate structures may include second gate lines having different heights, similarly with the plurality of first gate structures GST21. For example, three second gate structures may be formed on the second fin portion FA2 sequentially from the fin separating area FS, and may include the second gate lines having different heights. Heights of the three second gate lines may increase as the three second gate lines are nearer to the fin separating insulating layer 210. In some embodiments, the second gate line GL86 from among the plurality of second gate lines formed on the second fin portion FA2 of the fin-type active area FA, which is most adjacent to the fin separating insulating layer 210, may have the greatest height. However, the present inventive concepts are not limited thereto, and various modifications and changes thereof may be possible within the technical scope of the present inventive concepts.

In some embodiments, a height H36 of the second gate line GL86 which is most adjacent to the fin separating insulating layer 210 on the second fin portion FA2 may be the same or substantially the same as the height H31 of the first gate line GL81 which is most adjacent to the fin separating insulating layer 210 on the first fin portion FA1.

In other embodiments, the height H31 of the first gate line GL81 and the height H36 of the second gate line GL86 may be different from each other. For example, the height H31 of the first gate line GL81 may be greater or less than the height H36 of the second gate line GL86.

Each of the first gate lines GL81, GL82, GL83, and GL84 included in the plurality of first gate structures GST21 and the second gate line GL86 included in the second gate structure GST22 may have any one structure, selected from the structures of the gate lines GL11, GL12, GL21, GL22, GL31, GL32, GL41, GL42, GL51, GL52, GL61, GL62, and GL34, described with reference to FIGS. 2A through 2C, and may have structures of gate lines modified or changed from the gate lines GL11, GL12, GL22, GL31, GL41, GL51, GL52, GL61, GL62, GL33, and GL34 within the technical scope of the present inventive concepts.

Figure 5:
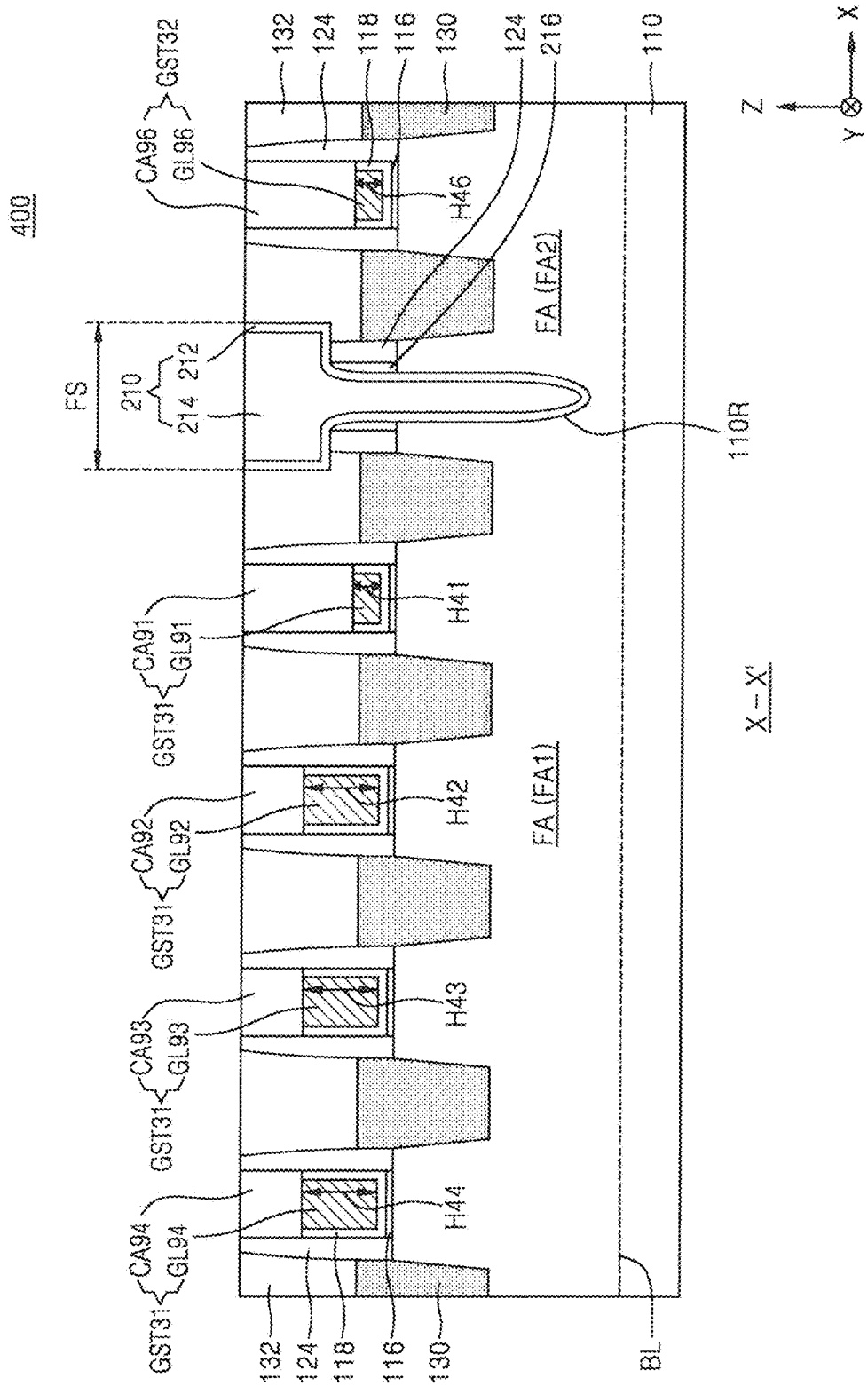

FIG. 5 is a cross-sectional view for describing an integrated circuit device 400 according to other embodiments of the inventive concepts. The cross-sectional view of FIG. 5 may correspond to a cross-sectional view taken along the line X-X' of FIG. 3A. In FIG. 5, like reference numerals refer to the like elements in FIGS. 1A through 3C, and their detailed descriptions will be omitted.

Referring to FIG. 5, in the integrated circuit device 400, a plurality of first gate structures GST31 extending in parallel to one another in a second direction (e.g., a Y direction) that crosses a first direction (e.g., an X direction) may be formed on the first fin portion FA1 of the fin-type active area FA. The plurality of first gate structures GST31 may include a plurality of first gate lines GL91, GL92, GL93, and GL94 extending in the second direction (e.g., the Y direction), and a plurality of first insulating capping layers CA91, CA92, CA93, and CA94 covering upper surfaces of the plurality of first gate lines GL91, GL92, GL93, and GL94, respectively, and extending in parallel to the plurality of first gate lines GL91, GL92, GL93, and GL94. The plurality of first gate structures GST31 may have the same or substantially the same heights.

The first gate line GL91 of the first gate structure GST31, from among the plurality of first gate lines included in the plurality of first gate structures GST31, which is most adjacent to the fin separating insulating layer 210, may have the smallest height H41. Other first gate lines GL92, GL93, and GL94 from among the plurality of gate lines included in the plurality of first gate structures GST31 than the first gate line GL91 may have the same or substantially the same heights H42, H43, and H44. However, the present inventive concepts are not limited to the example illustrated in FIG. 5. For example, the first gate line GL91 from among the plurality of first gate lines included in the plurality of first gate structures GST31, which is most adjacent to the fin separating insulting layer 210, may have the greatest height.

A plurality of second gate structures extending in parallel to one another in the second direction (e.g., the Y direction) that crosses the first direction (e.g., the X direction) may be formed on, the second fin portion FA2 of the fin-type active area FA. The plurality of second gate structures may include a second gate structure GST32 illustrated in FIG. 5. The second gate structure GST32 may include a second gate line GL96 extending in the second direction (e.g., the Y direction) and a second insulating capping layer CA96 covering an upper surface of the second gate line GL96 and extending in parallel to the second gate line GL96. FIG. 5 illustrates that one second gate structure GST32 is formed on the second fin portion FA2 of the fin-type active area FA. However, the present inventive concepts are not limited thereto. In some embodiments, two or more parallel second gate structures may be formed on the second fin portion FA2. Other second gate structures from among the plurality of second gate structures formed on the second fin portion FA2 than the second gate structure GST32 which is most adjacent to the fin separating insulating layer 210 may have the same or substantially the same heights.

Each of the first gate lines GL91, GL92, GL93, and GL94 included in the plurality of first gate structures GST31 and the second gate line GL96 included in the second gate structure GST32 may have any one structure selected from the structures of the gate lines GL11, GL12, GL21 GL22, GL31, GL32, GL41, GL42, GL62, GL33, and GL34, described with reference to FIGS. 2A through 2C, and may have structures of gate lines modified or changed from the gate lines GL11, GL12, GL21, GL22, GL32, GL41, GL42, GL51, GL52, GL61, GL62, GL33, and GL34 within the technical scope of the present inventive concepts.

The integrated circuit devices 100, 100A through 100G, 200, 300, and 400 according to the embodiments described with reference to FIGS. 1A through 5 may be included in a logic area or a memory area. The logic area may be standard cells performing desired logic functions, such as a counter, a buffer, etc., and may include various types of logic cells including a plurality of circuit elements, such as a transistor, a register, etc. For example, the logic cells may be included in AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INV (OAI), AND/OR (AO), AND/OR/INV (AOI), a D flip-flop, a reset flip-flop, a master-slave flip-flop, a latch, etc. However, the listed cells are only examples, and the logic cells according to the present inventive concepts are not limited thereto. The memory area may include a static random access memory (SRAM) area, a dynamic random access memory (DRAM) area, a magnetic random access memory (MRAM) area, a resistive random access memory (RRAM) area, and/or a phase-change random access memory (PRAM) area.

The integrated circuit devices 100, 100A through 100G, 200, 300, and 400 according to the embodiments described with reference to FIGS. 1A through 5 may include the plurality of gate structures on one fin-type active area FA, and the plurality of gate structures may include at least two gate structures having different gate heights. When types and/or strengths of stress regionally applied to the fin-type active area FA are different based on locations of the fin-type active area FA, the different stress may differently affect threshold voltages of the plurality of transistors on the fin-type active area FA. However, according to the present inventive concepts, the threshold voltages of the transistors may be controlled to be substantially constant, or differences between the threshold voltages of the transistors may be minimized within a permitted range, by controlling work functions of the gate lines in the plurality of gate structures by adjusting heights, of the gate lines included in the plurality of gate structures.

For example, in the integrated circuit devices 200, 300, and 400 illustrated in FIGS. 3B, 4, and 5, since the fin separating insulating layer 210 is formed on the fin-type active area FA, particular stress, for example, compressive stress, may be concentrated around the fin separating insulating layer 210 on the fin-type active area FA. Accordingly, threshold voltages of transistors from among the plurality of transistors formed on the fin-type active area FA, which are adjacent to the fin separating insulating layer 210, may be different from threshold voltages of other transistors which are relatively far from the fin separating insulating layer 210. Accordingly, a threshold voltage distribution of the plurality of transistors may increase. The integrated circuit devices 108, 100A through 100G, 200, 300, and 400 according to the embodiments include the gate lines including metal containing layers having different heights based on distances from the fin separating insulating layer 210, and thus, the threshold voltage distribution of the plurality of transistors on the fin-type active area FA may be decreased. The integrated circuit device according to the present inventive concepts may suppress variation of electrical performance based on locations of the electrical performance, the variation occurring due to a complex structure of a highly down-scaled integrated circuit device. Thus, the reliability of the integrated circuit device may be increased.

In some embodiments, when all of the plurality of transistors formed on the fin-type active area FA are PMOS transistors, threshold voltages of the transistors may decrease as the transistors are nearer to the fin separating insulating layer 210, due to compressive stress concentrated around the fin separating insulating layer 210 on the fin-type active area FA. In this case, as in the integrated circuit devices 200 and 400 illustrated in FIGS. 3B and 5, the gate line included in the transistor that is most adjacent to the fin separating insulating layer 210 may be formed to have a smaller height than the gate lines of other transistors that are further from the fin separating insulating layer 210, in order to increase the threshold voltage of the transistor most adjacent to the fin separating insulating layer 210. In other embodiments, when all of the plurality of transistors formed on the fin-type active area FA are NMOS transistors, threshold voltages of the transistors may increase as the transistors are nearer to the fin separating insulating layer 210, due to compressive stress concentrated around the fin separating insulating layer 210 on the fin-type active area PA. In this case, as in the integrated circuit devices 200 and 480 illustrated in FIGS. 3B and 5, the gate line included in the transistor that is most adjacent to the fin separating insulating layer 210 may be formed to have a smaller height than the gate lines of other transistors that are further from the fin separating insulating layer 210, in order to reduce the threshold voltage of the transistor most adjacent to the fin separating insulating layer 210. However, the described examples are only for convenience of understanding, and the present inventive concepts are not limited thereto.

Next, a method of manufacturing integrated circuit devices will be described in detail, according to embodiments of the inventive concepts.

FIGS. 6A through 20B are cross-sectional views for describing an example sequential process of manufacturing integrated circuit devices, according to embodiments of the inventive concepts, wherein FIGS. 6A, 7A, 8 through 13, 14A, 15A, 20A are the cross-sectional views illustrating, according to the sequential process of manufacturing the integrated circuit devices, a portion corresponding to a sectional plane taken, along the line X-X' of FIG. 3A, and FIGS. 6B, 7B, 14B, 15B, . . . , 20B are the cross-sectional views illustrating, according to the sequential process of manufacturing the integrates circuit devices, a portion corresponding to a sectional plane taken along the lines Y1-Y1', Y2-Y2', and Y3-Y3' of FIG. 3A. An example method of manufacturing the integrated circuit device 200 illustrated in FIGS. 3A through 3C will be described by referring to FIGS. 6A through 20B. In FIGS. 6A through 20B, like reference numerals refer to the like elements in FIGS. 1A through 3C, and their detailed descriptions will be omitted.

Figure 6A:
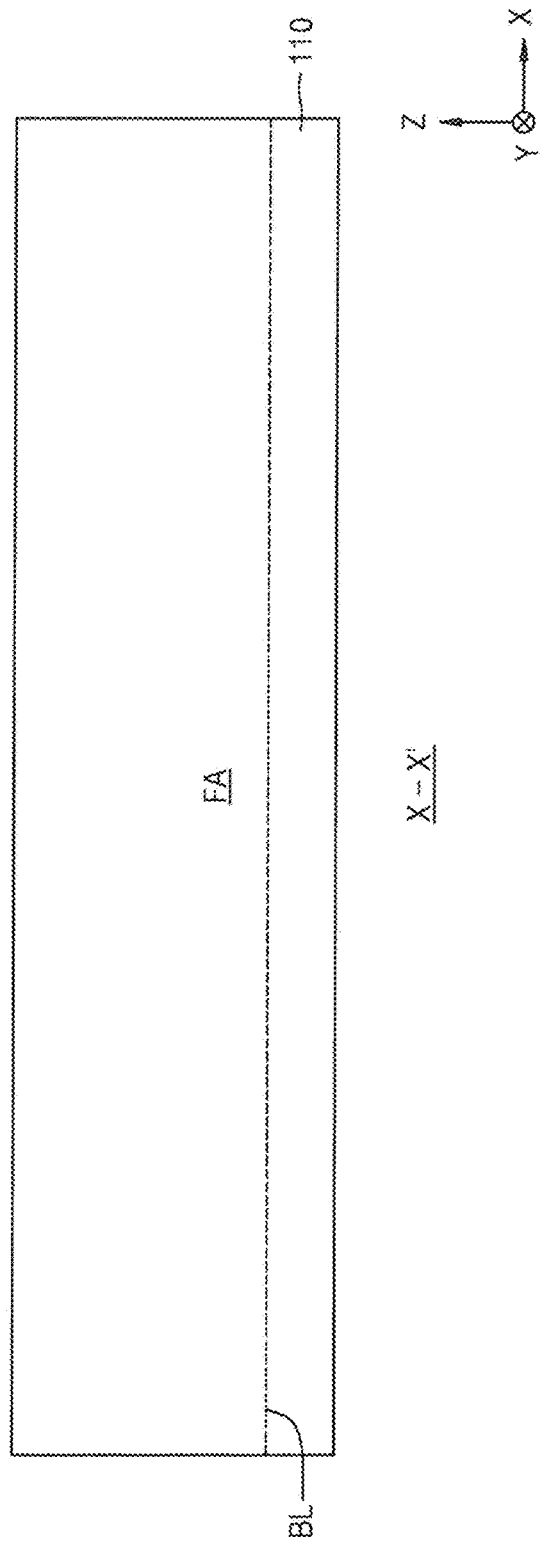
Figure 6B:
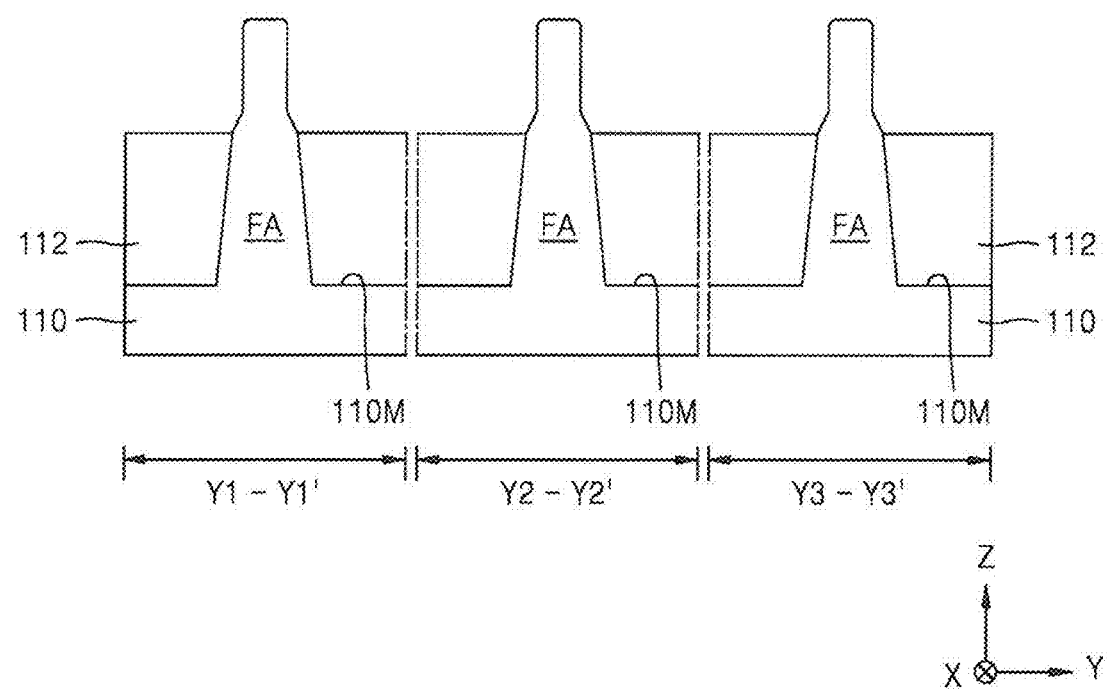

Referring to FIGS. 6A and 6B, the fin-type active area FA protruding upwards (e.g., the Z direction) from the main surface 110M of the substrate 110 and extending in the direction (e.g., the X direction) may be formed by etching a portion of the substrate 110.

In some embodiments, the substrate 110 may have a metal oxide semiconductor (MOS) area. For example, the substrate 110 may have a PMOS area or an NMOS area.

In some embodiments, a portion of the substrate 110, which is illustrated in FIGS. 6A and 6B, may be an area for forming any one of a PHOS transistor and an NMOS transistor. The fin-type active area FA may include P-type or N-type impurity diffusion areas (not shown) according to the channel type of the MOS transistor to be formed on the fin-type active area FA.

After an insulating layer covering the fin-type active area FA is formed on the substrate 110, the insulating layer may be etched back to form the device isolation layer 112. As a result, the fin-type active area FA may protrude upwards from an upper surface of the device isolation layer 112 and be exposed.

Figure 7B:
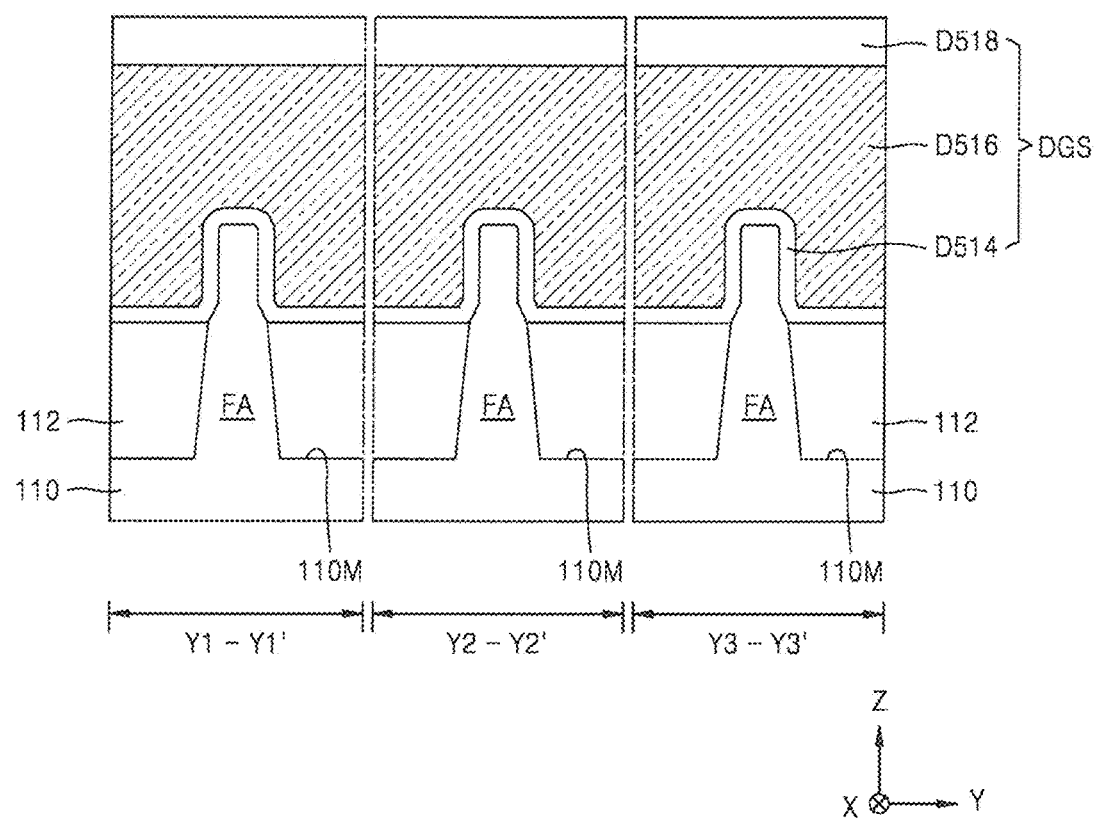

Referring to FIGS. 7A and 7B, a plurality of dummy gate structures DGS extending on the fin-type active area FA in a direction that crosses the fin-type active area FA may be formed.

Each of the plurality of dummy gate structures DGS may include a dummy gate dielectric layer D514, a dummy gate, line D516, and a dummy gate capping layer D518 sequentially stacked on the fin-type active area FA. In some embodiments, the dummy gate dielectric layer D514 may include silicon oxide. The dummy gate line D516 may include polysilicon. The dummy gate capping layer D518 may include at least one of silicon oxide, silicon nitride, and silicon oxynitride.

Then, the gate insulating spacer 124 may be formed at both side walls of the dummy gate structure DOS, An ALD or a CVD process may be used to form the gate insulating spacer 124.

Thereafter, the source/drain 130 may be formed by forming a semiconductor layer on the fin-type active area FA exposed at both sides of the dummy gate structure DGS via an epitaxial growing process. The source/drain area 130 may have a higher upper surface than the fin-type active area FA. The source/drain area 130 may have a section that is taken along a Y-Z plane, which has a shape of a polygon, such as a quadrangle, a pentagon, a hexagon, etc., a circle, or an oval. The source/drain area 130 may include a semiconductor layer doped with impurities. In some embodiments, the source/drain area 130 may include Si, SiGe, and/or SIC doped with impurities.

Thereafter, the inter-gate insulating layer 132 covering the source/drain area 130, the plurality of dummy gate structures DGS, and the gate insulating spacer 124 may be formed.

In some embodiments, in order to form the inter-gate insulating layer 132, an insulating layer covering the source/drain area 130, the plurality of dummy gate structures DGS, and the gate insulating spacer 124 by a sufficient thickness may be formed. Thereafter, the inter-gate insulating layer 132 having a planarized upper surface may be formed by planarizing the above insulating layer to expose an upper surface of the dummy gate capping layer D518 of each of the plurality of dummy gate structures DGS.

Figure 8:
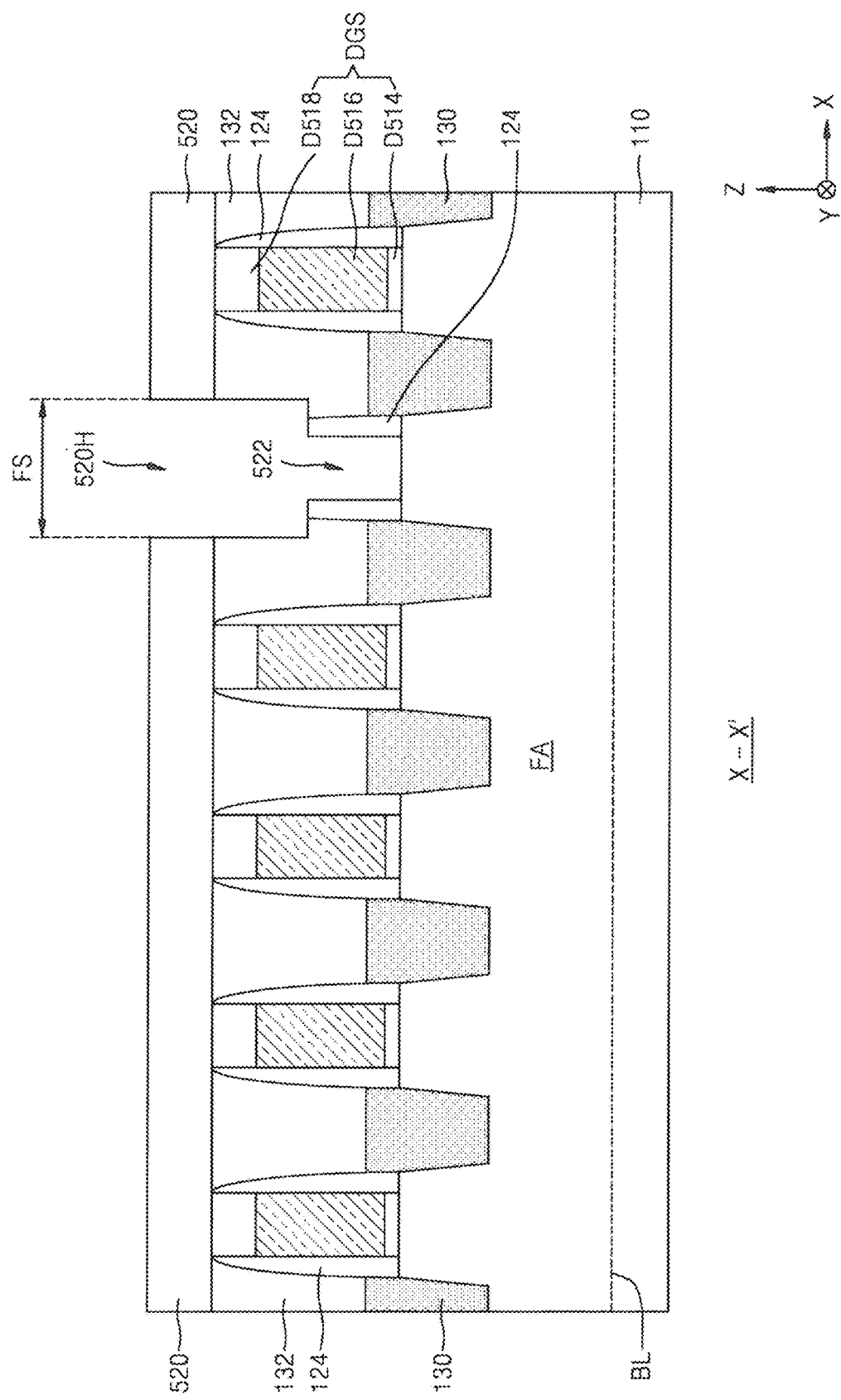

Referring to FIG. 8, a mask pattern 520 may be formed on the inter-gate insulating layer 132. The mask pattern 520 may have an opening 520H exposing the dummy gate structure DGS and a portion of the inter-gate insulating layer 132 around the dummy gate structure DGS, in the fin separating area FS. Then, the mask pattern 520 may be used as an etch mask to remove the portion of the inter-gate insulating layer 132 and the dummy gate structure DGS exposed via the opening 520H, in order to form a separating space 522 exposing the fin-type active area FA via the opening 520H.

While the separating space 522 is formed, a portion of the gate insulating spacer 124 in the tin separating area FS may be consumed so that a height of the gate insulating spacer 124 may be reduced.

Figure 9:
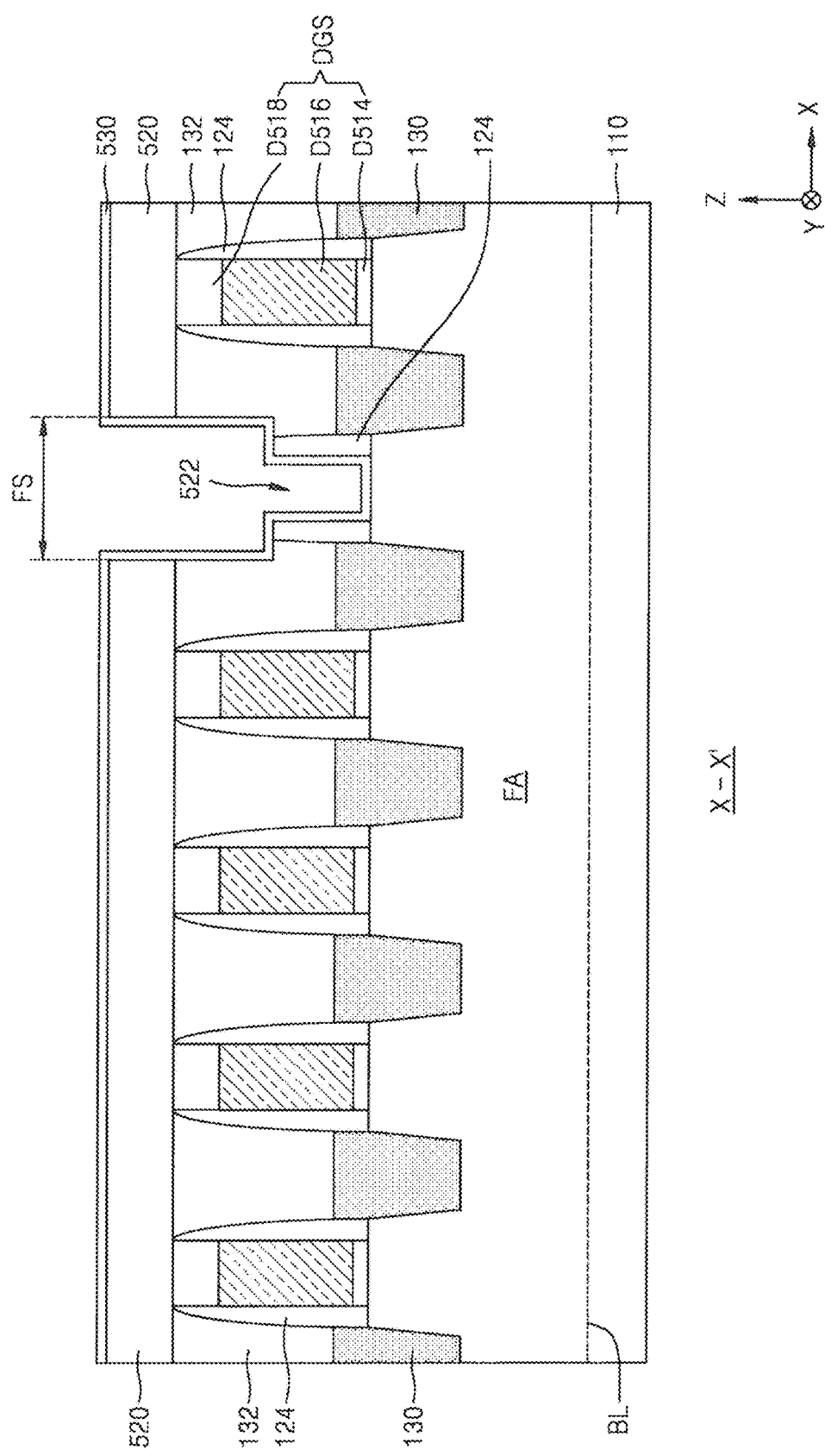

Referring to FIG. 9, an insulating liner 530 may be formed on the surface of the mask pattern 520 and the formed separating space 522, in order to cover the gate insulating spacer 124 and the inter-gate insulating layer 132 exposed in the separating space 522.

The insulating liner 530 may include an oxide layer, a nitride layer, an oxynitride layer, or a combination thereof.

Figure 10:
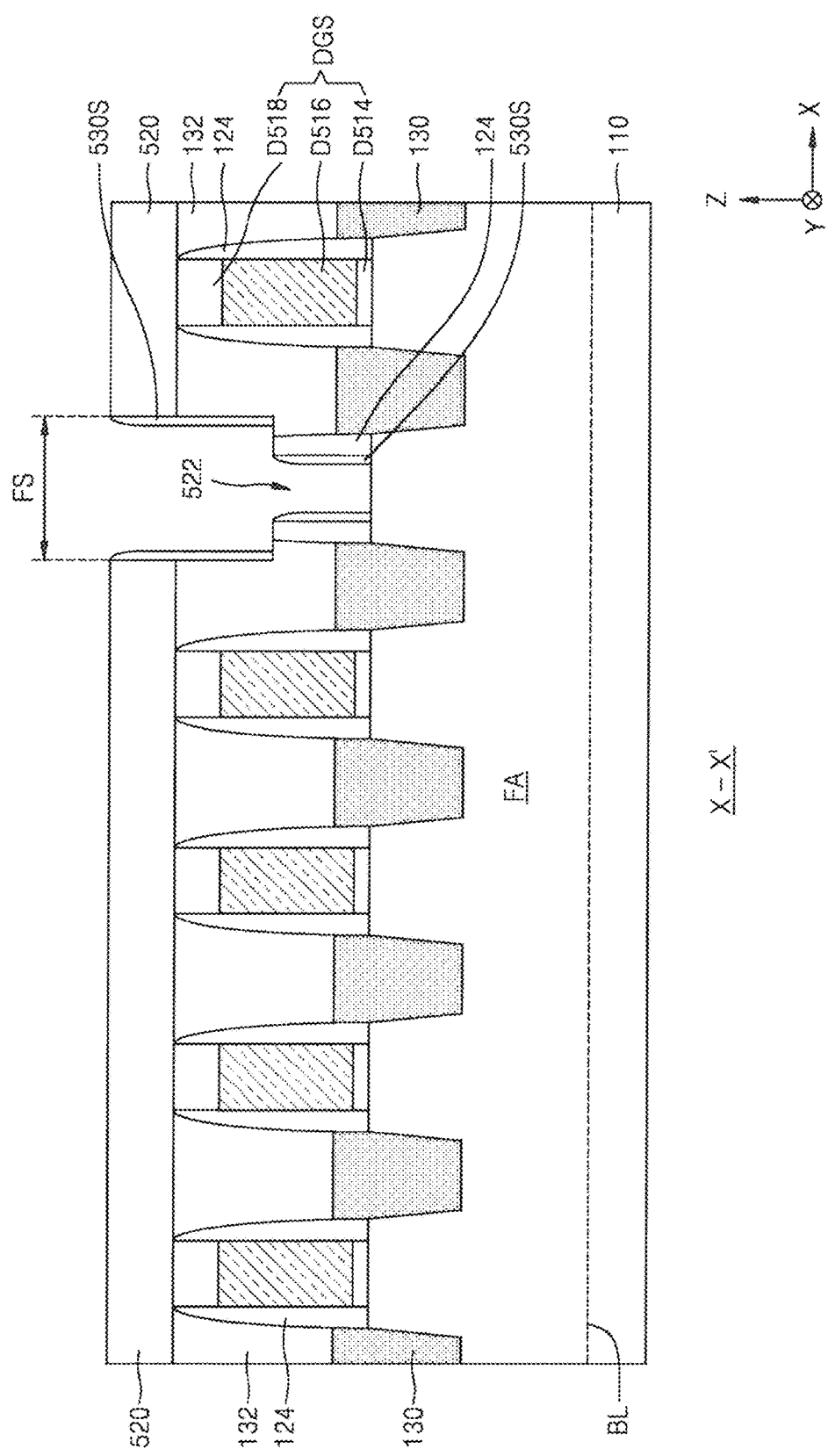

Referring to FIG. 10, the insulating liner 530 (refer to FIG. 9) may be etched back so that an insulating spacer 530S remains at each of a side wall of the gate insulating spacer 124 and a side wall of the inter-gate insulating layer 132 in the separating space 522.

After the insulating spacer 530S is formed, the fin-type active area FA may be exposed in the separating space 522.

Figure 11:
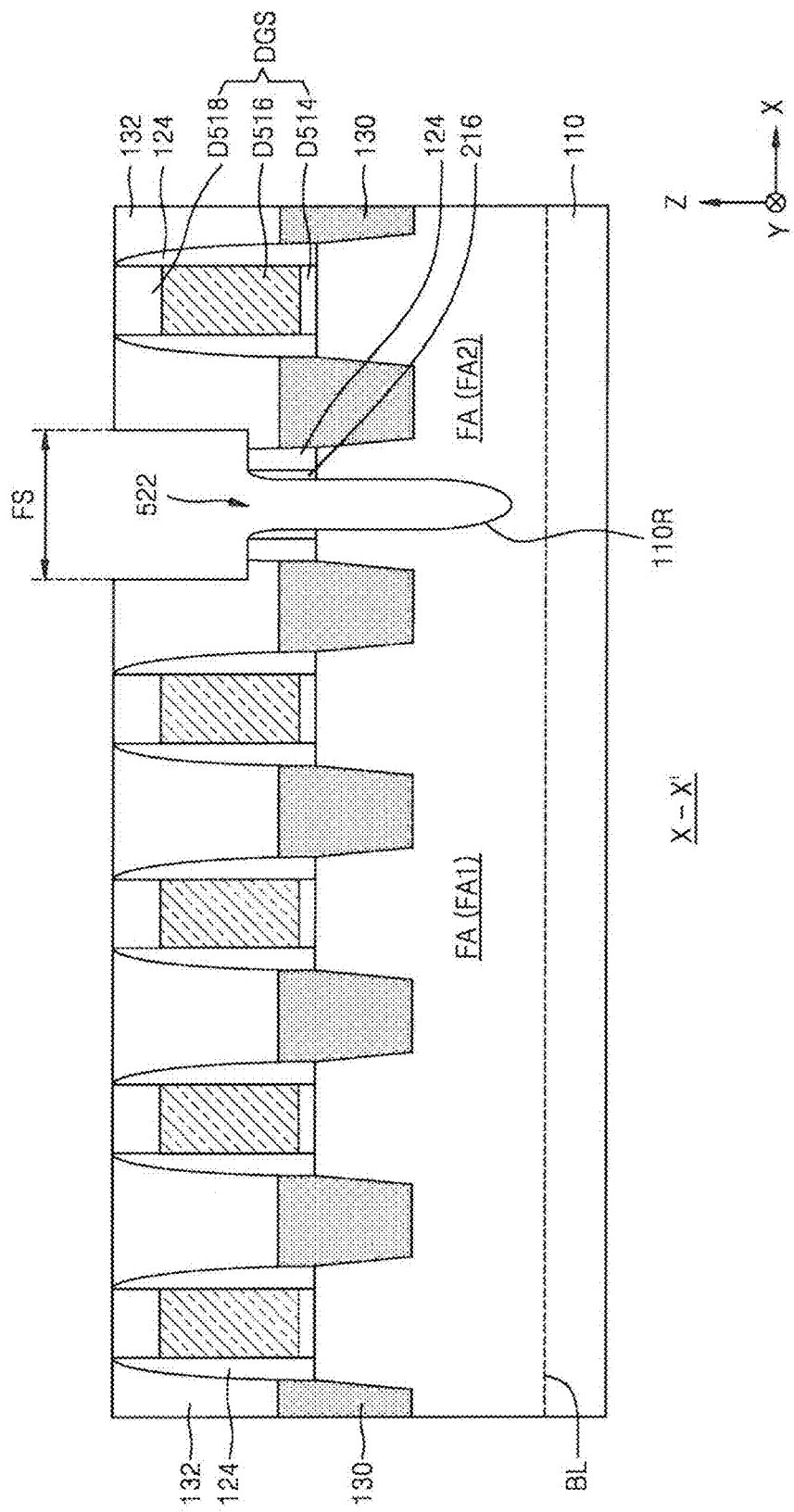

Referring to FIG. 11, in the resultant structure of FIG. 10, the fin-type active area PA exposed in the separating space 522 may be etched by using the mask pattern 520, the insulating spacer 530S, the gate insulating spacer 124, and the inter-gate insulating layer 132 as an etch mask to form the fin separating recess 110R.

While the fin separating recess 110R is formed, a height of the gate insulating spacer 124 may be reduced, and the insulating spacer 530S covering the side wall of the inter-gate insulating layer 132 may be consumed. Also, a height of the insulating spacer 530S covering the side wall of the gate insulating spacer 124 may be reduced. A portion of the insulating spacer 530S, which covers the side wall of the gate insulating spacer 124 in the separating space 522 may remain as the insulating spacer 216 described with reference to FIGS. 3A through 3C.

As the fin separating recess 110R is formed in the fin-type active area FA, the fin-type active area FA may be divided into the first fin portion FA1 and the second fin portion FA2 located at both sides of the fin separating recess 110R.

The mask pattern 520 remaining after the fin separating recess 110R is formed may be removed to expose the upper surface of the dummy gate capping layer D518 of each of the plurality of dummy gate structures DGS and the upper surface of the inter-gate insulating layer 132.

Figure 12:
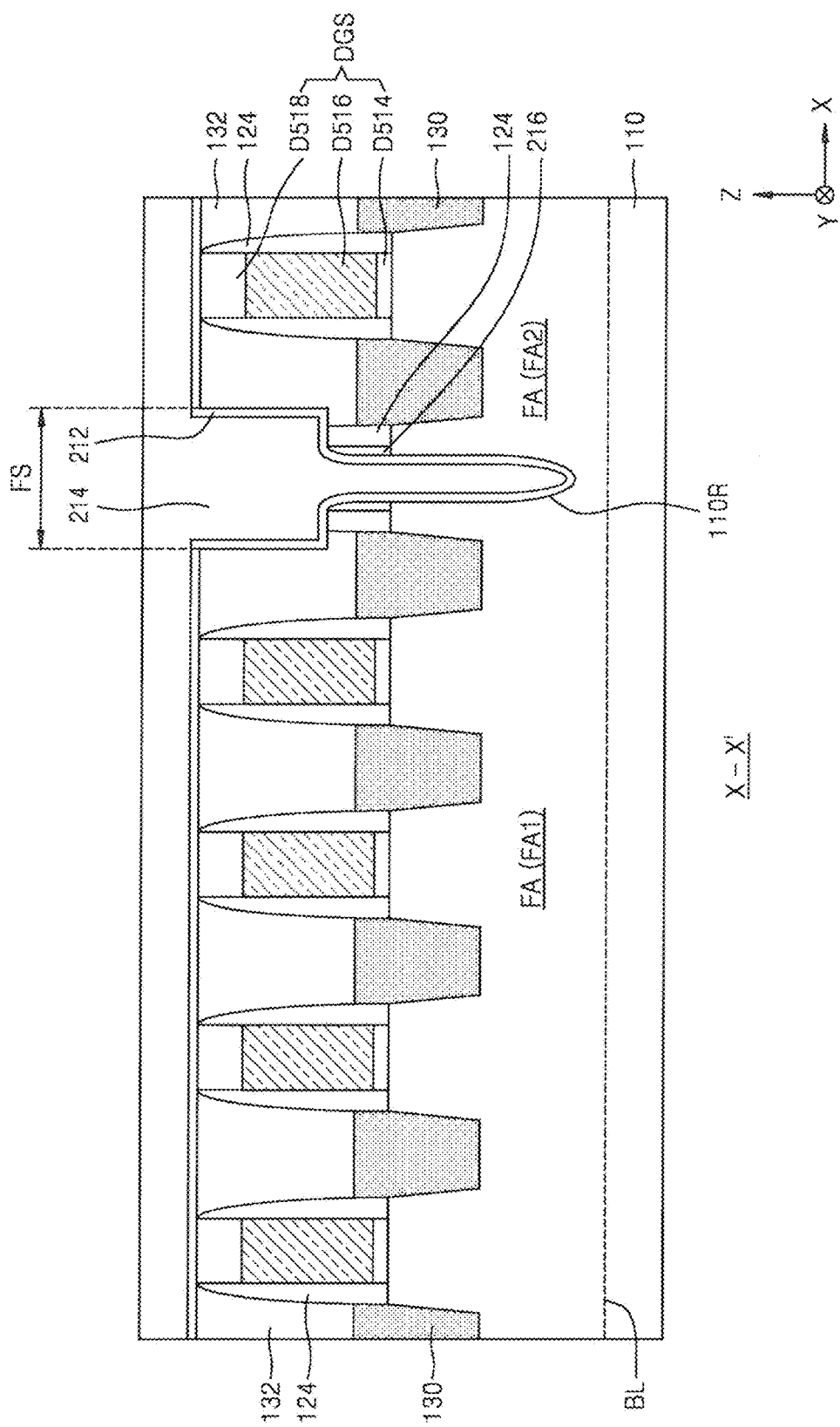

Referring to FIG. 12, the insulating liner 212 covering an inner wall of the fin separating recess 110R, and the burying insulating layer 214 filling the fin separating recess 110R on the insulating liner 212 may be formed on the entire surface of the resultant structure of FIG. 11.

Figure 13:
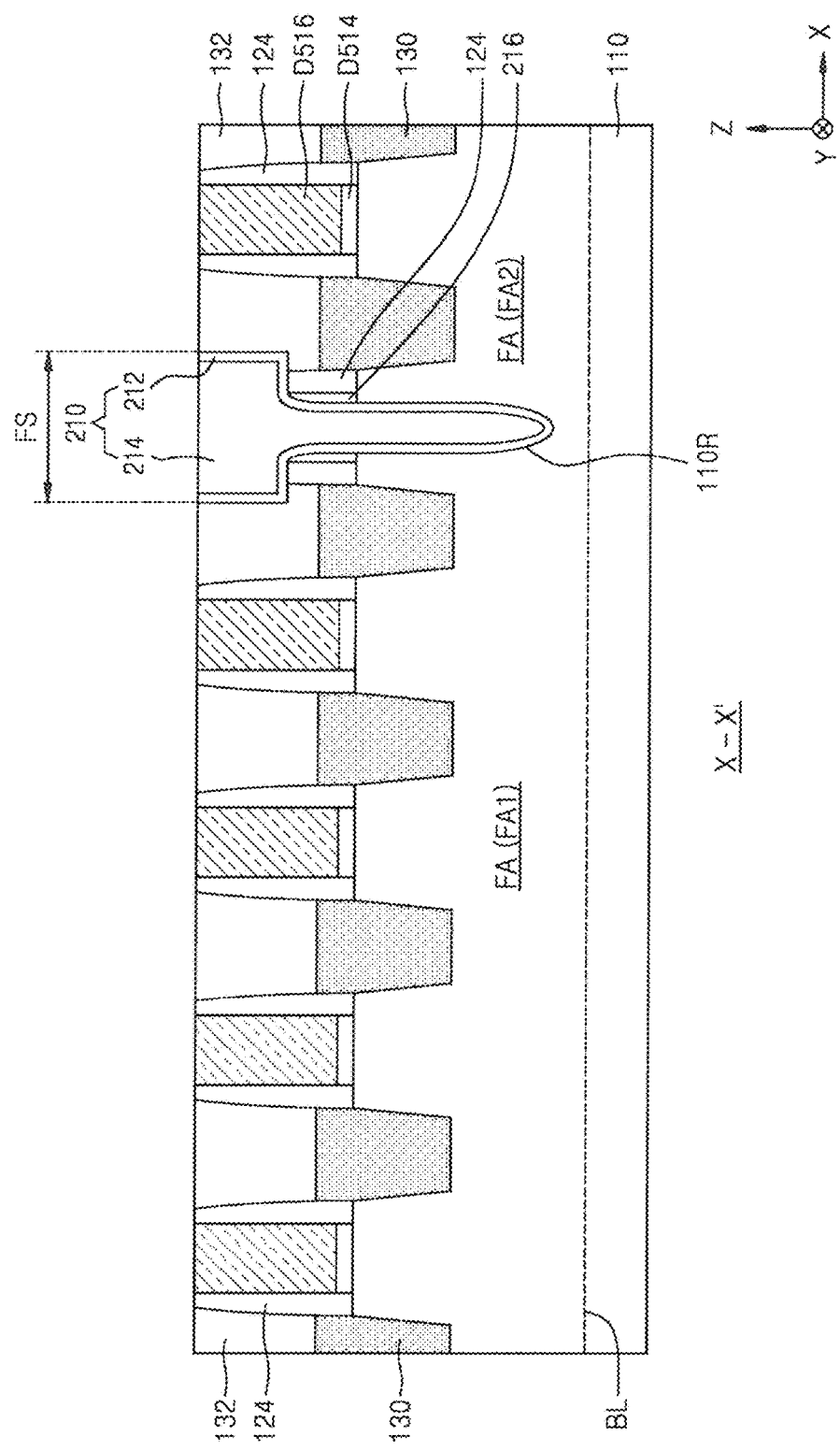

Referring to FIG. 13, a portion of the insulating liner 212, a portion of the burying insulating layer 214, and the plurality of dummy gate capping layers D518 included in the plurality of dummy gate structures DGS may be removed and the resultant structure that is obtained thereafter may be planarized to expose the plurality of dummy gate lines D516 and planarize the upper surface of the inter-gate insulating layer 132.

As a result, the fin separating insulating layer 210 including the insulating liner 212 and the burying insulating layer 214 may remain in the fin separating area FS. While the upper surface of the inter-gate insulating layer 132 is planarized, a height of the gate insulating spacer 124 adjacent respective ones of the dummy gate lines D516 may decrease.

Figure 14A:
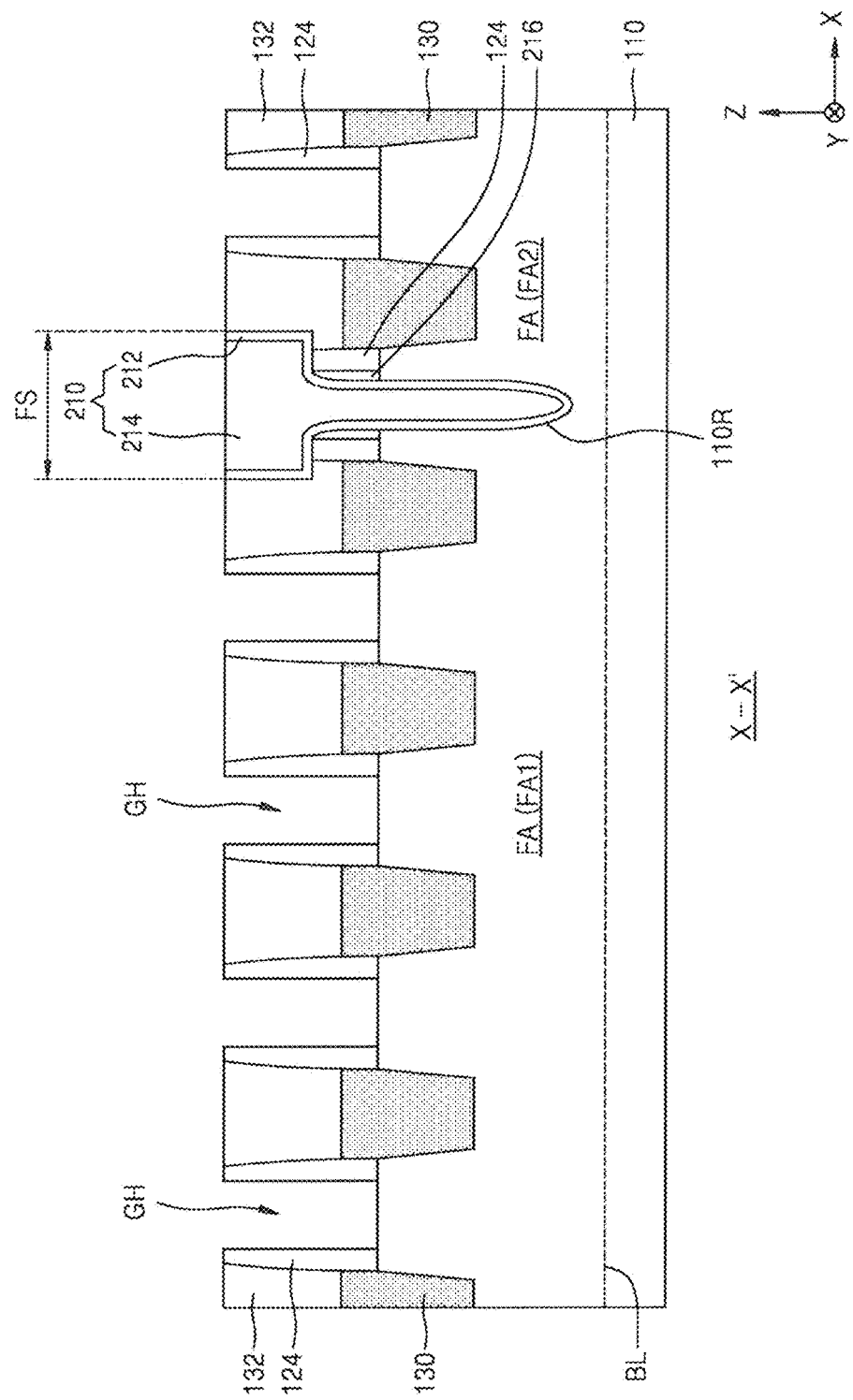
Figure 14B:
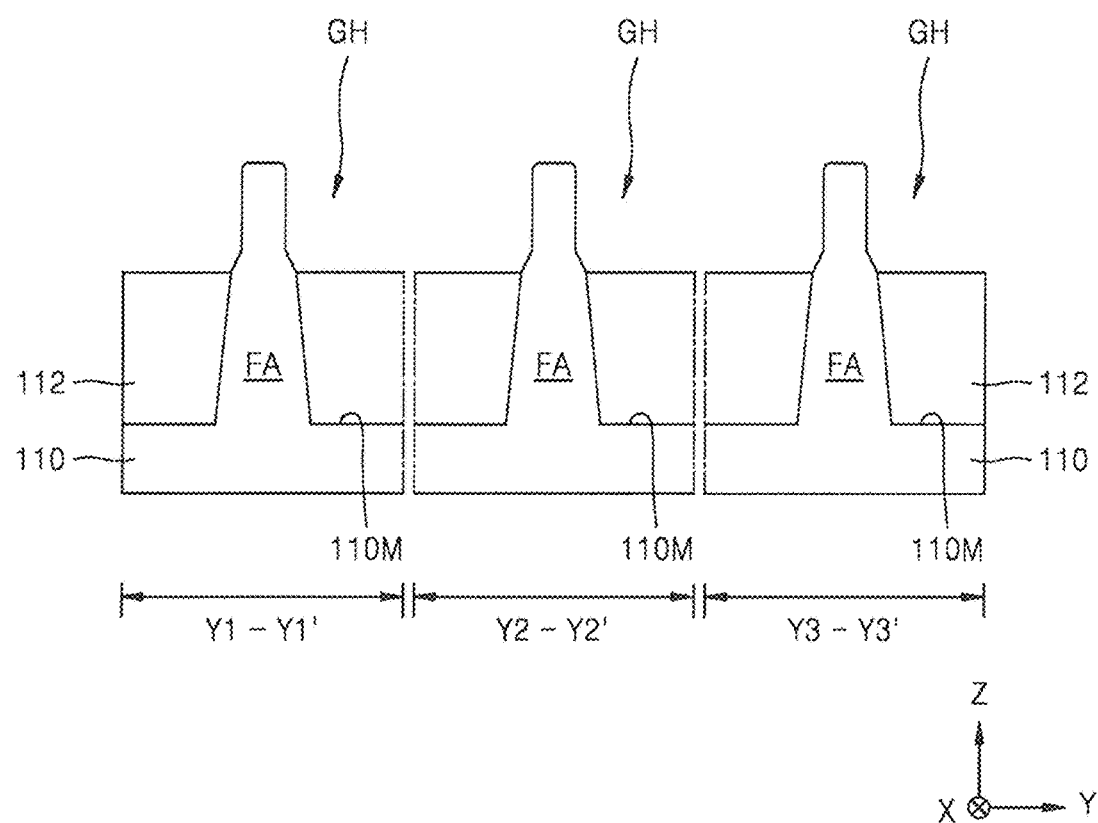

Referring to FIGS. 14A and 14B, the plurality of dummy gate structures DOS may be removed from the resultant structure of FIG. 13, to form a plurality of gate spaces GH.

The gate insulating spacer 124, the fin-type active area FA, and the device isolation layer 112 may be exposed through the plurality of gate spaces GH.

A wet etching process may be used to remove the plurality of dummy gate structures DGS. To perform the wet etching, for example, nitride acid (HNO₃), diluted fluoride acid (DHF), NH₄OH, tetramethyl ammonium hydroxide (TMAH), potassium hydroxide (KOH), or a combination thereof may be used as an etchant. However, the etchant is not limited thereto.

Figure 15A:
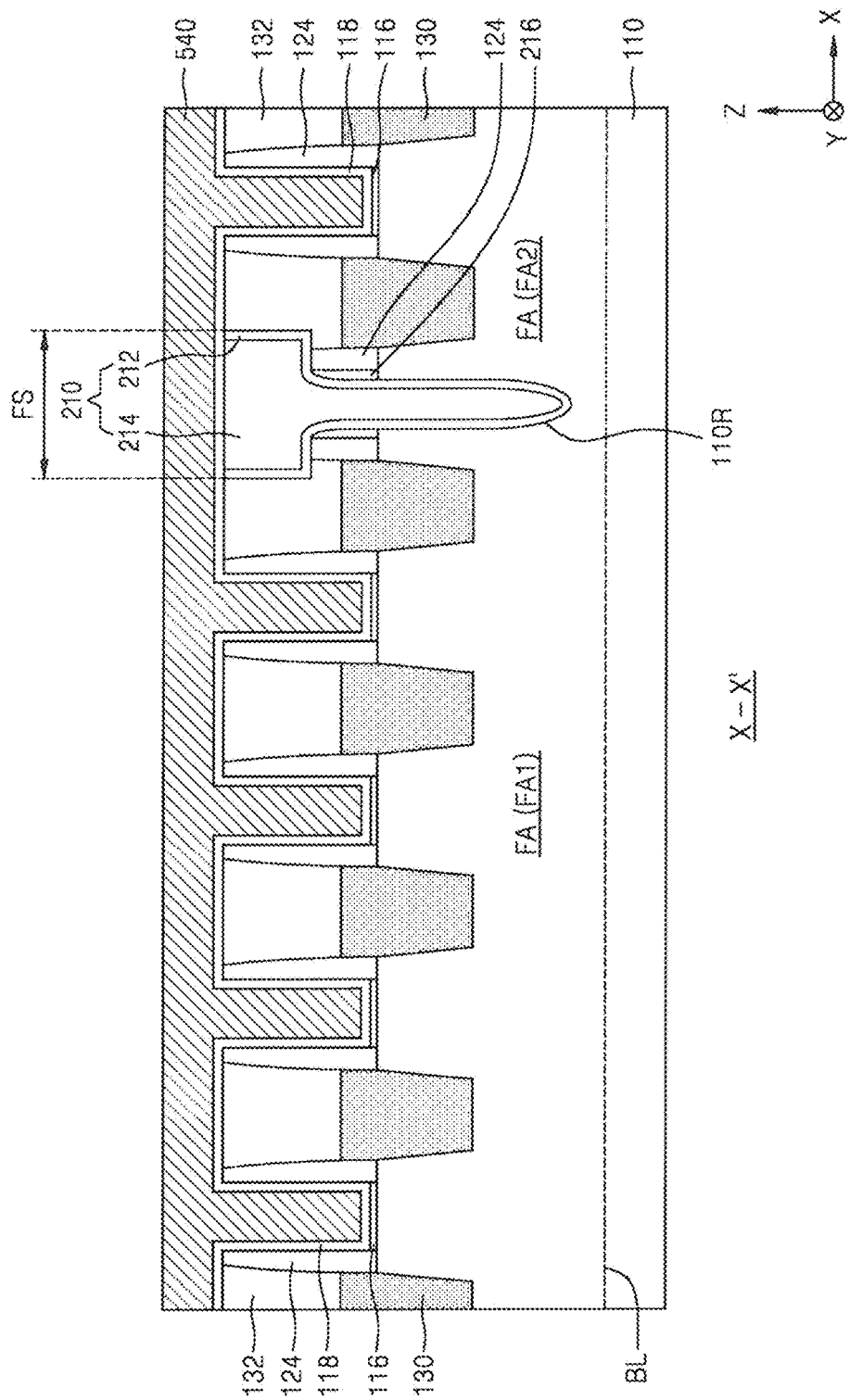
Figure 15B:
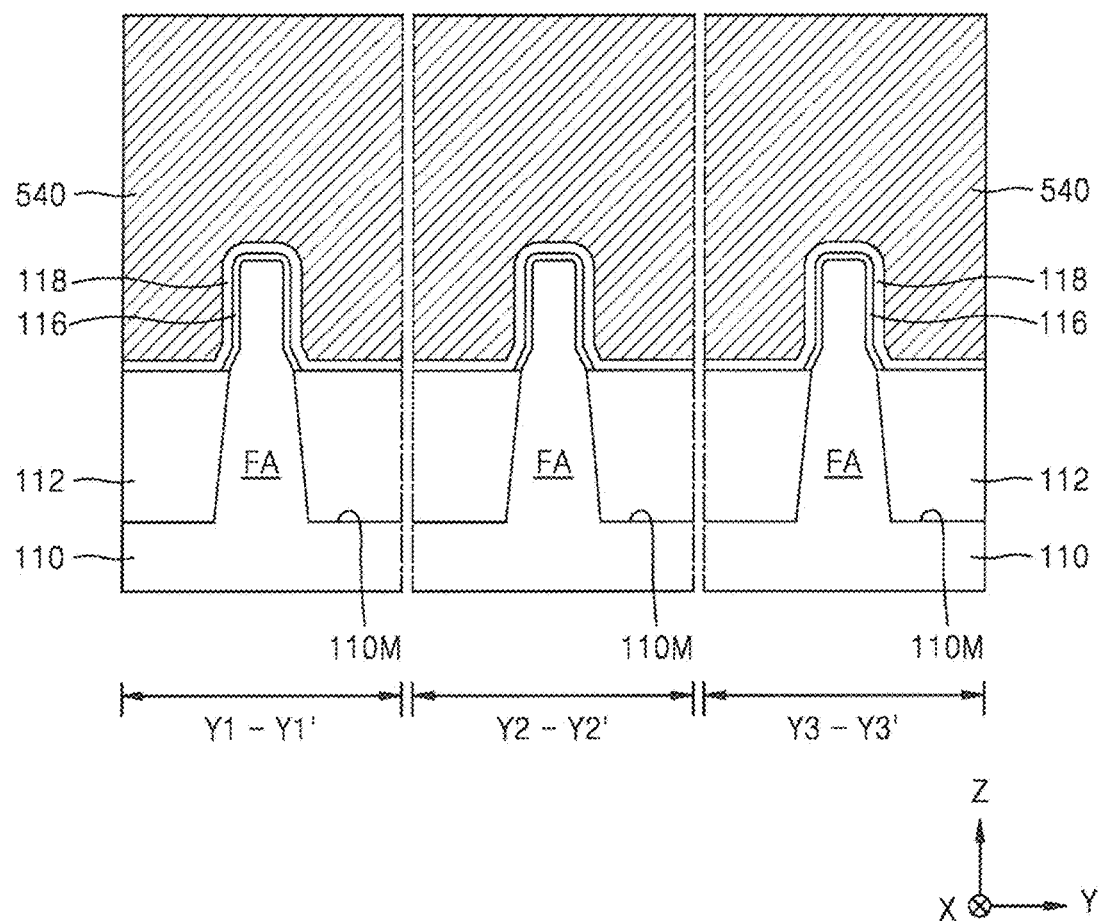

Referring to FIGS. 15A and 15B, the plurality of interfacial layers 116, the gate dielectric layer 118, and a gate line 540 may be sequentially formed to fill each of the plurality of gate spaces GH (refer to FIGS. 14A and 14B).

The process of forming the plurality of interfacial layers 116 may include oxidizing a portion the fin-type active area FA which is exposed in the plurality of gate spaces GH.

The gate dielectric layer 118 and the gate line 540 may be formed to fill the plurality of gate spaces GH and cover the upper surface of the inter-gate, insulating layer 132.

The gate line 540 may include a conductive structure of a single layer or multiple layers including a metal layer or a metal containing layer. In some embodiments, the gate line 540 may have the structures of the gate lines GL11, GL12, GL21, GL22, GL31, GL32, GL41, GL42, GL51, GL52, GL61, GL62, GL33, and GL34 described with reference to FIGS. 2A through 2G, and may have structures of various multiple layers modified or changed from the gate lines GL11, GL12, GL21, GL22, GL31, GL32, GL41, GL42, GL51, GL52, GL61, GL62, GL33, and GL34 within the technical scope of the present inventive concept. The gate line 540 may be formed by an ALD, an MOALD, or an MOCVD process. However, it is not limited thereto.

Figure 16A:
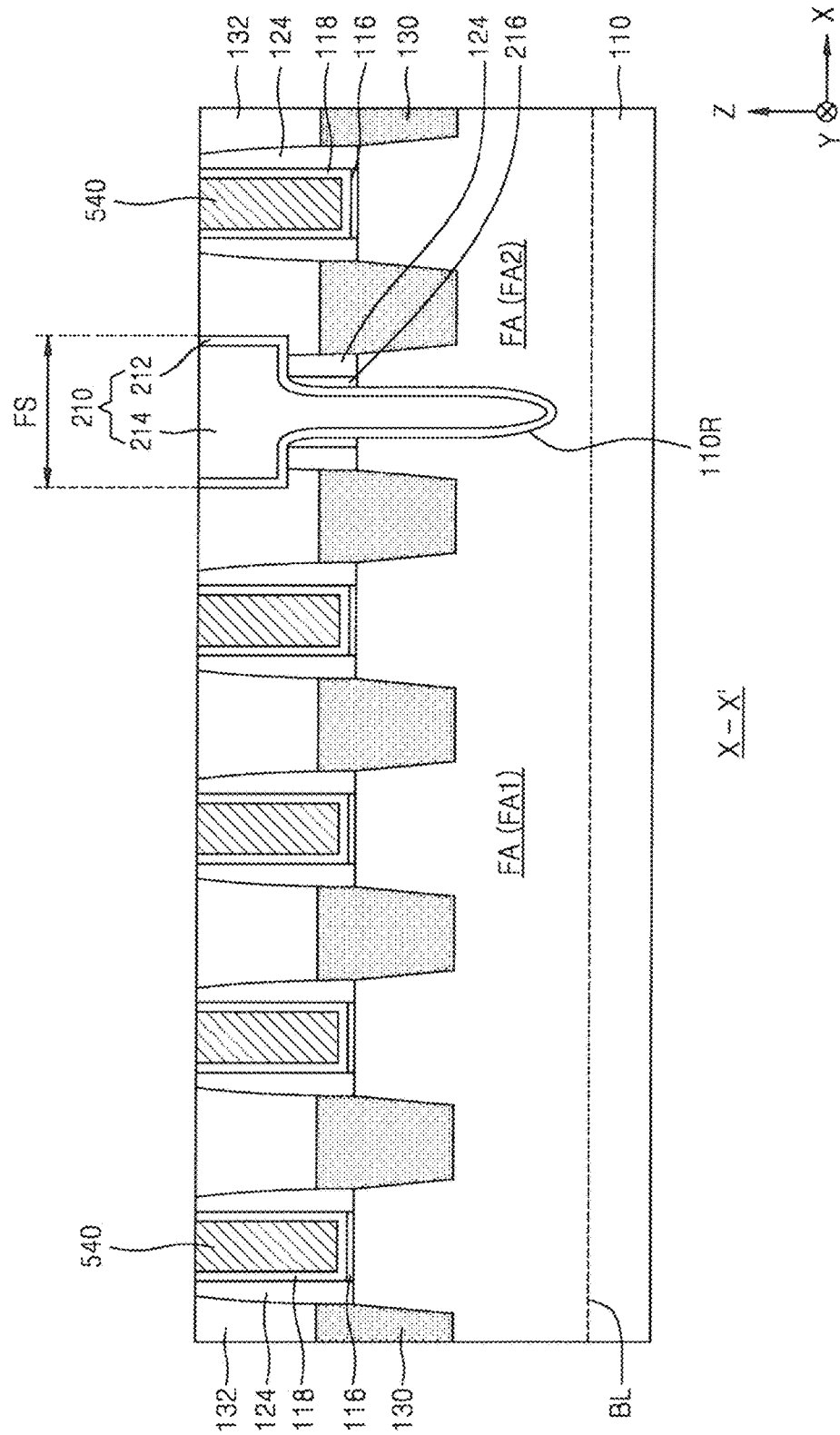
Figure 16B:
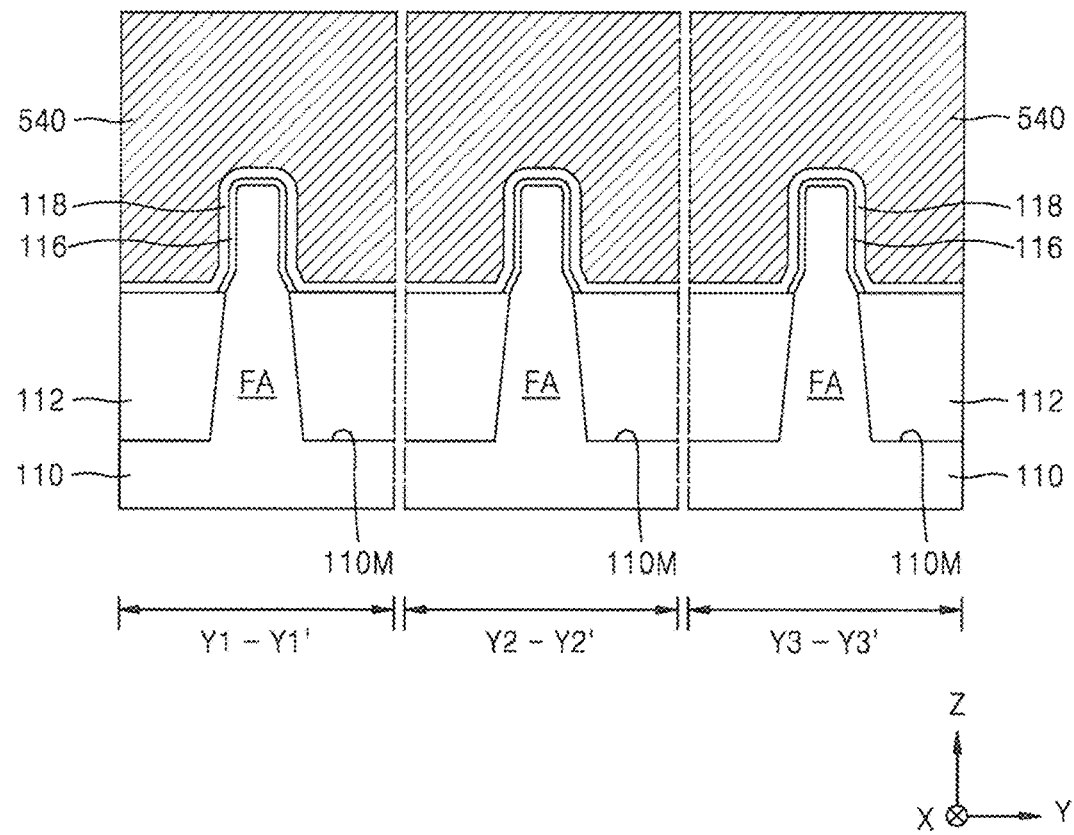

Referring to FIGS. 16A and 16B, unnecessary portions may be removed from the resultant structure of FIGS. 15A and 15B via a planarization process, and the gate line 540 and the gate dielectric layer 118 may be divided into the plurality of gate lines 540 and the plurality of gate dielectric layers 118, respectively, which remain in the plurality of gate spaces OH (refer to FIGS. 14A and 14B).

In some embodiments, as a result of the planarization process, a certain thickness of an upper surface of each of the gate insulating spacer 124 and the inter-gate insulating layer 132 may be removed.

Figure 17A:
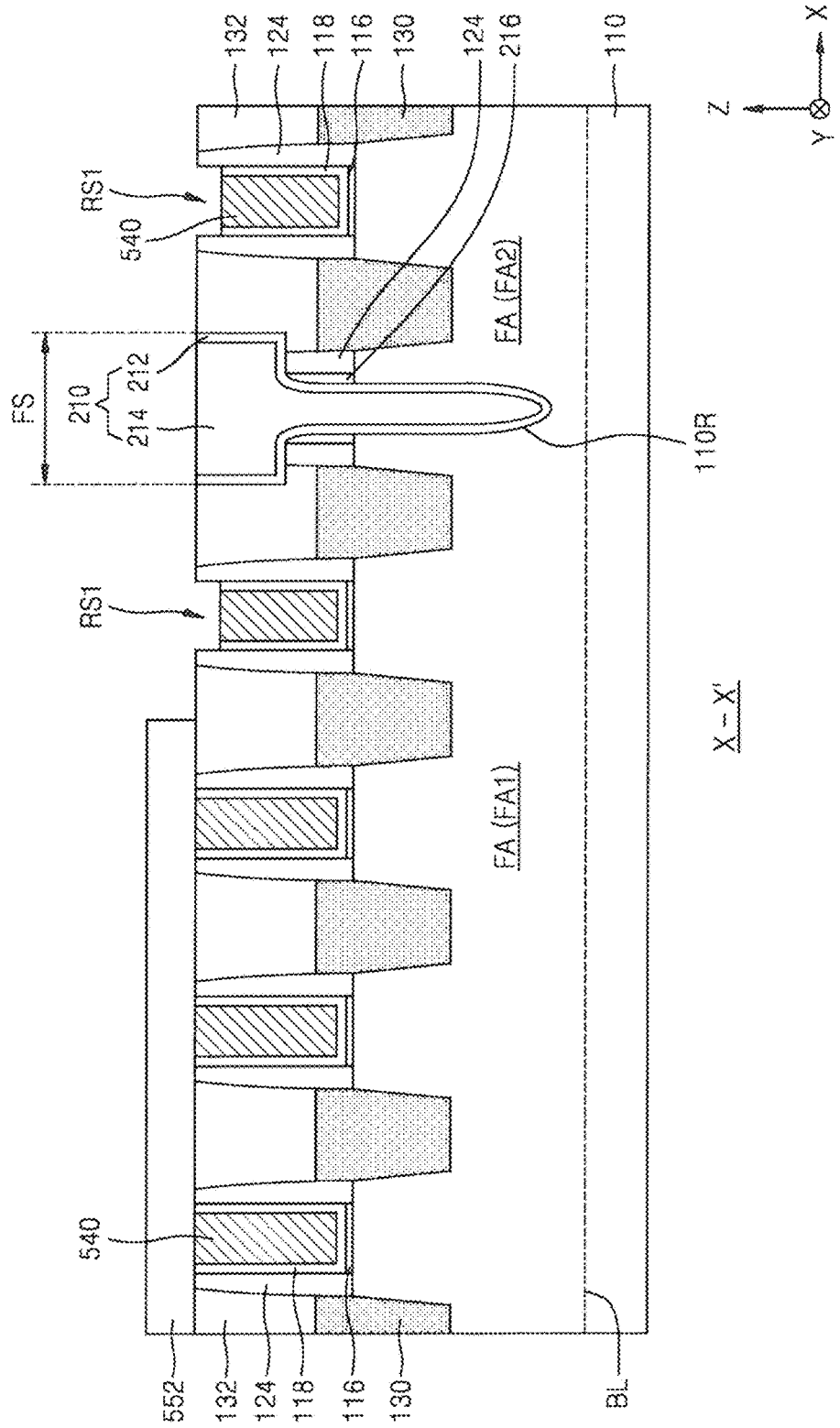
Figure 17B:
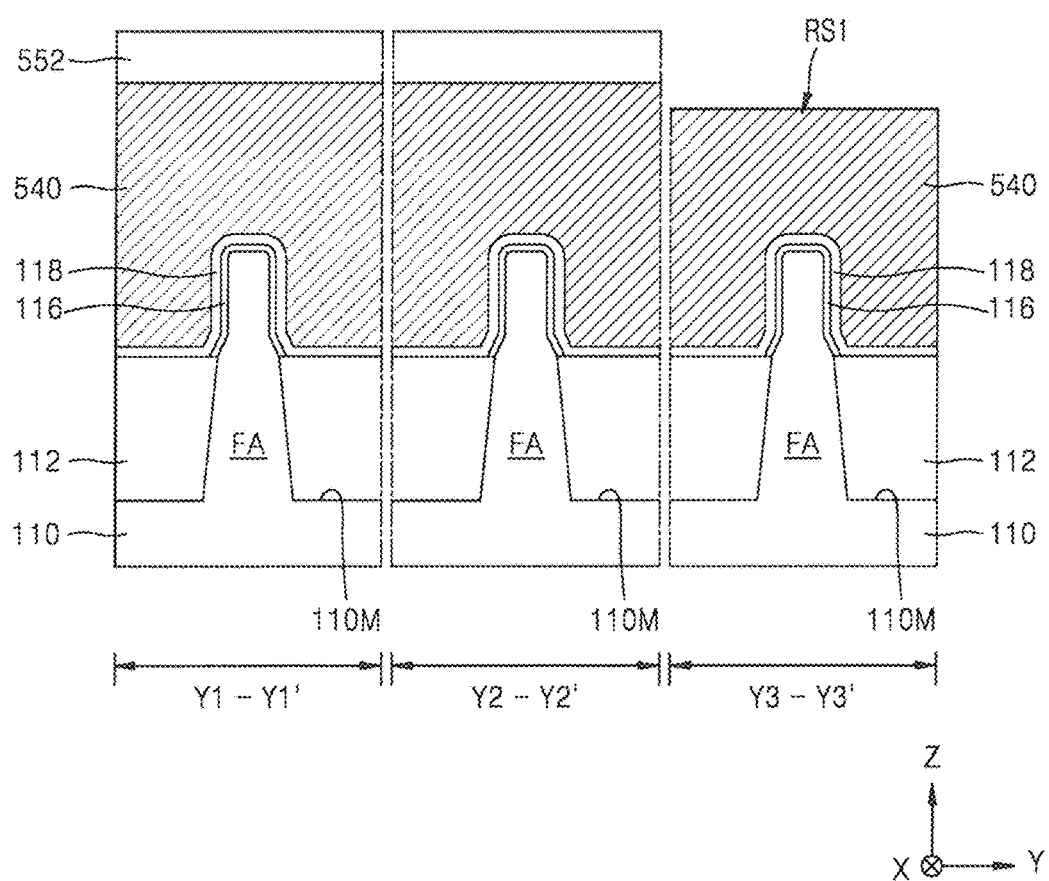

Referring to FIGS. 17A and 17B, a first recess mask pattern 552 exposing some of the plurality of gate lines 540 may be formed on a portion of the resultant structure of FIGS. 16A and 16B.

Thereafter, a certain thickness of the gate lines 540 from among the plurality of gate lines 540, which are not covered by the first recess mask pattern 552, may be removed, in order to form a first recess space RS1.

When the certain thickness of the gate lines 540 is removed, the gate dielectric layer 118 exposed in the first recess space RS1 may also be removed so that a portion of the gate insulating spacer 124 may be exposed in the first recess space RS1. However, the present inventive concepts are not limited thereto. For example, when the gate lines 540 are removed, at least a portion of the gate dielectric layer 118 exposed in the first recess space RS1 may not be removed, and may remain to cover a side wall of the gate insulating spacer 124.

The first recess mask pattern 552 may be formed to expose the gate lines 540 from among the plurality of gate lines 540, which are adjacent to the fin separating insulating layer 210 at both sides of the fin separating insulating layer 210. Accordingly, the first recess space RS1 may be formed on each of the gate lines 540 adjacent to the fin separating insulating layer 210 at both sides of the fin separating insulating layer 210.

The first recess mask pattern 552 may include a material having an etch selectivity with respect to the plurality of gate lines 540 and the gate dielectric layer 118. In some embodiments, the first recess mask pattern 552 may include a photoresist pattern, an oxide layer, a nitride layer, or a combination thereof.

Figure 18A:
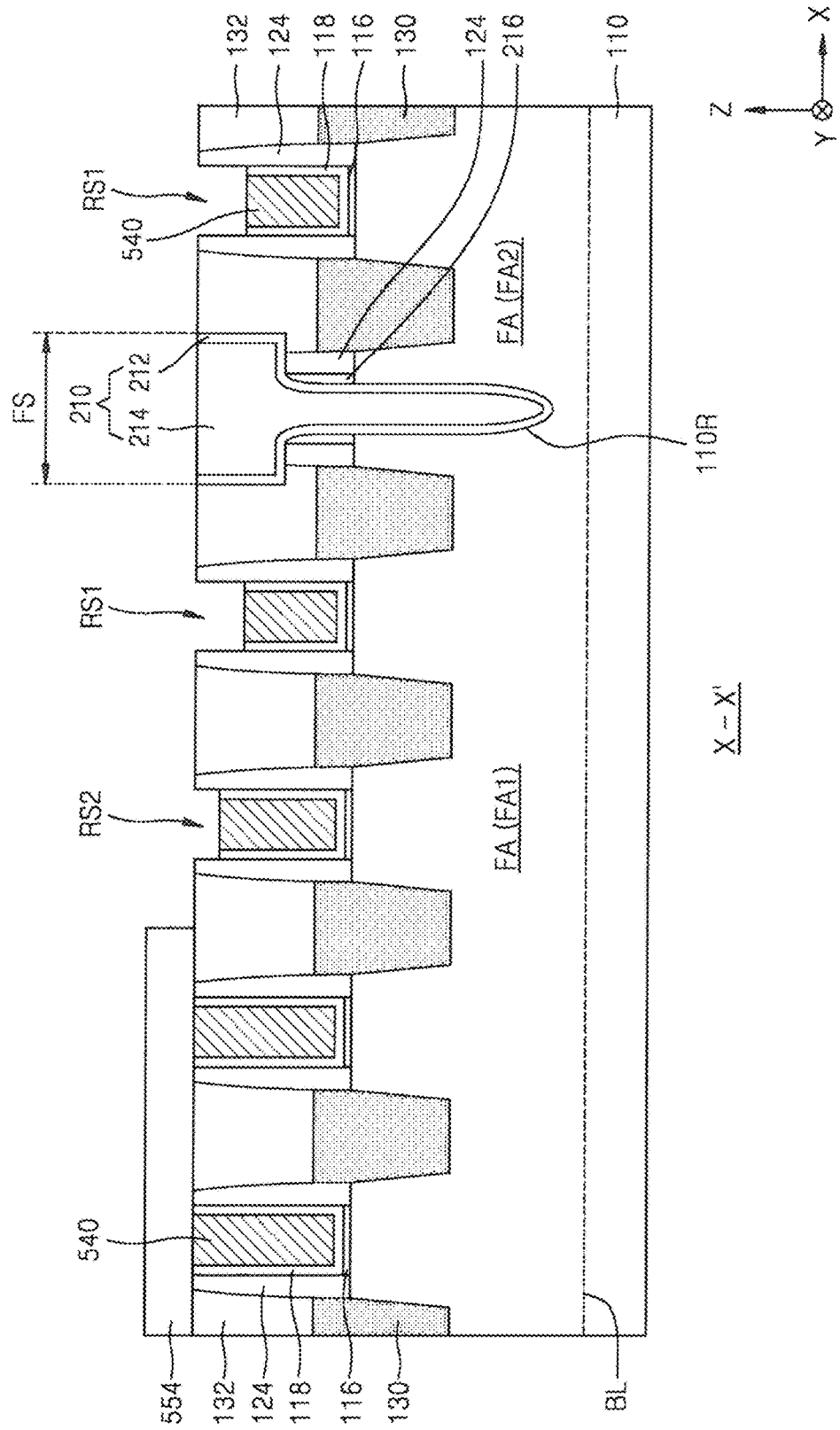
Figure 18B:
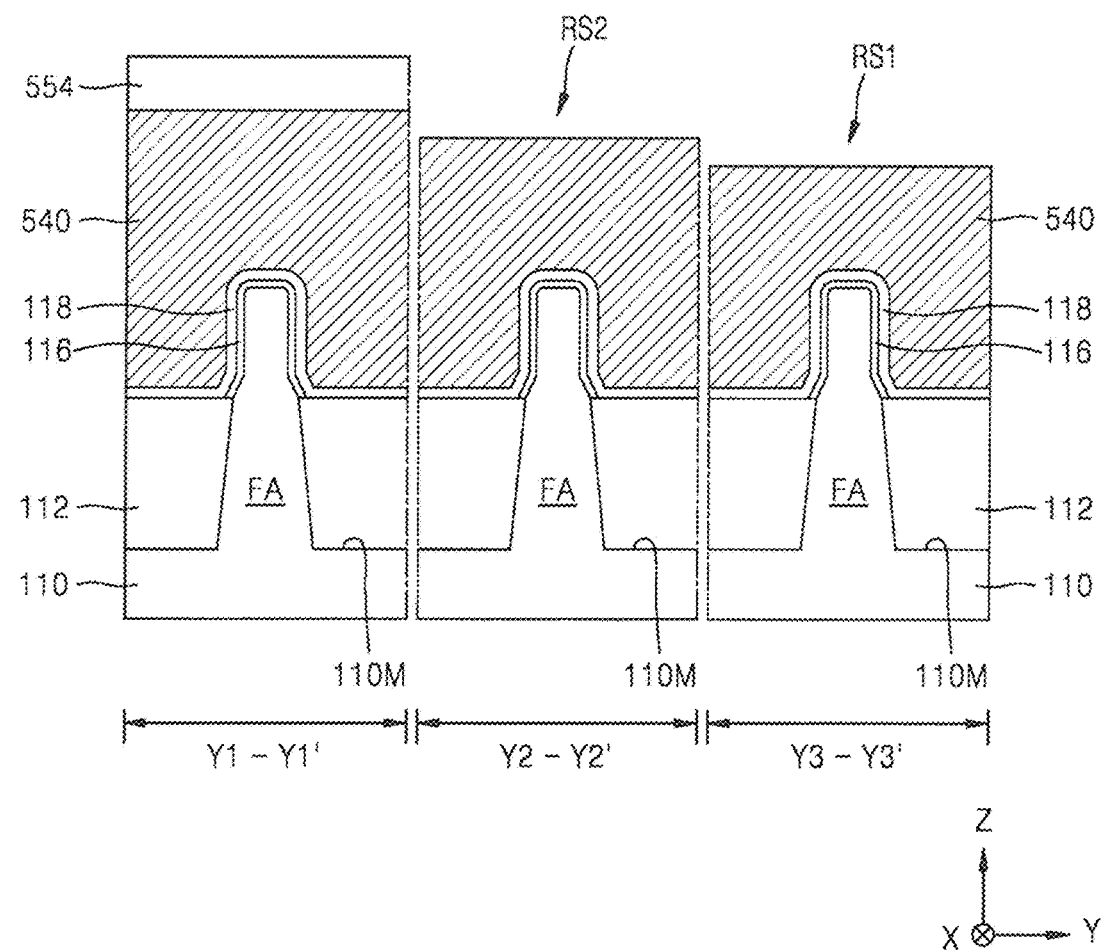

Referring to FIGS. 18A and 18B, after the first recess mask pattern 552 may be removed from the resultant structure of FIGS. 17A and 17B, a second recess mask pattern 554 exposing some of the plurality of gate lines 540 may be formed, and a certain thickness of the gate lines 540 from among the plurality of gate lines 540, which are not covered by the second recess mask pattern 554, may be removed in order to increase a depth of the first recess space RS1 in some of the plurality of gate lines 540, and to form a second recess space RS2 in other gate lines 540, which are not covered by the second recess mask pattern 554.

A depth of the second recess space RS2 may be less than the depth of the first recess space RS1.

The second recess mask pattern 554 may include the same material as the first recess mask pattern 552 described with reference to FIGS. 17A and 17B.

In some embodiments, in order to form the second recess mask pattern 554, the first recess mask pattern 552 illustrated in FIGS. 17A and 17B may not be removed, and a resultant structure obtained by patterning the first recess mask pattern 552 may be used as the second recess mask pattern 554.

When the gate lines 540 are removed, the gate dielectric layer 118 exposed in the first recess space RS1 and the second recess space RS2 may also be removed to expose a portion of the gate insulating spacer 124 in the first recess space RS1 and the second recess space R52. However, the present inventive concepts are not limited thereto. For example, when the gate lines 540 are removed, at least a portion of the gate dielectric layer 118 exposed in the first recess space RS1 and the second recess space RS2 may not be removed, and may remain to cover the side wall of the gate insulating spacer 124.

Figure 19A:
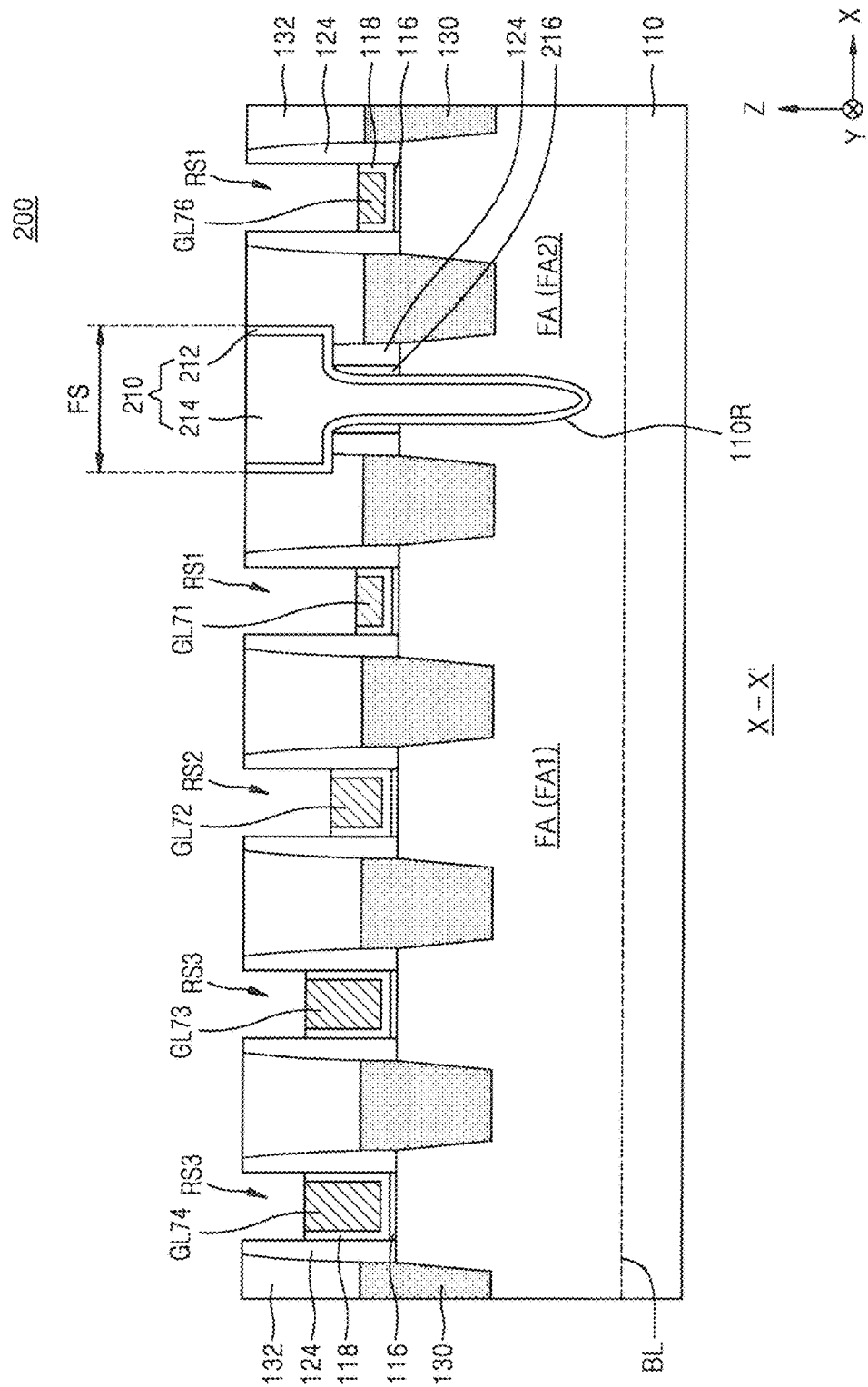
Figure 19B:
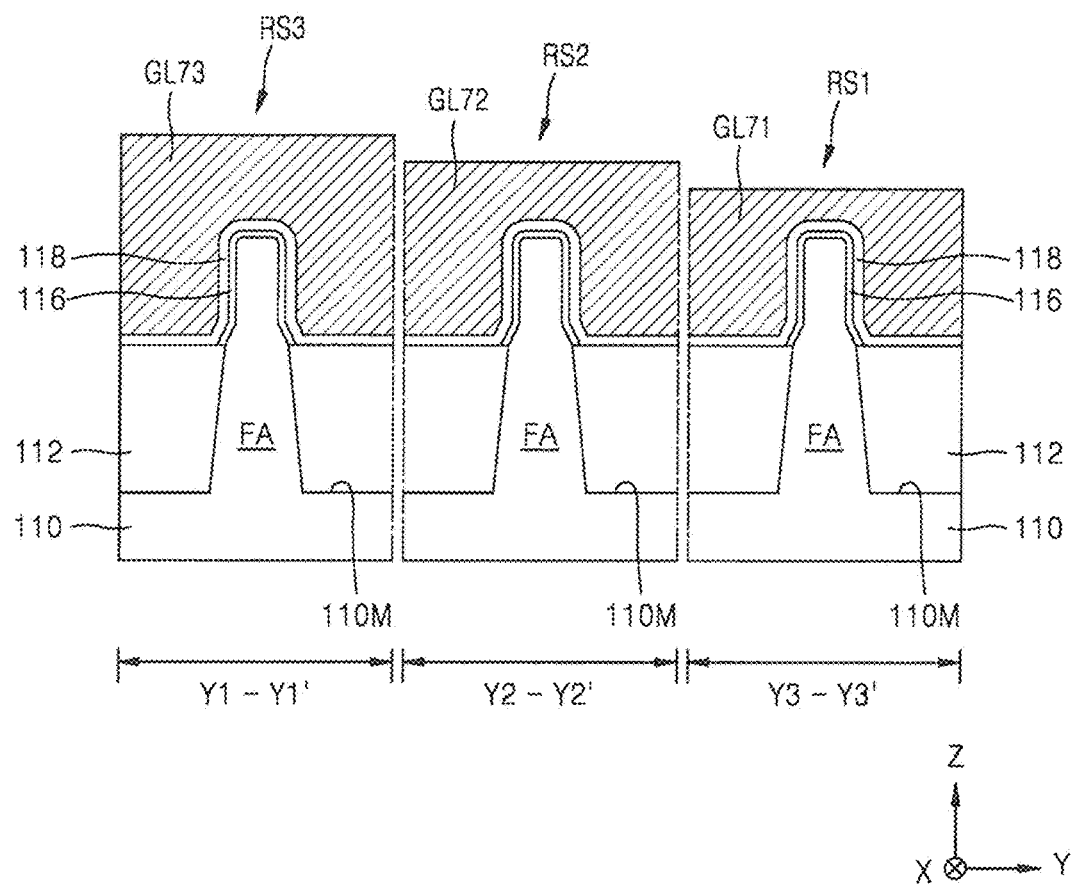

Referring to FIGS. 19A and 19B, after the second recess mask pattern 554 is removed from the resultant structure of FIGS. 18A and 18B, a certain thickness of the exposed plurality of gate lines 540 may be removed, in order to further increase the depth of the first recess space RS1 in some gate lines 540, to further increase the depth of the second recess space RS in other gate lines 540, and to form a third recess space RS3 in other gate lines 540.

As a result, the first gate lines GL71, GL72, GL73, and GL74 and the second gate GL76 including remaining portions of the gate lines 540 may remain, and the first gate lines GL71, GL73, and GL74 and the second gate line GL76 may be exposed through the first recess space RS1, the second recess space RS2, and the third recess space RS3.

A depth of the third recess space RS3 may be less than the depth of the second recess space RS2, and the depth of the second recess space RS2 may be less than the depth of the first recess space RS1.

When the certain thickness of the gate lines 540 is removed, the gate dielectric layer 118 exposed in the first recess space RS1, the second recess space RS2, and the third recess space RS3 may be removed together, and thus, a portion of the gate insulating spacer 124 may be exposed in the first recess space RS1, the second recess space RS2, and the third recess space RS3. However, the present inventive concepts are not limited thereto. For example, when the certain thickness of the gate lines 540 is removed, at least a portion of the gate dielectric layer 118 exposed in the first recess space RS1, the second recess space RS2, and the third recess space RS3 may not be removed, and may remain to cover the side wall of the gate insulating spacer 124.

In some embodiments, in order for the first gate lines GL73 and GL74 to have different heights, the processes described with reference to FIGS. 17A and 17B may be repeated by being adjusted for a desired condition. That is to say that in some embodiments, additional recess mask patterns may be used to selectively remove portions of the gate lines 540 to form the first gate lines GL73 and GL74 to have different heights.

The first gate lines GL71, GL73, and GL74, and the second gate line GL76 may have the structures of the gate lines GL11, GL12, GL22, GL31, GL32, GL41, GL42, GL51, GL52, GL61, GL62, GL33, and GL34 described with reference to FIGS. 2A through 2G, and may have various other structures modified or changed from the structures of the gate lines GL11, GL12, GL21, GL22, GL31, GL32, GL41, GL42, GL51, GL52, GL61, GL62, GL33, and GL34 within the technical scope of the present inventive concepts.

For example, in order to form the first conductive barrier layer MA31, MA61, or MA33 not contacting the first insulating capping layer CA11, and the second conductive barrier layer MA34 not contacting the second insulating capping layer CA12, as illustrated in FIGS. 2C through 2G, the process of forming the conductive structure for the gate line 540 described with reference to FIGS. 15A and 15B may include forming a conductive barrier layer entirely covering an exposed surface of the gate dielectric layer 118 and etching back the conductive barrier layer until, a resultant structure of a desired height remains. When the first metal containing layer MB31 or MB61 is formed on the first conductive barrier layer MA31, MA61, or MA33, an upper surface of the first metal containing layer MB31 or MB61 may have a recessed portion corresponding to a sectional profile of the first conductive barrier layer MA31, MA61, or MA33. A sequential metal containing layer may be formed on the first metal containing layer MB31 or MB61 having the upper surface including the recessed portion, to fill the gate space GS. As a result, the second metal containing layer MC31 or MC61 having the upper portion 31T may be obtained as illustrated in FIGS. 2C through 2G. After the conductive structure for the gate line 540 having various structures is formed by using the method described above, a series of processes described with reference to FIGS. 17A through 19B may be performed to form the first gate lines GL71, GL72, GL73, and GL74 and the second gate line GL76 having the structures of the gate lines GL11, GL12, GL21, GL22, GL31, GL32, GL41, GL42, GL51, GL52, GL61, GL62, GL33, and GL34 described with reference to FIGS. 2A through 2G, and various structures modified or changed from the structures of the gate lines GL11, GL12, GL21, GL22, GL31, GL32, GL41, GL42, GL51, GL52, GL61, GL62, GL33, and GL34 within the technical scope of the present inventive concepts.

Figure 20A:
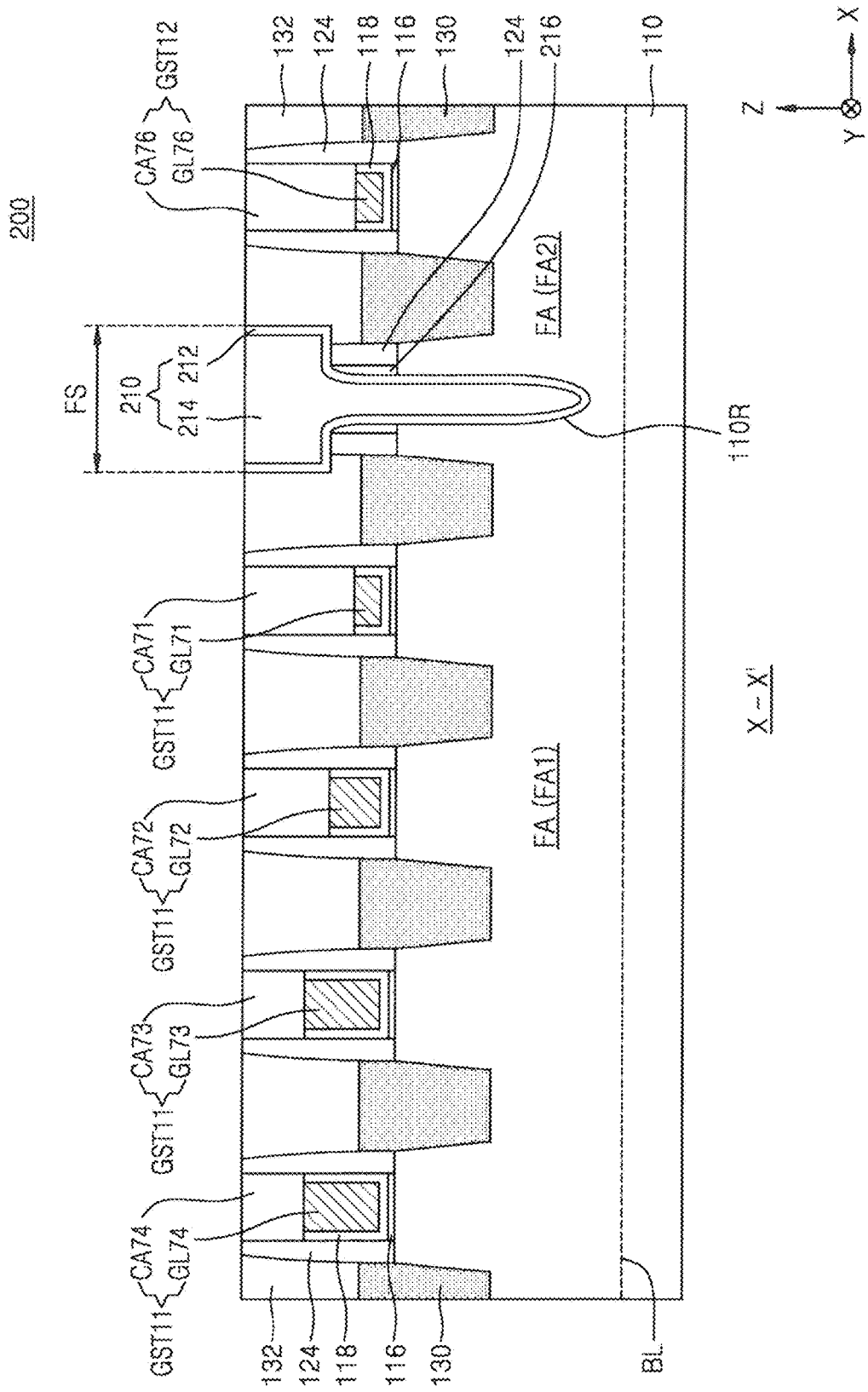
Figure 20B:
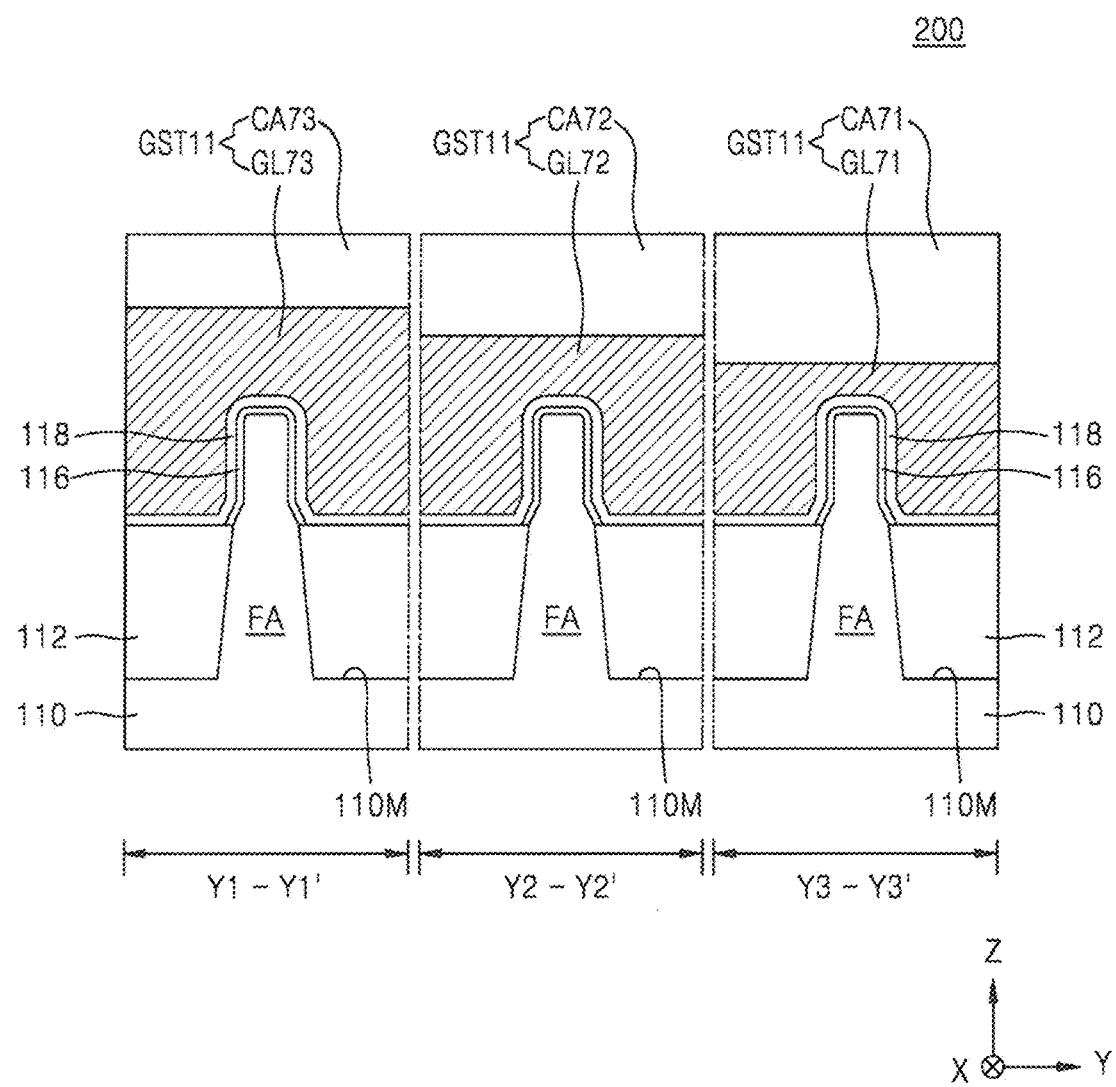

Referring to FIGS. 20A and 20B, the first insulating capping layers CA71, CA72, CA73, and CA74 and the second insulating capping layer CA76 filling the first recess space RS1, the second recess space RS2, and the third recess space RS3 in the resultant structure of FIGS. 19A and 19B may be formed to form the integrated circuit device 200 illustrated in FIGS. 3A through 3C.

The method of forming the integrated circuit device 200 of FIGS. 3A through 3C is described with reference to FIGS. 6A through 20B. However, one of ordinary skill in the art would easily understand that the integrated circuit devices 100, 100A through 1000, 300, and 400 illustrated in FIGS. 1A through 2G, 4, and 5, and integrated circuit devices having various structures modified or changed from the structures of the integrated circuit devices 100, 100A through 100G, 300, and 400 within the technical scope of the present inventive concepts, may be formed by using the method.

The integrated circuit devices including the FinFET including the three-dimensional cannel, and the methods of manufacturing the same are described with reference to FIGS. 1A through 20B. However, the present inventive concepts are not limited thereto. For example, one of ordinary skill in the art would easily understand that integrated circuit devices including a planar MOSFET and methods of manufacturing the same including the technical characteristics of the present inventive concepts may be provided via various modifications and changes from the technical characteristics of the present inventive concepts, within the technical scope of the present inventive concepts.

Figure 21:
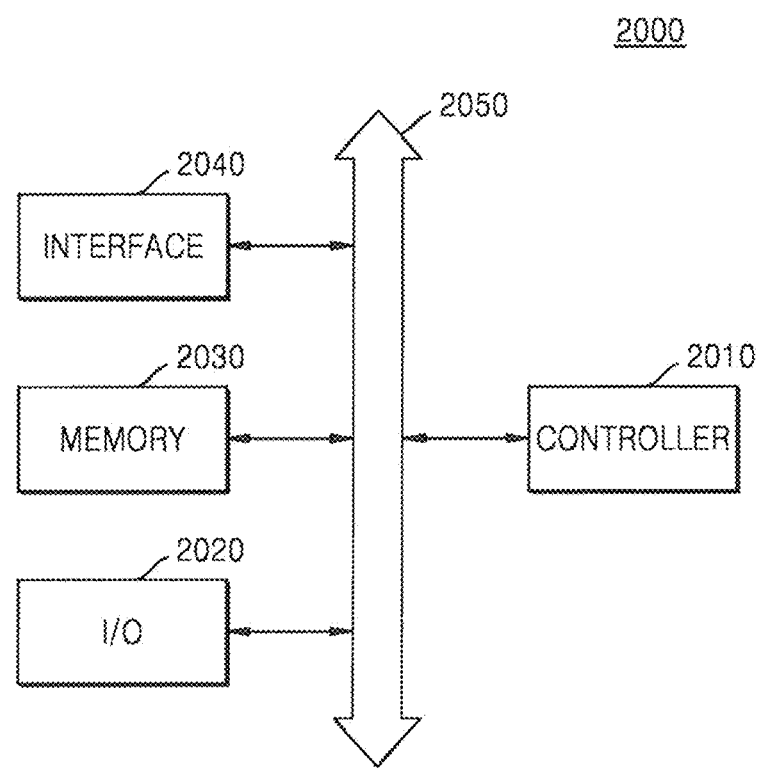
FIG. 21 is a block diagram of an electronic system including integrated circuit devices according to embodiments of the inventive concepts.

FIG. 21 is a block diagram of an electronic system 2000 including integrated circuit devices according to embodiments of the inventive concepts.

The electronic system 2000 may include a controller 2010, an input/output (I/O) device 2020, a memory 2030, and an interface 2040, which are connected to one another via a bus 2050.

The controller 2010 may include at least one of a microprocessor, a digital signal processor, or a processor similar thereto. The I/O device 2020 may include at least one of a keypad, a keyboard, and a display. The memory 2030 may be used to store instructions executed by the controller 2010. For example, the memory 2030 may be used to store use data.

The electronic system 2000 may be included in a wireless communication device, or a device capable of transmitting and/or receiving information under a wireless environment. The interface 2040 may include a wireless interface, in order to transmit/receive data via a wireless communication network in the electronic system 2000. The interface 2040 may include an antenna and/or a wireless transceiver. In some embodiments, the electronic system 2000 may be used as a communication interface protocol of a third generation communication system, such as code division multiple access (CDMA), global system for mobile communications (GSM), north American digital cellular (NADC), extended-time division multiple access (E-TDMA), and/or wide band code division multiple access (WCDMA). The electronic system 2000 may include at least one of the integrated circuit devices 100, 100A through 100G, 200, 300, and 400 illustrated in FIGS. 1A through 5, and integrated circuit devices having structures modified or changed from the structures of the integrated circuit devices 100, 100A through 100G, 200, 300, and 400 within the technical scope of the present inventive concepts.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
   a fin-type active area extending on a substrate in a first direction;
   a first gate line and a second gate line extending on the fin-type active area in parallel to each other in a second direction, which is different from the first direction;
   a first insulating capping layer covering an upper surface of the first gate line and extending in parallel to the first gate line;
   a second insulating capping layer covering an upper surface of the second gate line and extending in parallel to the second gate line; and
   a fin separating recess comprising a fin separating insulating layer, the fin separating recess disposed in the fin-type active area between the first gate line and the second gate line,
   wherein a height of the first gate line and a height of the second gate line are different from each other,
   wherein the height of the first gate line is greater than the height of the second gate line, and a height of the first insulating capping layer is less than a height of the second insulating capping layer,
   wherein the first gate line comprises a first metal containing layer apart from the first insulating capping layer,
   wherein the second gate line comprises a second metal containing layer apart from the second insulating capping layer and comprising, the same material as the first metal containing layer, and
   wherein a height of the first metal containing layer and a height of the second metal containing layer are the same.

2. The integrated circuit device of claim 1, wherein the first gate line further comprises a third metal containing layer contacting the first insulating capping layer,
   the second gate line further comprises a fourth metal containing layer contacting the second insulating capping layer and comprising the same material as the third metal containing layer, and
   a height of the third metal containing layer is greater than a height of the fourth metal containing layer.

3. The integrated circuit device of claim 1, wherein a sum of the height of the first gate line and the height of the first insulating capping layer is the same as a sum of the height of the second gate line and the height of the second insulating capping layer.

4. The integrated circuit device of claim 1, wherein each of the first gate line and the second gate line comprises conductive multiple layers in which a plurality of metal containing layers are stacked, and
   wherein a stack structure of the conductive multiple layers of the first gate line is the same as a stack structure of the conductive multiple layers of the second gate line.

5. An integrated circuit device comprising:
   a fin-type active area extending on a substrate in a first direction and comprising a fin separating recess on an upper surface of the fin-type active area, and a first fin portion and a second fin portion at opposing sides of the fin separating recess, with the fin separating recess interposed between the first fin portion and the second fin portion;
   a fin separating insulating layer in the fin separating recess; and
   a plurality of first gate structures extending on the first fin portion in parallel to one another in a second direction that crosses the first direction,
   wherein each of the plurality of first gate structures comprises a first gate line extending in the second direction and a first insulating capping layer on an upper surface of the first gate line and extending in parallel to the first gate line, and
   wherein the first gate lines of two adjacent first gate structures from among the plurality of first gate structures have different heights.

6. The integrated circuit device of claim 5, wherein heights of the plurality of first gate lines comprised in the plurality of first gate structures decrease as the plurality of first gate lines are nearer to the fin separating insulating layer.

7. The integrated circuit device of claim 5, wherein the plurality of first gate structures comprise two adjacent first gate lines having the same height.

8. The integrated circuit device of claim 5, wherein the plurality of first gate structures have the same height, and
   wherein the plurality of first gate structures comprise at least three first gate structures, the first gate lines of the at least three first gate structures having different heights from one another, and the first insulating capping layers of the at least three first gate structures having different heights from one another.

9. The integrated circuit device of claim 5, further comprising a plurality of source/drain areas interposed between respective ones of the plurality of first gate structures.

10. The integrated circuit device of claim 5, further comprising a plurality of second gate structures extending on the second fin portion in parallel to one another in the second direction,
    wherein each of the plurality of second gate structures comprises a second gate line extending in the second direction and a second insulating capping layer covering an upper surface of the second gate line and extending in parallel to the second gate line, and
    wherein the second gate lines of two adjacent second gate structures from among the plurality of second, gate structures have different heights.

11. The integrated circuit device of claim 10, wherein a height of the first gate line of the first gate structure from among the plurality of first gate structures, that is most adjacent to the fin separating insulating layer, is different from a height of the second gate line of the second gate structure from among the plurality of second gate structures, that is most adjacent to the fin separating insulating layer.

12. The integrated circuit device of claim 10, wherein a height of the first gate line of the first gate structure from among the plurality of first gate structures, that is most adjacent to the fin separating insulating layer, is the same as a height of the second gate line of the second gate structure from among the plurality of second gate structures, that is most adjacent to the fin separating insulating layer.

13. The integrated circuit device of claim 10, wherein the first gate lines of the plurality first gate structures and the second gate lines of the plurality of second gate structures each comprise conductive multiple layers in which a plurality of metal containing layers are stacked, and wherein a stack structure of the conductive multiple layers of the first gate lines is the sale as a stack structure of the conductive multiple layers of the second gate lines.

14. An integrated circuit device comprising:
a substrate;
a fin-type active area on the substrate, wherein the fin-type active area is divided into a first portion and a second portion by a fin separating recess; and
a plurality of first gate structures on the first portion of the fin-type active area, respective ones of the plurality of first gate structures comprising a first gate line and a first capping layer on the first gate line,
wherein a combined height of the first gate line and the first capping layer of each of the first gate structures is substantially the same, and
wherein the first gate line of a first gate structure of the plurality of first gate structures that is nearest the fin separating recess has a first gate line height that is different than a first gate line height of at least one other first gate structure of the plurality of first gate structures.

15. The integrated circuit device of claim 14, wherein the first gate line height of the first gate line of the first gate structure of the plurality of first gate structures that is nearest the fin separating recess is a minimum gate line height or a maximum gate line height of the plurality of first gate structures.

16. The integrated circuit device of claim 14, further comprising a plurality of second gate structures on the second portion of the fin-type active area, respective ones of the plurality of second gate structures comprising a second gate line and a second capping layer on the second gate line, and wherein the second gate line of a second gate structure of the plurality of second gate structures that is nearest the fin separating recess has a second gate line height that is different than a second gate line height of at least one other second gate structure of the plurality of second gate structures.

17. The integrated circuit device of claim 14, wherein the first gate line of the first gate structure of the plurality of first gate structures that is nearest the fin separating recess comprises:
a first conductive barrier layer;
a first metal containing layer on the first conductive barrier layer; and
a second metal containing layer on the first metal containing layer.

18. The integrated circuit device of claim 17, wherein the first conductive barrier layer does not contact the first capping layer, and wherein the first metal containing layer and the second metal containing layer contact the first capping layer.

* * * * *